United States Patent
Taddei et al.

(10) Patent No.: US 11,004,755 B2
(45) Date of Patent: May 11, 2021

(54) APPARATUS AND METHOD FOR THE MINIMIZATION OF UNDERCUT DURING A UBM ETCH PROCESS

(71) Applicant: VEECO INSTRUMENTS INC., Plainview, NY (US)

(72) Inventors: John Taddei, Jim Thorpe, PA (US); David A. Goldberg, Plainview, NY (US); Elena Lawrence, Media, PA (US); Ian Cochran, Plainview, NY (US); Christopher Orlando, Media, PA (US); James Swallow, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 0 days.

(21) Appl. No.: 16/447,723

(22) Filed: Jun. 20, 2019

(65) Prior Publication Data
US 2019/0393108 A1 Dec. 26, 2019

Related U.S. Application Data

(60) Provisional application No. 62/687,630, filed on Jun. 20, 2018.

(51) Int. Cl.
*H01L 21/66* (2006.01)
*H01L 21/3213* (2006.01)
*H01L 21/67* (2006.01)
*H01L 23/00* (2006.01)

(52) U.S. Cl.
CPC ........ *H01L 22/26* (2013.01); *H01L 21/32134* (2013.01); *H01L 21/67075* (2013.01); *H01L 21/67253* (2013.01); *H01L 24/03* (2013.01); *H01L 2224/02313* (2013.01)

(58) Field of Classification Search
None
See application file for complete search history.

(56) References Cited

U.S. PATENT DOCUMENTS

| | | | |
|---|---|---|---|
| 5,891,352 | A | 4/1999 | Litvak |
| 6,806,951 | B2 | 10/2004 | Wack et al. |
| 7,800,121 | B2 | 9/2010 | Aanegola et al. |
| 8,837,807 | B2 | 9/2014 | Srocka et al. |
| 2003/0173333 | A1 | 9/2003 | Wang et al. |
| 2007/0045571 | A1 | 3/2007 | Woo |
| 2009/0046922 | A1 | 2/2009 | Yoshikawa |
| 2011/0292380 | A1 | 12/2011 | Bamji |
| 2014/0242731 | A1 | 8/2014 | Mauer et al. |
| 2019/0137892 | A1* | 5/2019 | Cekli .............. G03F 9/7046 |

OTHER PUBLICATIONS

Mauer. "Metal Etching for Compound Semiconductor Applications". Solid State Equipment LLC. [online]. 2013; [Retrieved on Feb. 22, 2021]. Retrieved from the internet:; abstract.

* cited by examiner

*Primary Examiner* — Asok K Sarkar
(74) *Attorney, Agent, or Firm* — Leason Ellis LLP

(57) ABSTRACT

A semiconductor etch process is provided in which an undercut is minimized during an etch process through tight control of etch profile, recognition of etch completion, and minimization of over etch time to increase productivity.

25 Claims, 39 Drawing Sheets

| | Metals | Thickness |
|---|---|---|
| Seed Layer (Wetting Layer) | Cu | ~ 5000 Å |
| Adhesion/Barrier Layer | Ti, Ti-W, Cr, NiV, Ni | 200-300 Å |

FIG. 2C

UBM

RDL

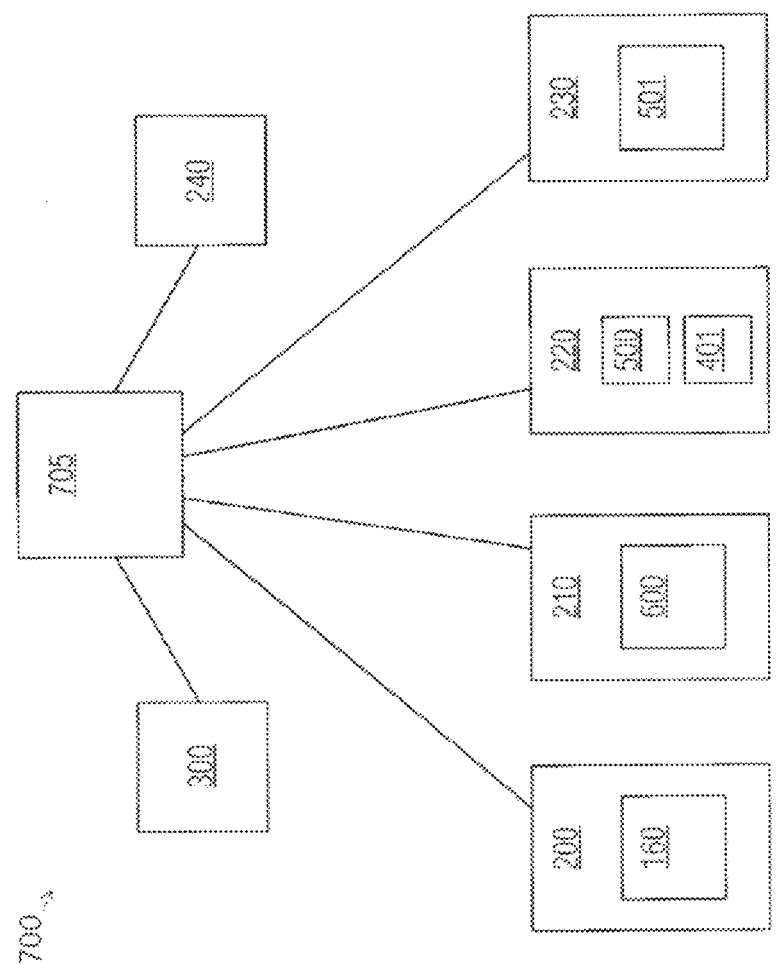

| 1 | | 2 | | 3 | | 4 | | 5 | |
|---|---|---|---|---|---|---|---|---|---|
| Film (Cu+Ti), A | 5000 | Film (Cu+Ti), A | 5000 | Film (Cu+Ti), A | 1500 | Film (Cu+Ti), A | 1500 | Film (Cu+Ti), A | 1500 |
| α, % | 100 | α, % | 100 | α, % | 100 | α, % | 50 | α, % | 5 |
| Undercut, μm | 1 | Undercut, μm | 1 | Undercut, μm | 0.3 | Undercut, μm | 0.225 | Undercut, μm | 0.1575 |
| Bump radius | 50 | Bump radius | 50 | Bump radius | 5 | Bump radius | 5 | Bump radius | 5 |
| Bump area | 7850 | Bump area | 78.5 | Bump area | 78.5 | Bump area | 78.5 | Bump area | 78.5 |
| Area after undercut | 7539.14 | Area after undercut | 50.24 | Area after undercut | 69.3626 | Area after undercut | 71.59396 | Area after undercut | 73.63239 |
| % remaining | 0.9604 | % remaining | 0.64 | % remaining | 0.8836 | % remaining | 0.912025 | % remaining | 0.937992 |

FIG. 15C

APPARATUS AND METHOD FOR THE MINIMIZATION OF UNDERCUT DURING A UBM ETCH PROCESS

CROSS REFERENCE TO RELATED APPLICATION

The present application claims priority to and the benefit of U.S. patent application Ser. No. 62/687,630, filed Jun. 20, 2018, which is hereby expressly incorporated herein in its entirety.

TECHNICAL FIELD

In general, the present application relates to a semiconductor etch process. More specifically, it relates to minimizing undercut during an etch process through tight control of etch profile, recognition of etch completion, and minimization of over etch time to increase productivity.

BACKGROUND

In general, advanced packaging methods for semiconductor devices rely upon connecting electrical interfaces. The use of solder bumps, pillars and pads have been employed as a means to accomplish the connections. An exemplary process to form the bumps and pillars is shown in FIG. 1. This process starts with the deposition of a passivation layer, the deposition of a barrier film or (typically comprised of titanium (Ti) or titanium-tungsten (Ti—W)), and then the deposition of a seed layer of copper (Cu), although it should be noted that many metals can be used for this purpose. The combined metals in the barrier film are generally in the several thousand Angstrom range with the seed layer (e.g., Cu) being thicker than the barrier film. Once the seed layer (e.g., Cu) is laid down, a thick resist (PR—photo resist) (spin on or dry film) is applied as a mask. The mask is then exposed and developed via processes that form openings in the mask such that additional metal(s) in the form of solder (e.g., Pb, Sn, Ag) or pillar metal(s) (e.g., Cu, Ni, Au, Pd) can fill the voids (openings) created in the mask. Again, it should be noted that numerous metals and combinations of metals can be used to form these structures. Likewise, redistribution layer (RDL) patterns can also constructed using variations of the above sequence.

Once this process is completed, the resist is stripped through a heated solvent process, for example. Electrically, at this stage all of these features are shorted with the conductive seed layer (e.g., Cu) and barrier film (Ti/TiW). The next step is to remove the field metal (seed layer and barrier film that is not located beneath an interconnect structure, such as a bump, pillar or pad). The field metal is commonly removed via a wet etch process. Etchants for the wet etch are typically isotropic, meaning the etchant will etch in all directions at the same rate. Accordingly, while the etchant works vertically to remove field metal it will also etch laterally beneath the structures. Hence the term Under Bump Metal (UBM) Etch is commonly used. For interconnects, the same process is applied, and this is referred to as an RDL etch. The lateral etch beneath such structures is referred to as an "undercut." An exemplary diagram of a substrate in which a lateral etch or "undercut" has been performed beneath the solder bump is shown at FIGS. 2A-2C. Exemplary diagrams of pillar formation are shown at FIGS. 2D-2E and exemplary images of UBM and RDL substrates are shown at FIGS. 2F-2G. Similarly, an image of an exemplary substrate showing the lateral etches or undercuts beneath a Cu pillar layer and a Cu seed layer is shown at FIG. 3. A lateral etch or undercut can bring about two undesired effects: 1) it can reduce performance of the feature by reducing the area for flow of electricity and 2) it can reduce bump\pillar adhesion to the substrate making feature loss a possibility.

Historically, feature sizes have been large (e.g., 100 µm wide solder bumps) and field metal was thin in comparison (e.g., 5000 Angstrom [5000 A]). Even with a great deal of undercut, there remains a significant amount of metal for bump adhesion and electrical performance. For example, with a 200% etch (or 100% over etch), the undercut is approximately 1 µm (5000 A×2=10,000 A, or 1 µm). This is net result of the bump diameter at the undercut of 98 µm. In this fashion approximately 96% of the area remains after the 4% diameter loss to undercut. This does not greatly affect bump adhesion or electrical properties of the bump.

As such, a large over-etch has typically been employed due to batch processing of wafers in cassettes 25 wafers at a time. Additionally, a large over-etch has previously been employed due to several factors including: differences in film thickness from wafer to wafer; etch differences depending on where in the cassette the wafer is positioned; poor etch uniformity from the batch process; and no means to determine when the etch has been completed. Accordingly, a large amount of over etch has previously been necessary to ensure that all field metal has been cleared. Failure to clear the field metal can result in an electrical short in the substrate and directly contributed to yield loss. Accordingly, the large over etch has been tolerated as way to prevent electrical shorts, and because the substrates were, historically, fairly large.

However, there is now a drive in the semiconductor industry for ever increasingly smaller devices, and this drive pertains to interconnect devices (RDL devices) as well. For example, substrates (wafers) have shrunk to 10 µm and below in some cases. Consider the above example of 5000 A field metal with 100% over etch process. For a 5 µm bump, a 1 um undercut from all sides would remove approximately 36% of the area due to undercut. Several methods have employed to deal with the need for less undercut, such as reducing field metal thickness. When using the same conditions as described in the above example for a 1500 A field metal, the undercut loss for a 5 µm bump can get down to 12%, but this remains too high. Accordingly, there is a need for a way to eliminate over etch, particularly for smaller substrates, and also determine when to terminate the etch process.

The present systems and methods address this need and others.

SUMMARY

In one exemplary embodiment, a computer implemented control system is provided for endpoint detection of a wet etching process of substrates by a wet etching station including a wet etching device, a light source and a light detector, the control system including one or more processors communicatively coupled to the wet etching device, the light source and the light detector and configured to interact with a computer-readable storage medium and execute one or more software modules stored on the storage medium. The control system includes an endpoint detection module configured to:
  select a plurality of sample locations on a surface of a first substrate;

cause the light source to emit a light onto at least the plurality of sample locations on the surface of the first substrate during etching of the first substrate;

cause the light detector to detect a reflection of the light off the plurality of sample locations on the surface of the first substrate during etching of the first substrate;

analyze light information associated with the plurality of sample locations of the first substrate to determine an end point of the etching of the first substrate;

generate etch parameters for a second substrate based on the analyzed light information for the first substrate;

select a plurality of sample locations on a surface of the second substrate;

cause the light source to emit a light onto at least the plurality of sample locations on the surface of the second substrate during etching of the second substrate;

cause the light detector to detect a reflection of the light off the plurality of sample locations on the surface of the second substrate during etching of the second substrate;

analyze light information associated with the plurality of sample locations of the second substrate and the generated etch parameters for the second substrate to determine an end point of the etching of the second substrate;

compare the light information associated second substrate with the light modify modify the generated etch parameters based on the compared light information.

BRIEF DESCRIPTION OF THE DRAWING FIGURES

FIGS. 2A-2C illustrate an exemplary under bump metallization etch displaying a lateral etch under the solder bump in accordance with one or more embodiments disclosed herein;

Figure 1:
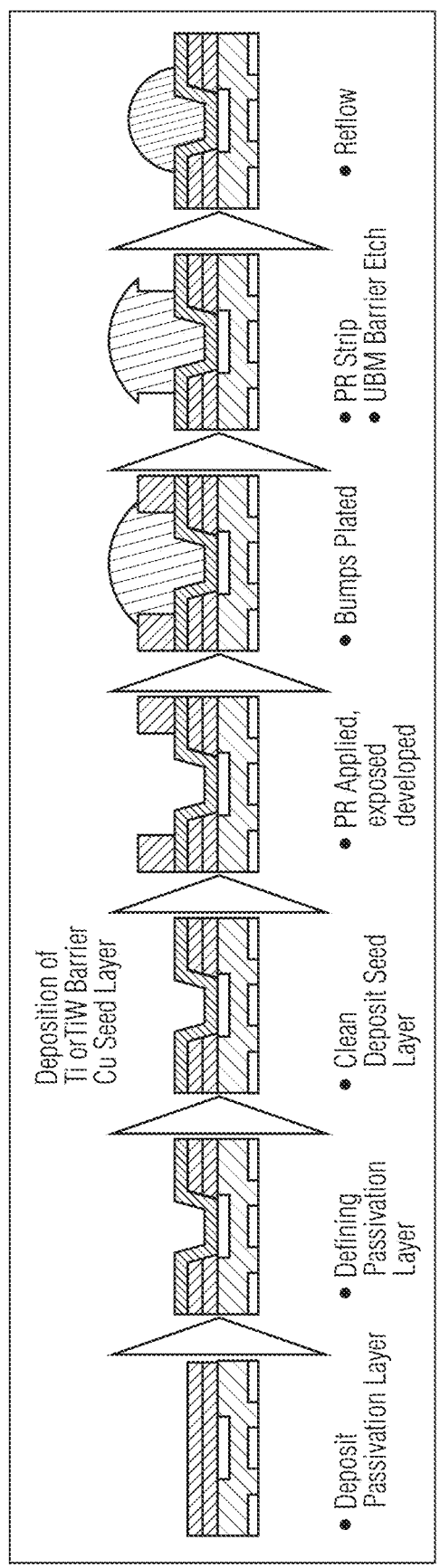
FIG. 1 illustrates a solder bump formation process in accordance with one or more embodiments disclosed herein.
Figure 2A:
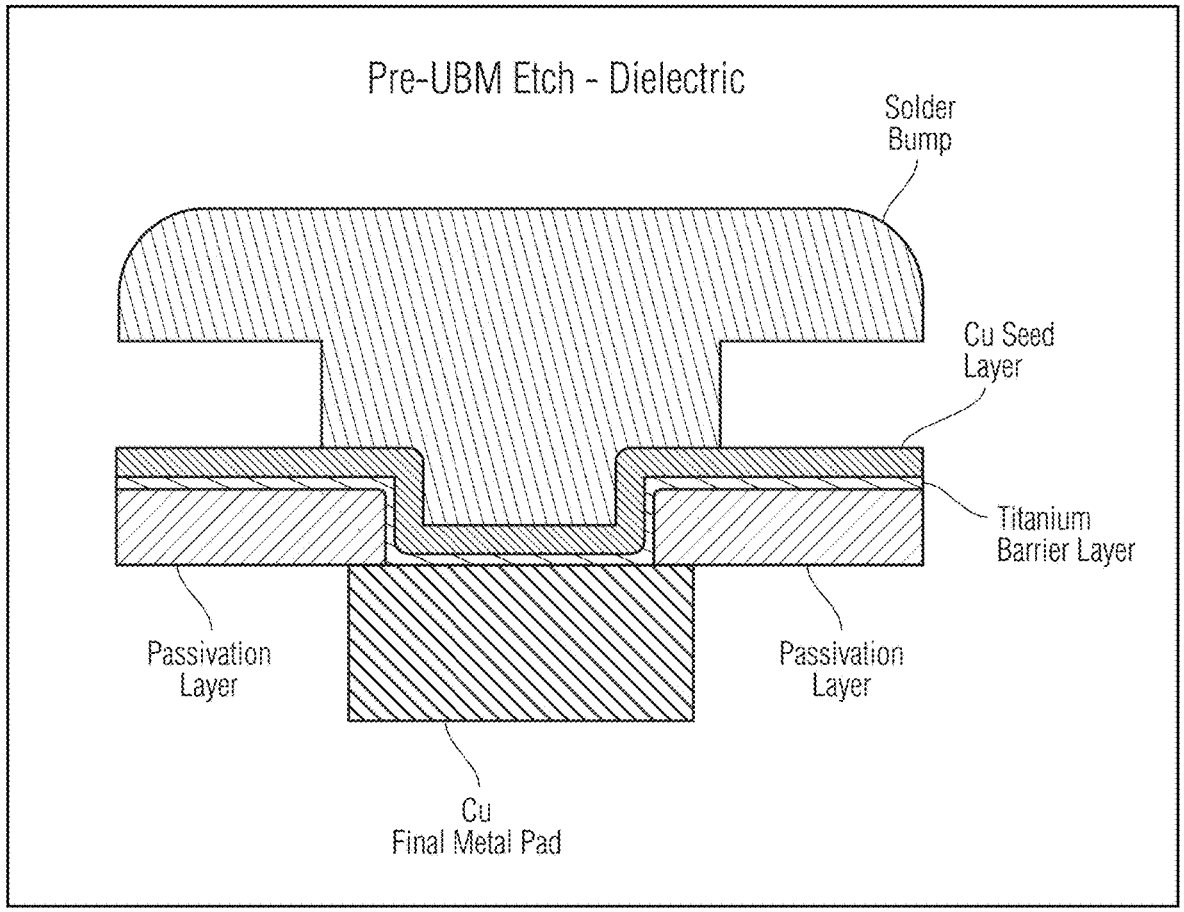
Figure 2B:
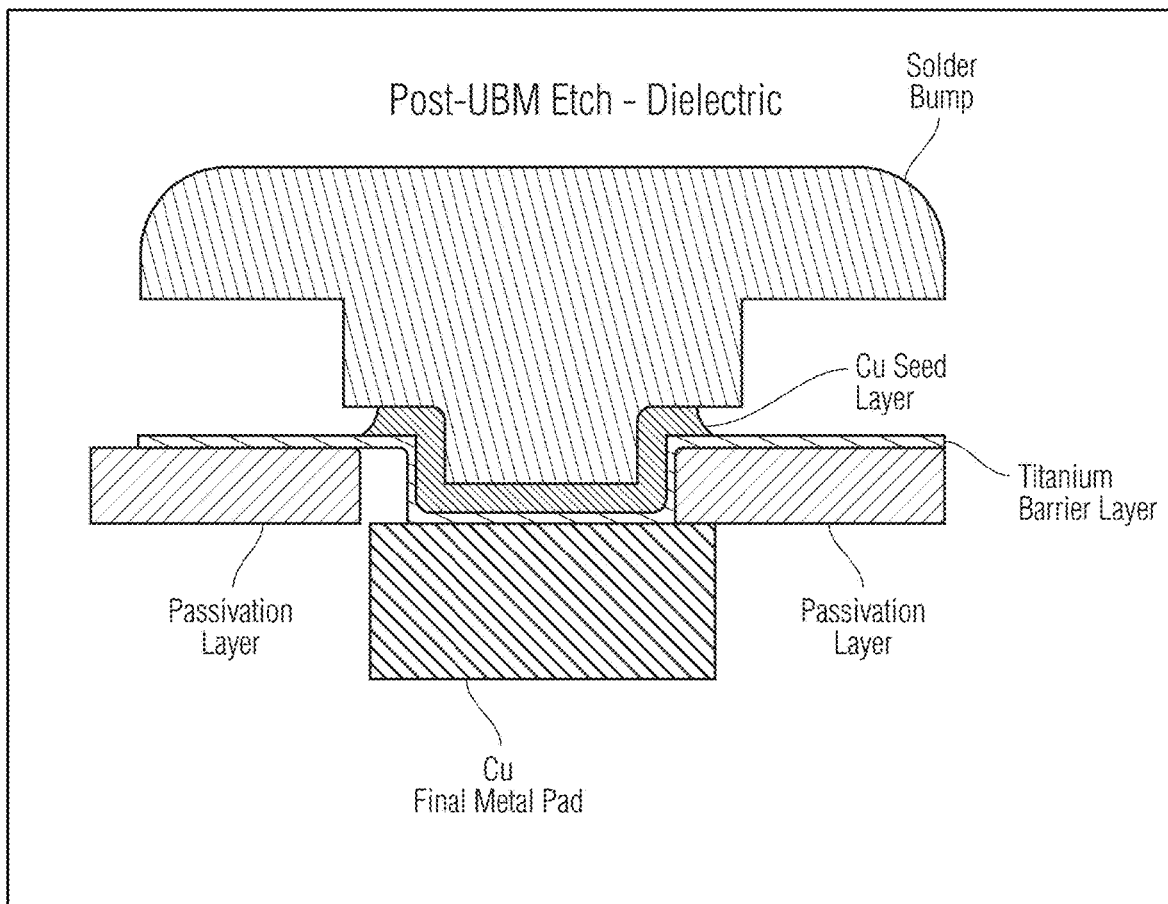
Figure 2E:
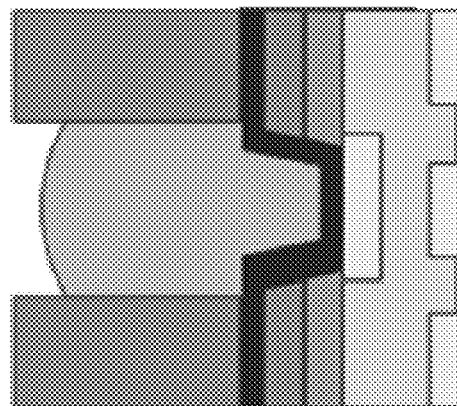
FIGS. 2D-2E show diagrams of pillar formation in accordance with one or more embodiments disclosed herein.
Figure 2D:
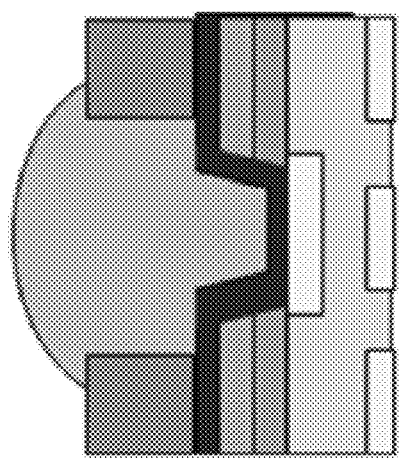
Figure 2F:
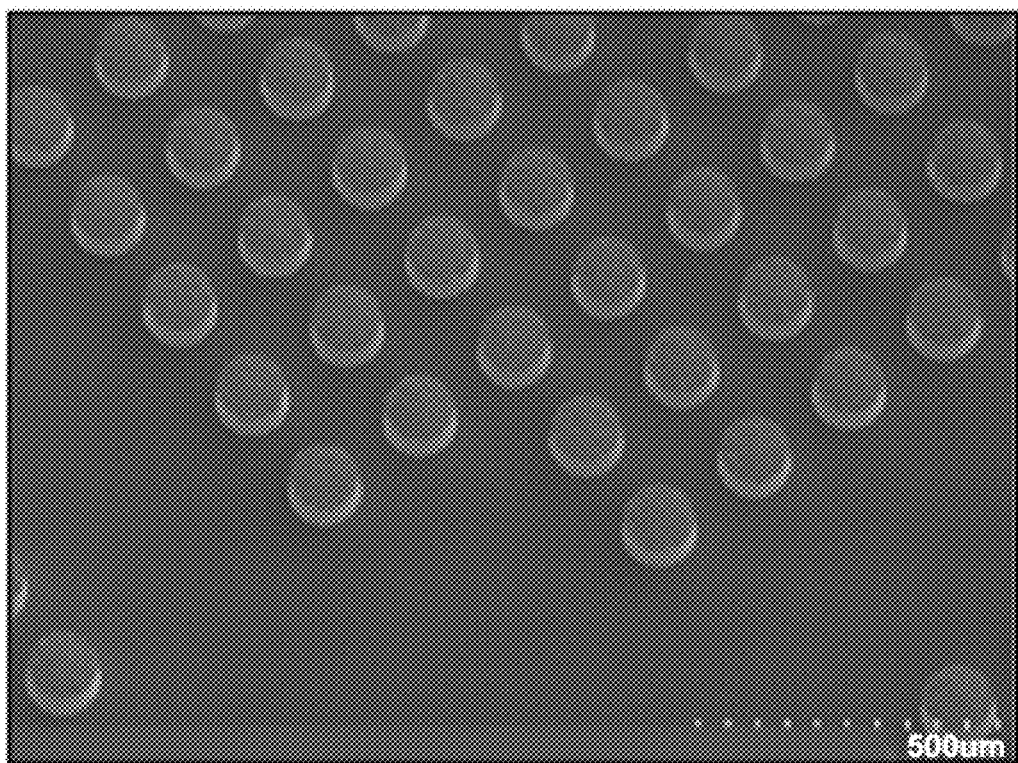
FIGS. 2F-2G show exemplary images of UBM and RDL substrates in accordance with one or more embodiments disclosed herein.
Figure 2F:
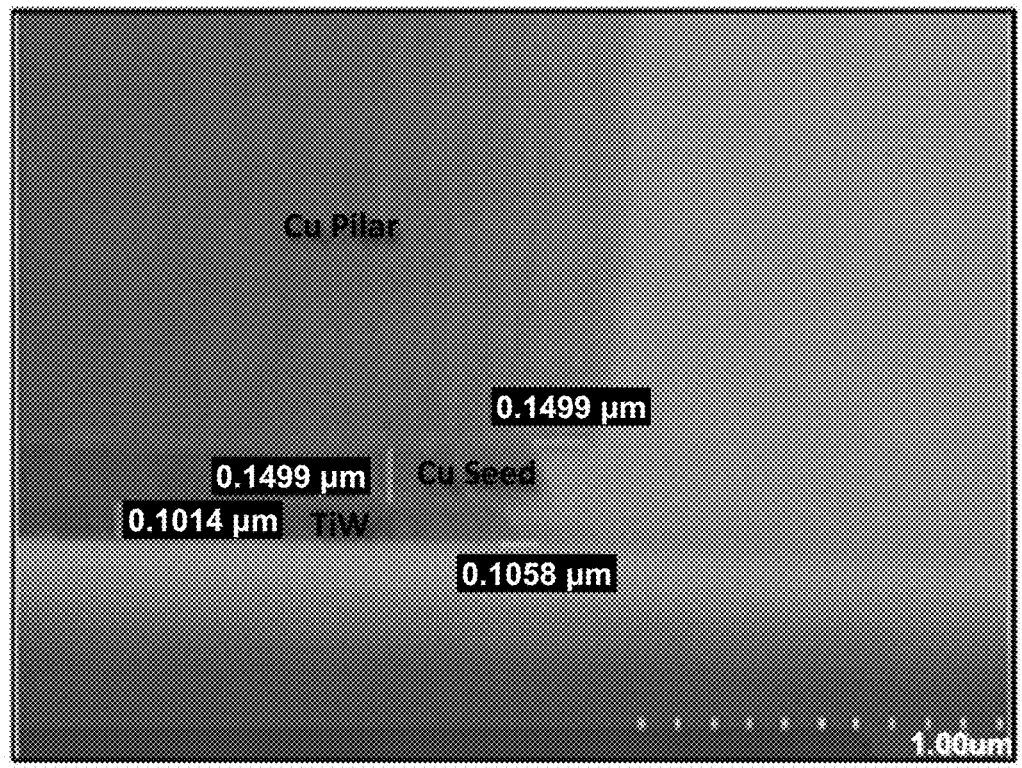
Figure 2G:
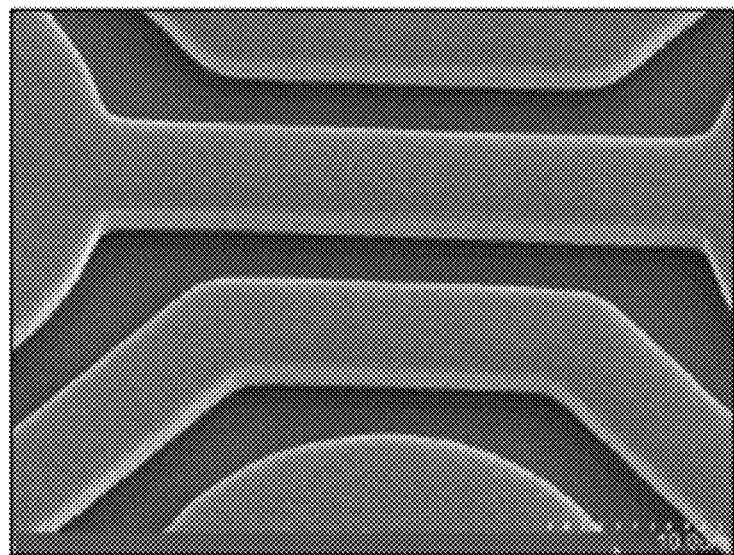
Figure 2G:
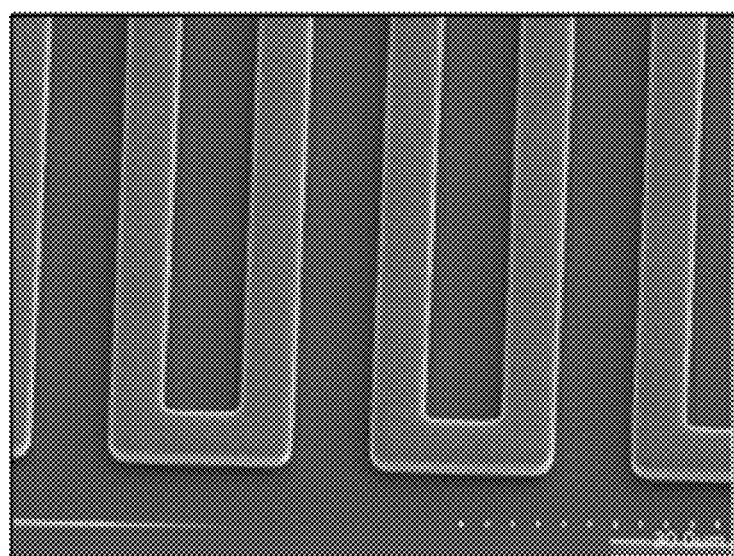
Figure 3:
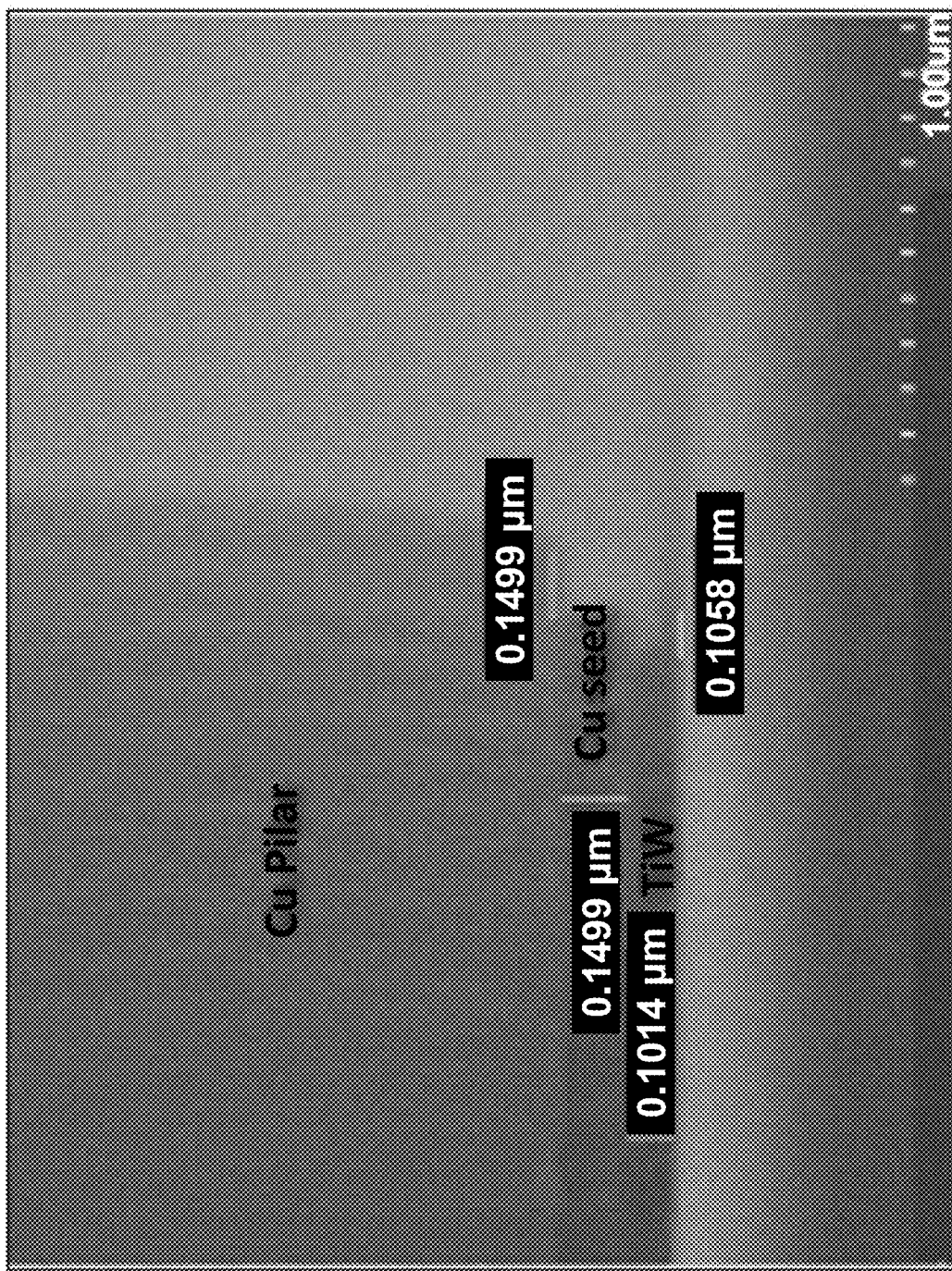
Figure 4:
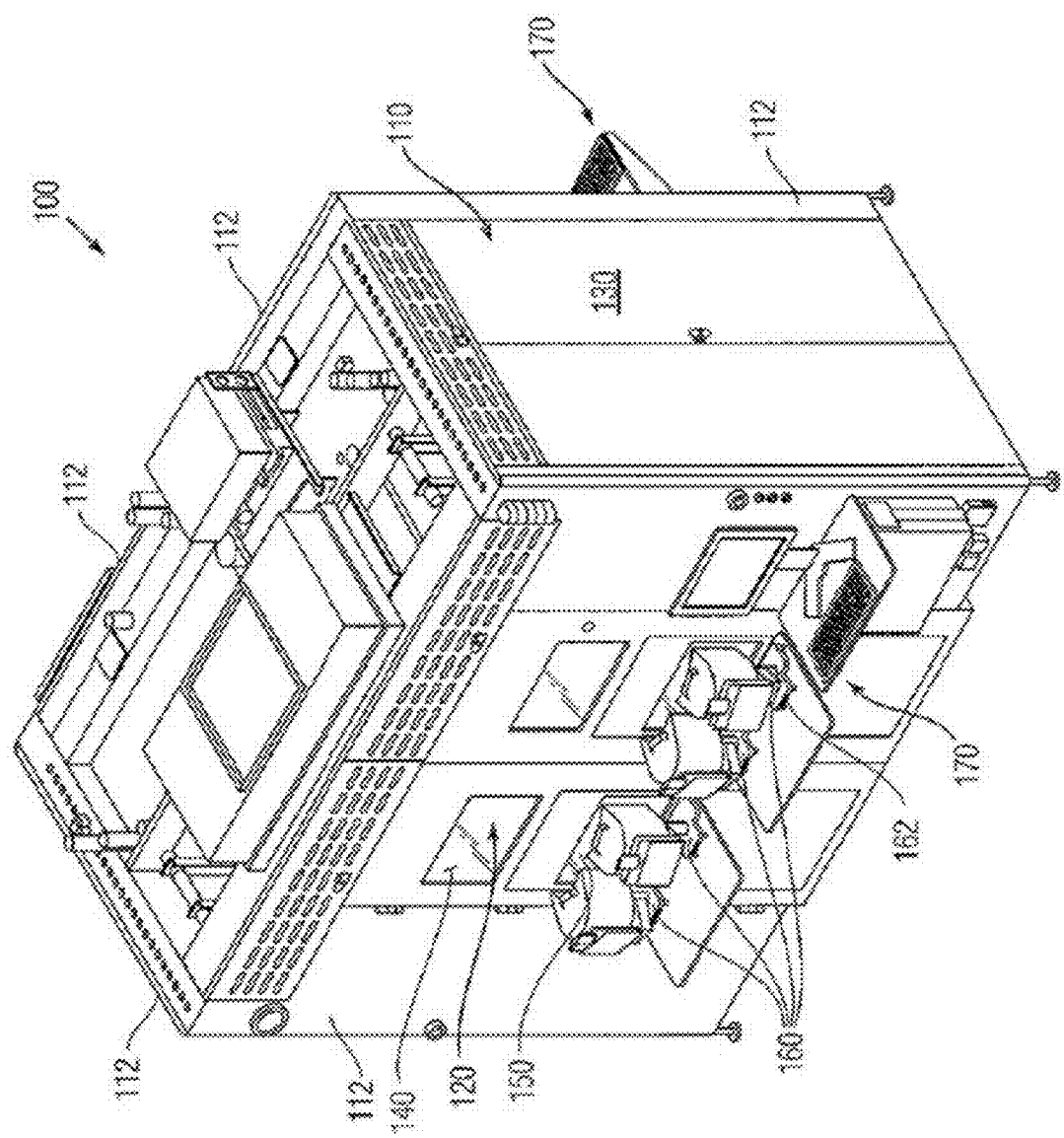
Figure 5:
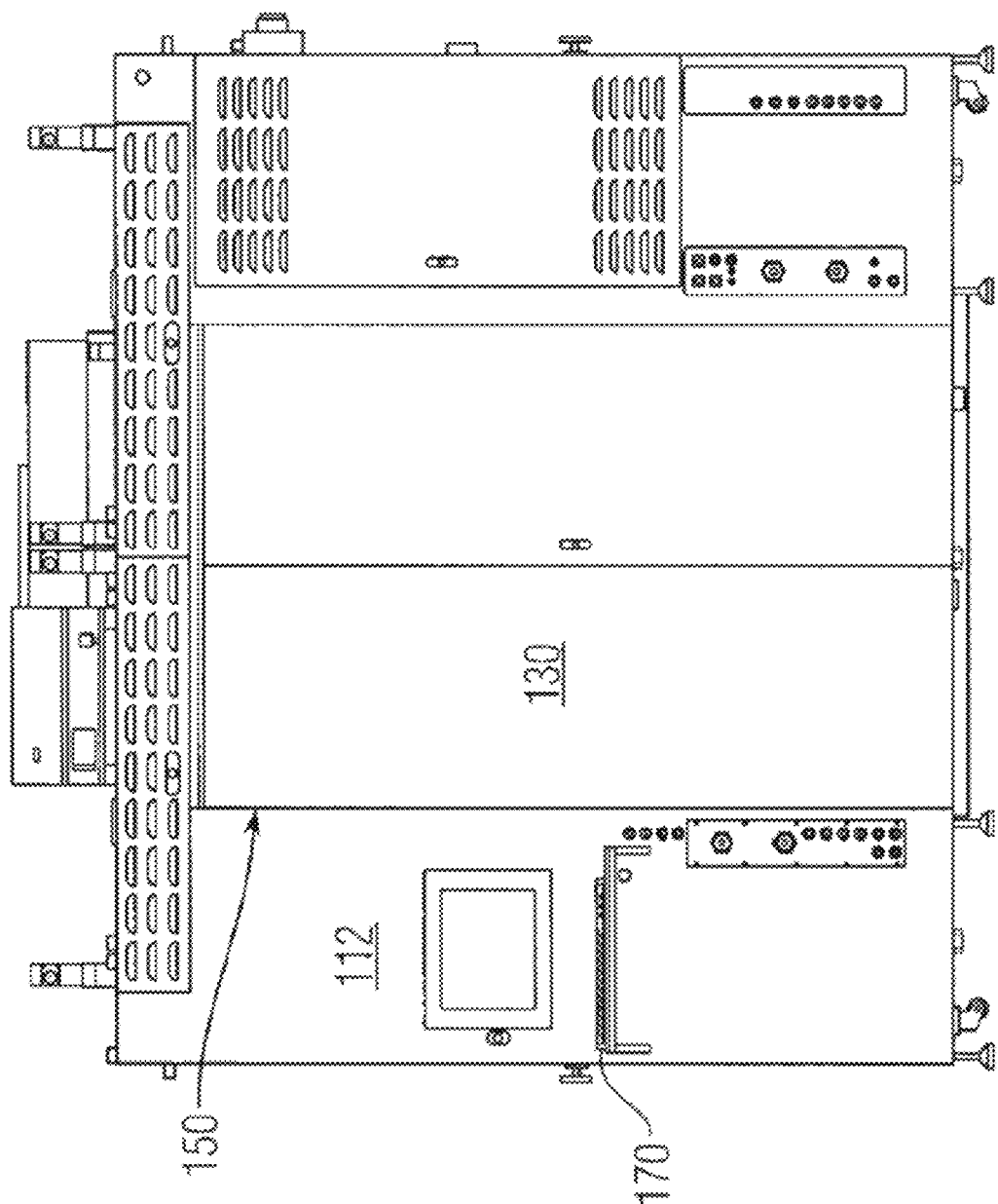
Figure 6:
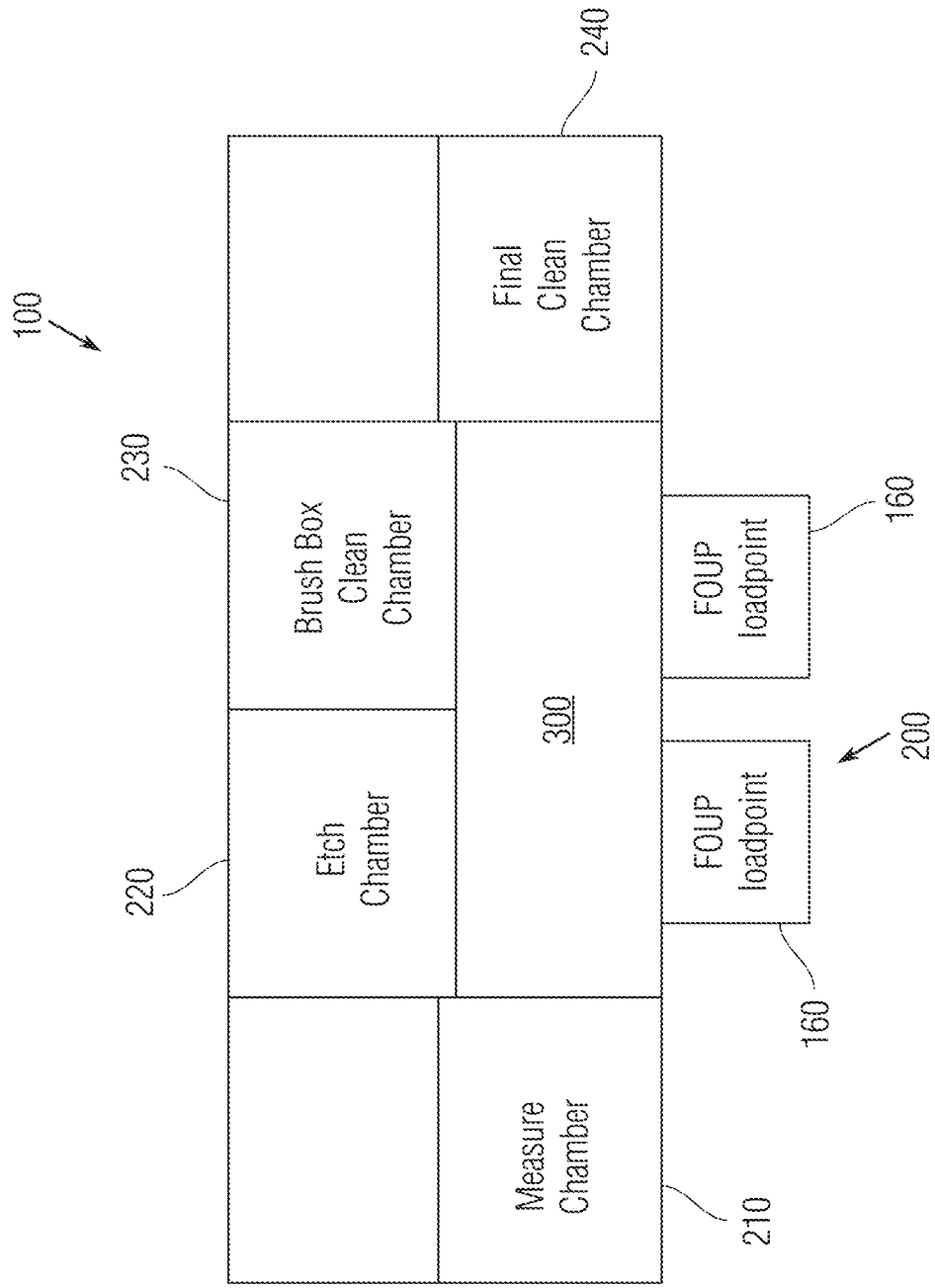
Figure 7:
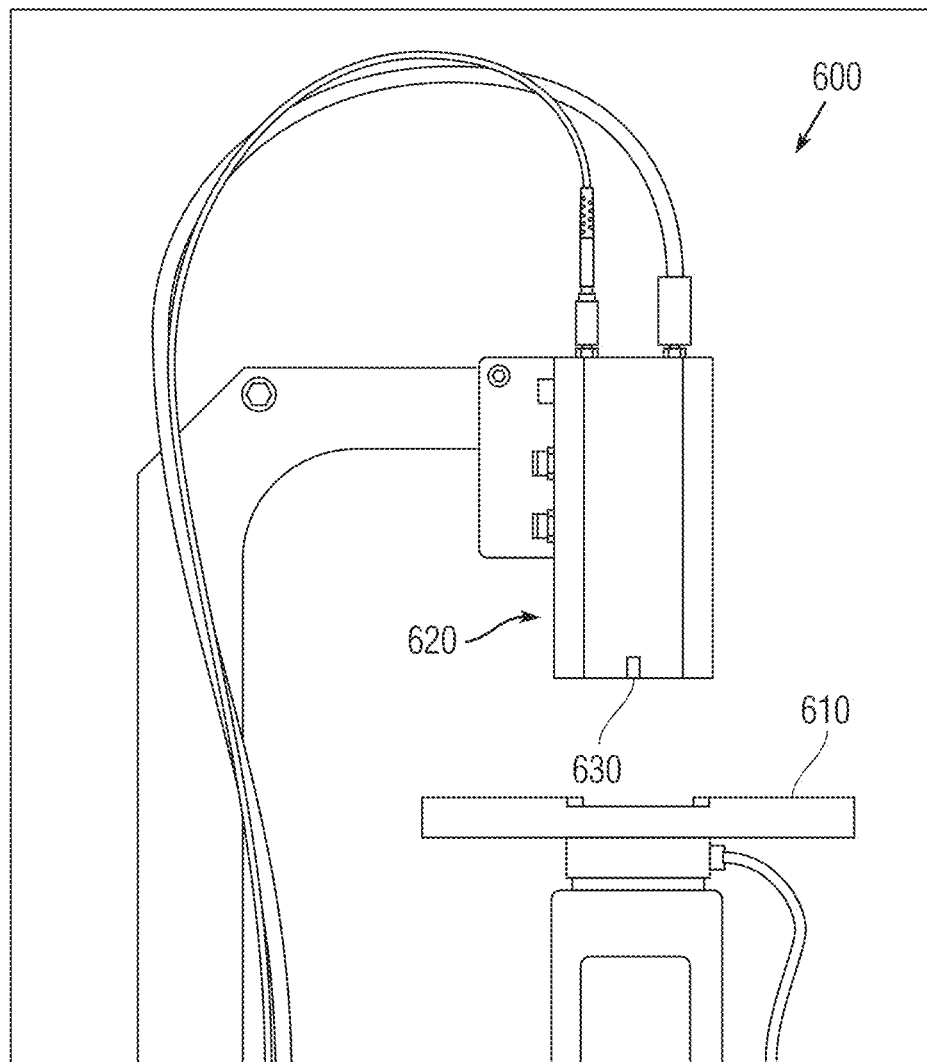
Figure 8:
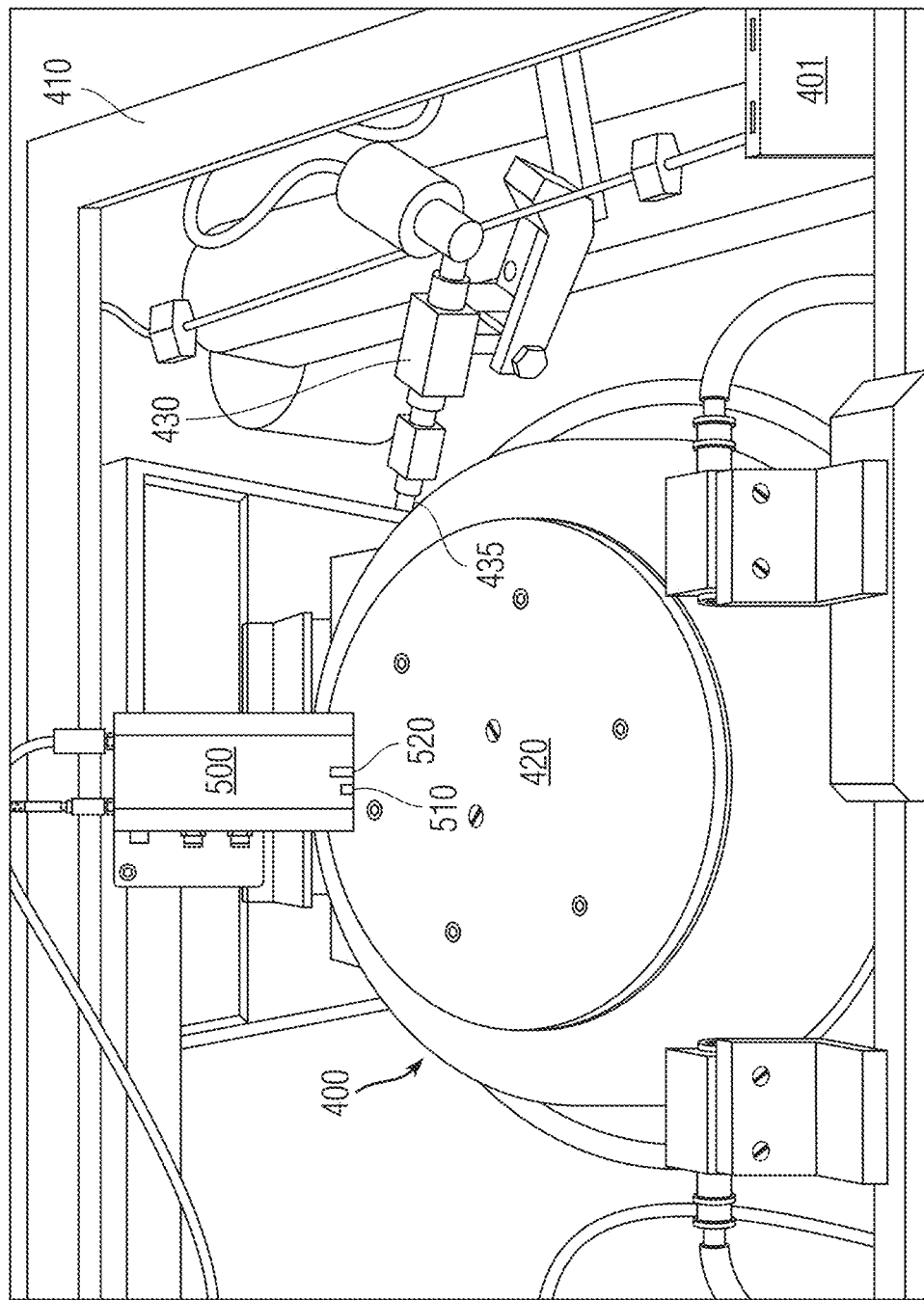
Figure 9:
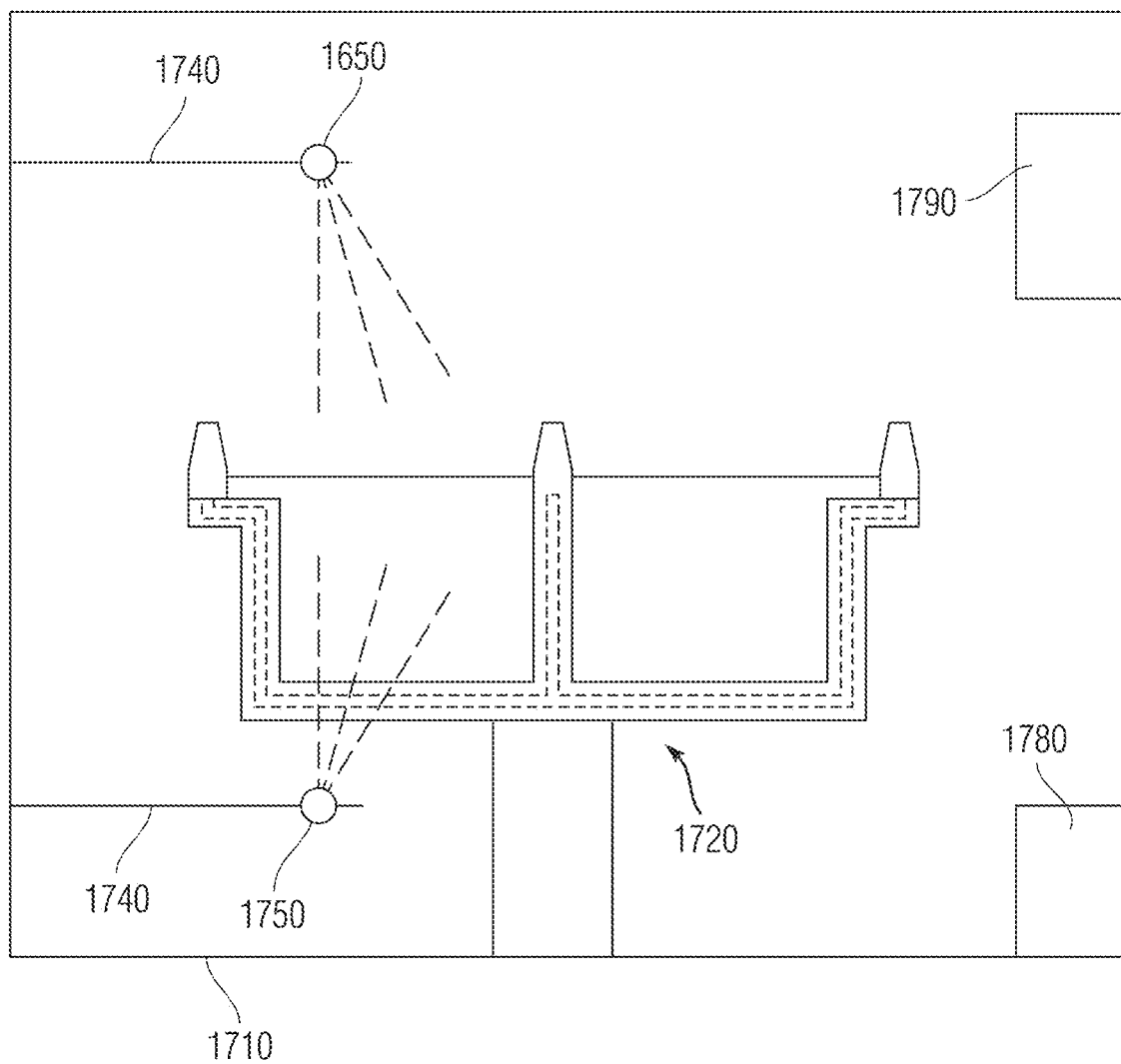
Figure 10B:
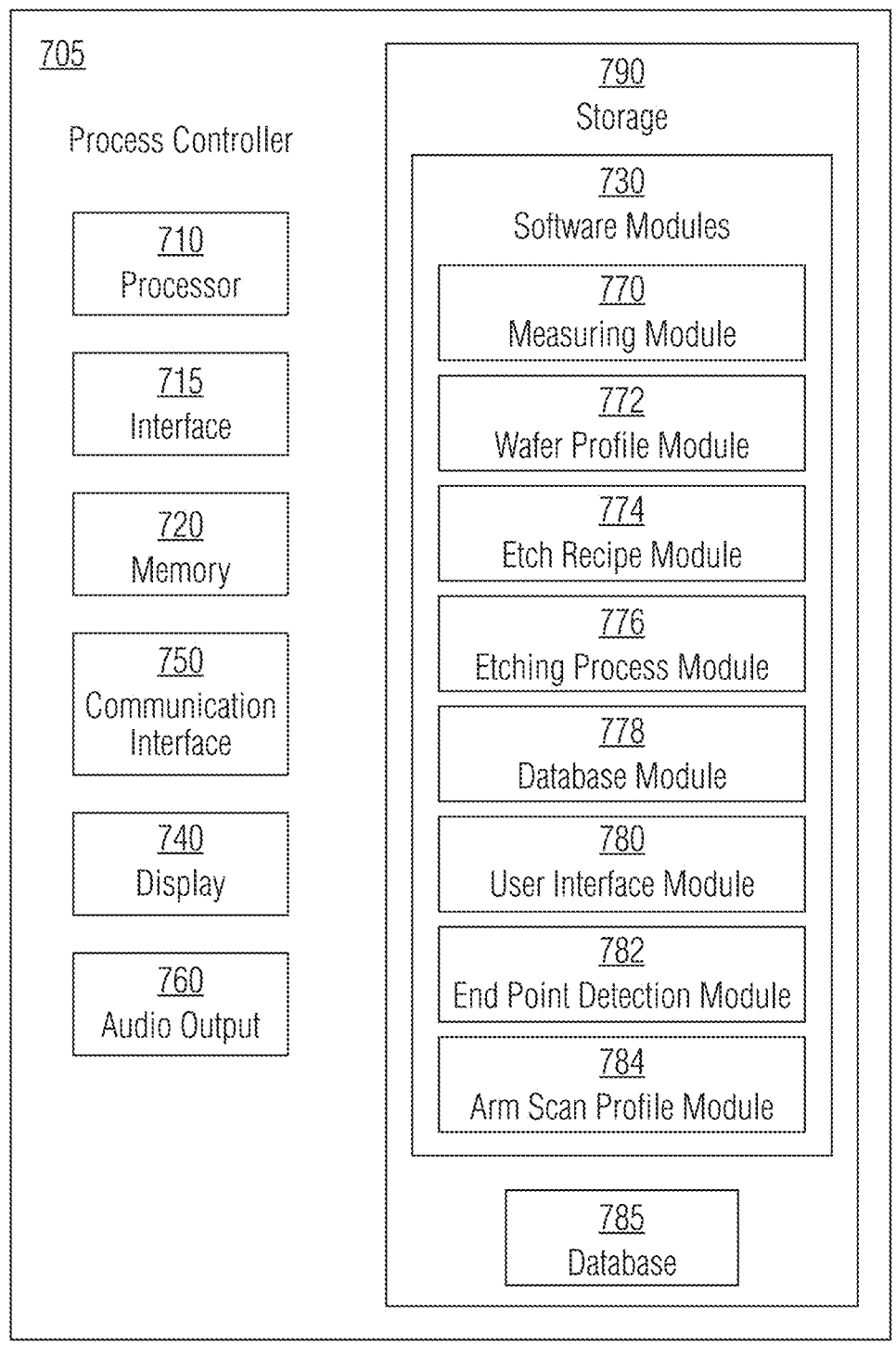
Figure 11:
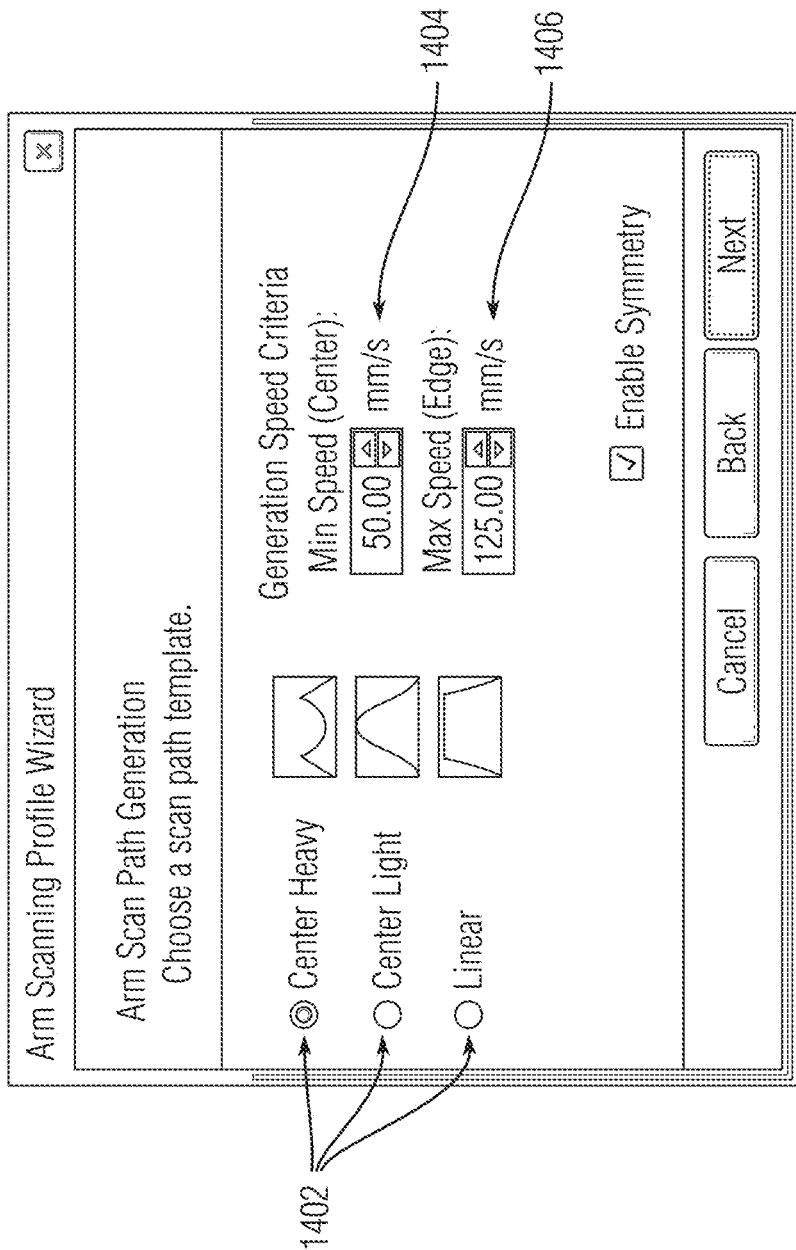
Figure 12:
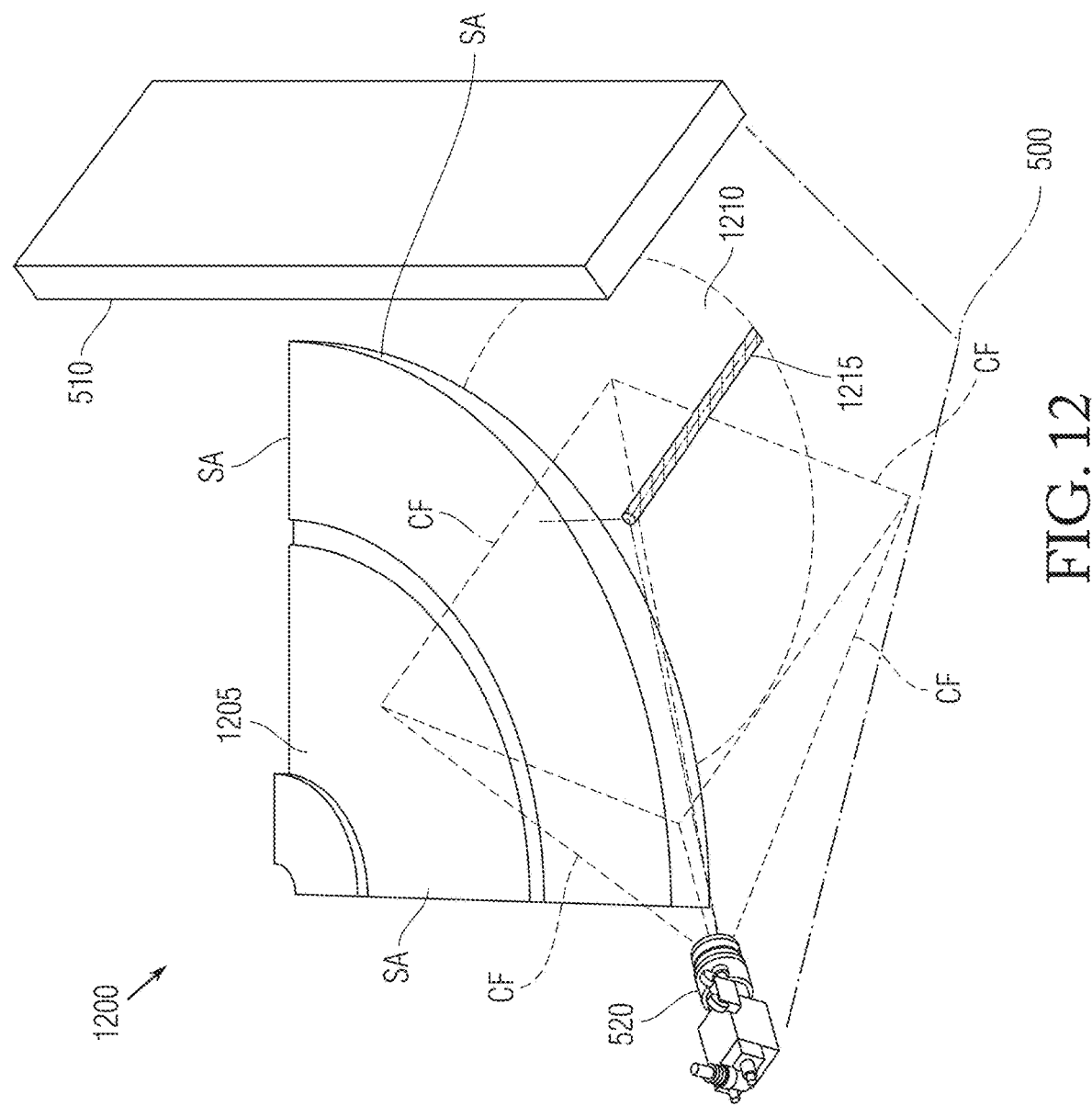
Figure 13:
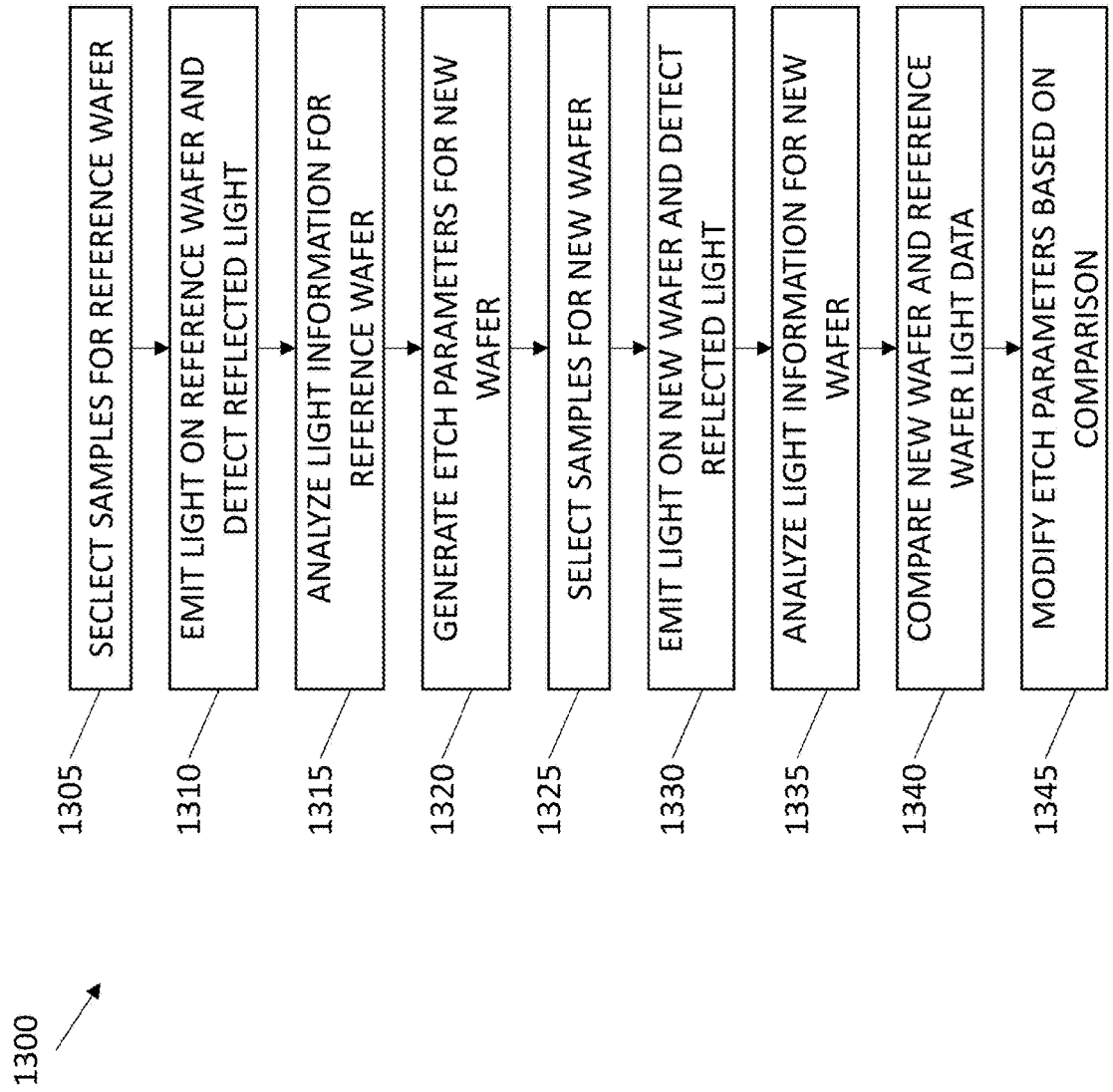
Figure 14A:
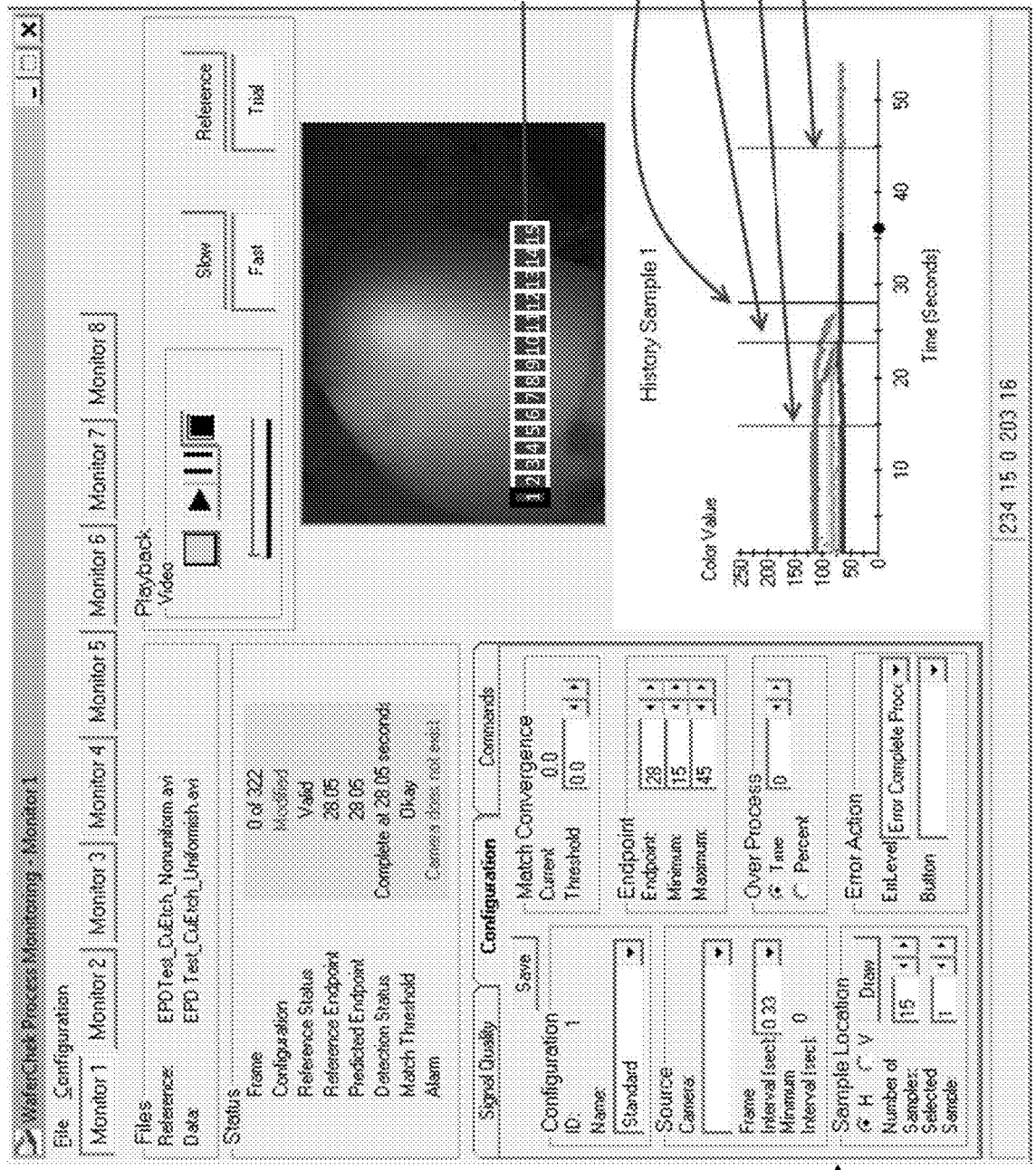
Figure 14B:
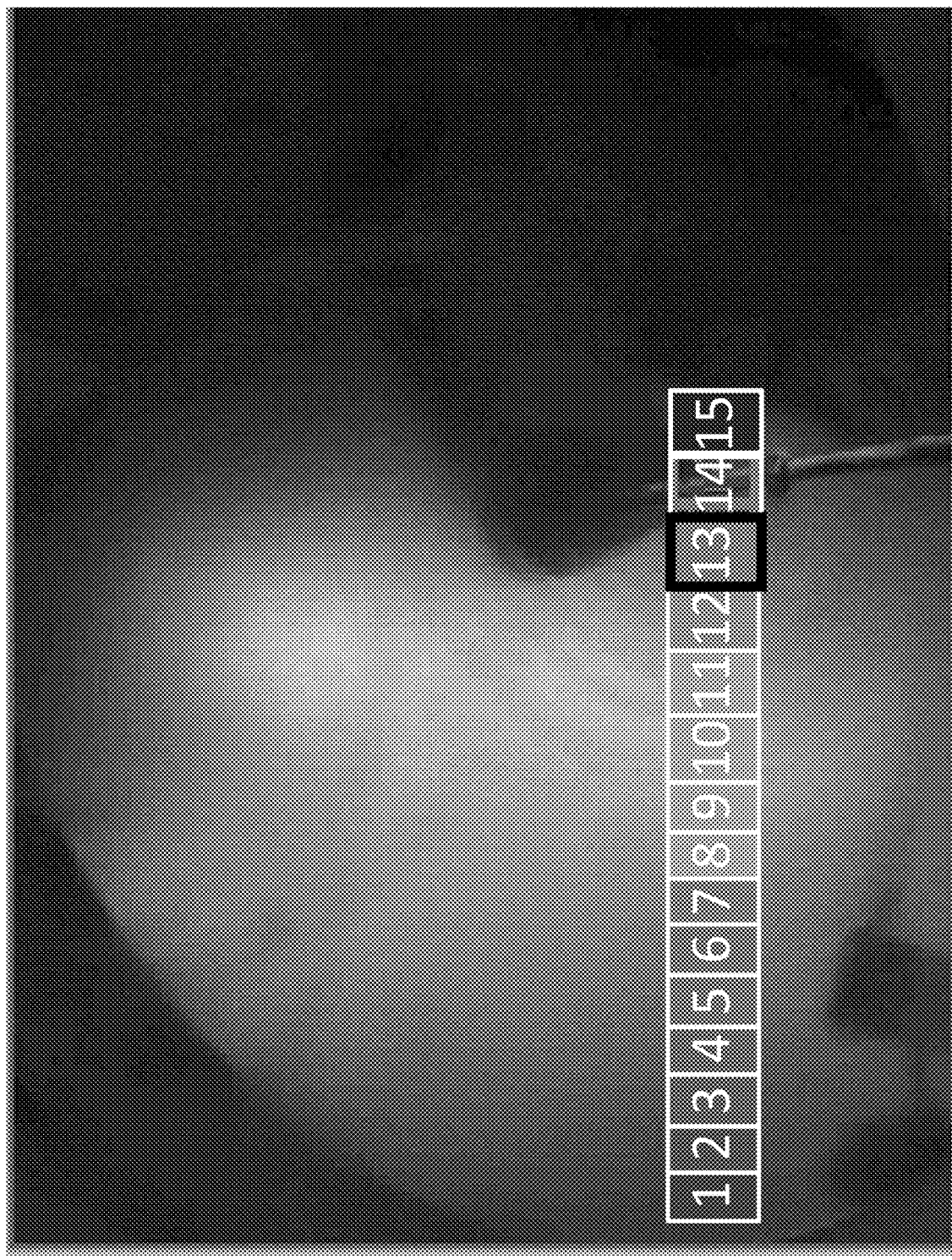
Figure 14C:
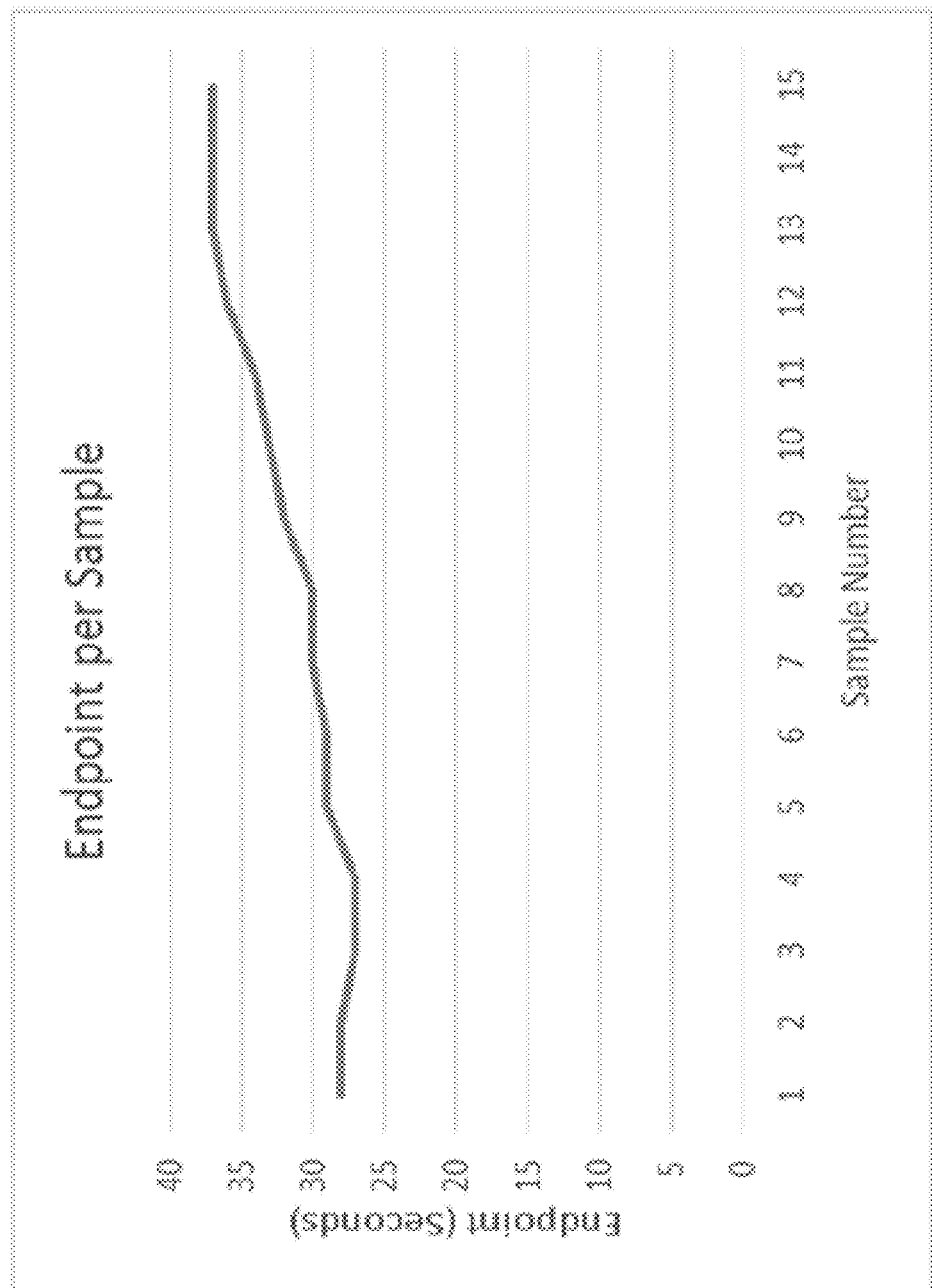
Figure 14D:
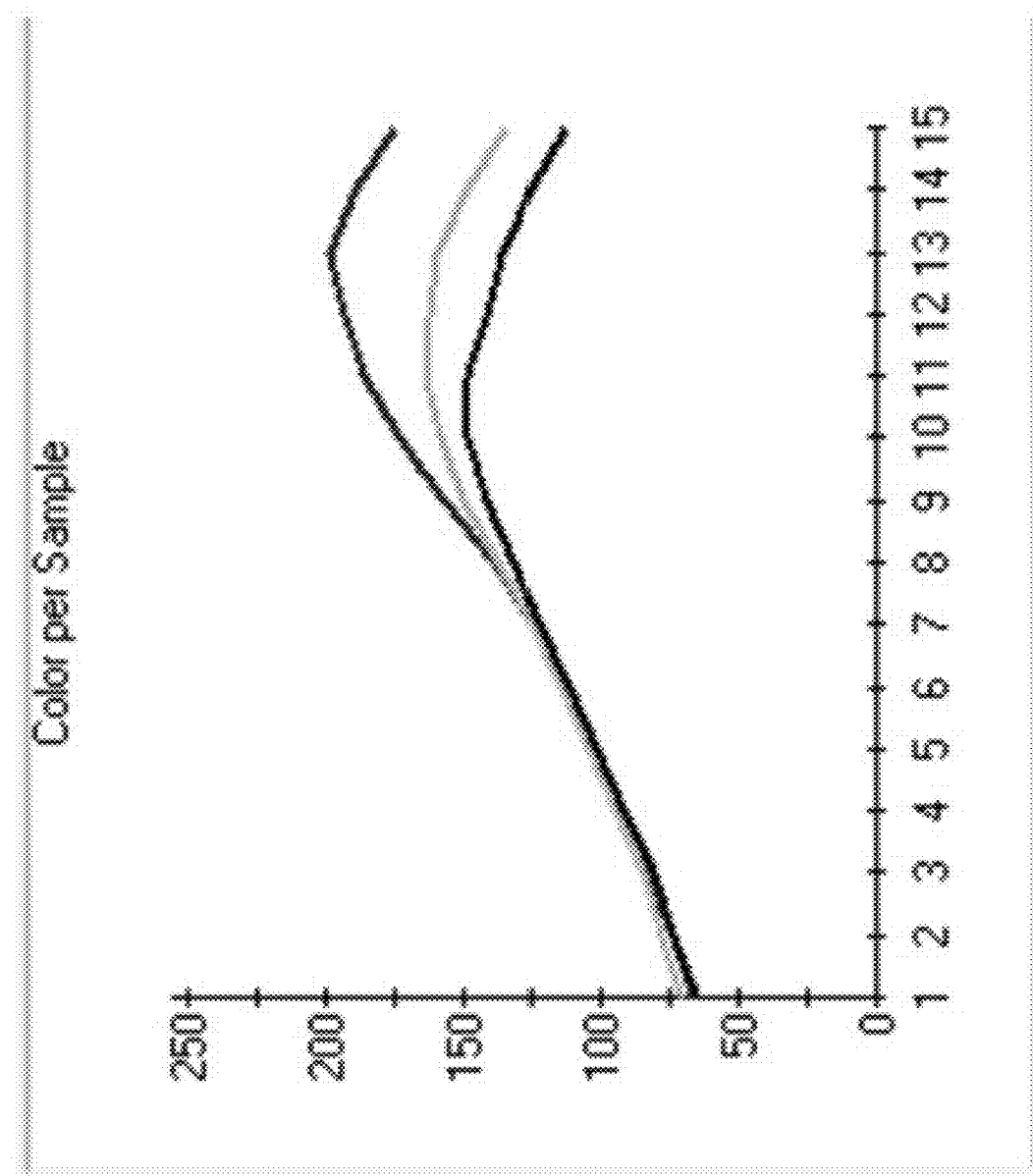
Figure 14E:
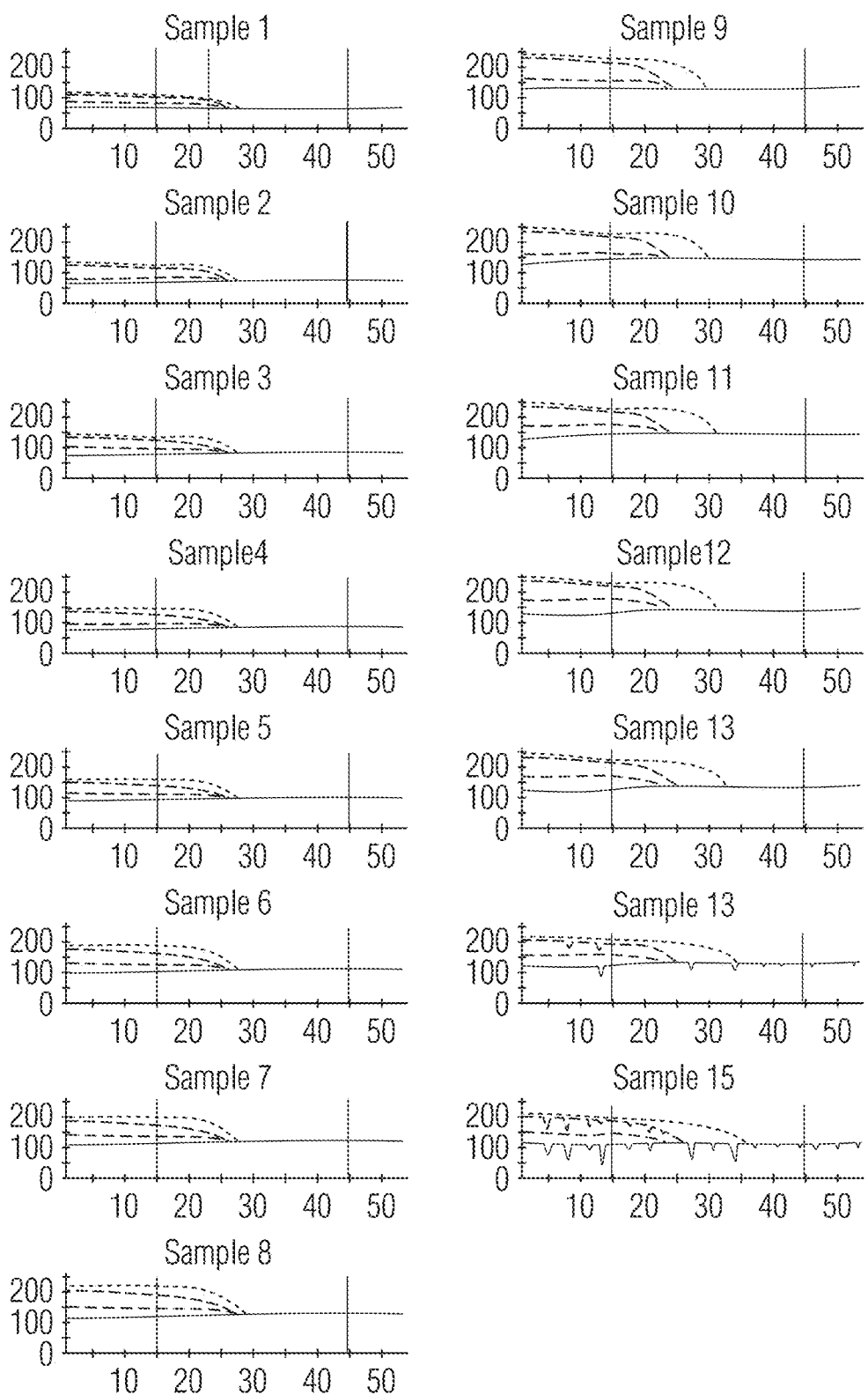
Figure 14F:
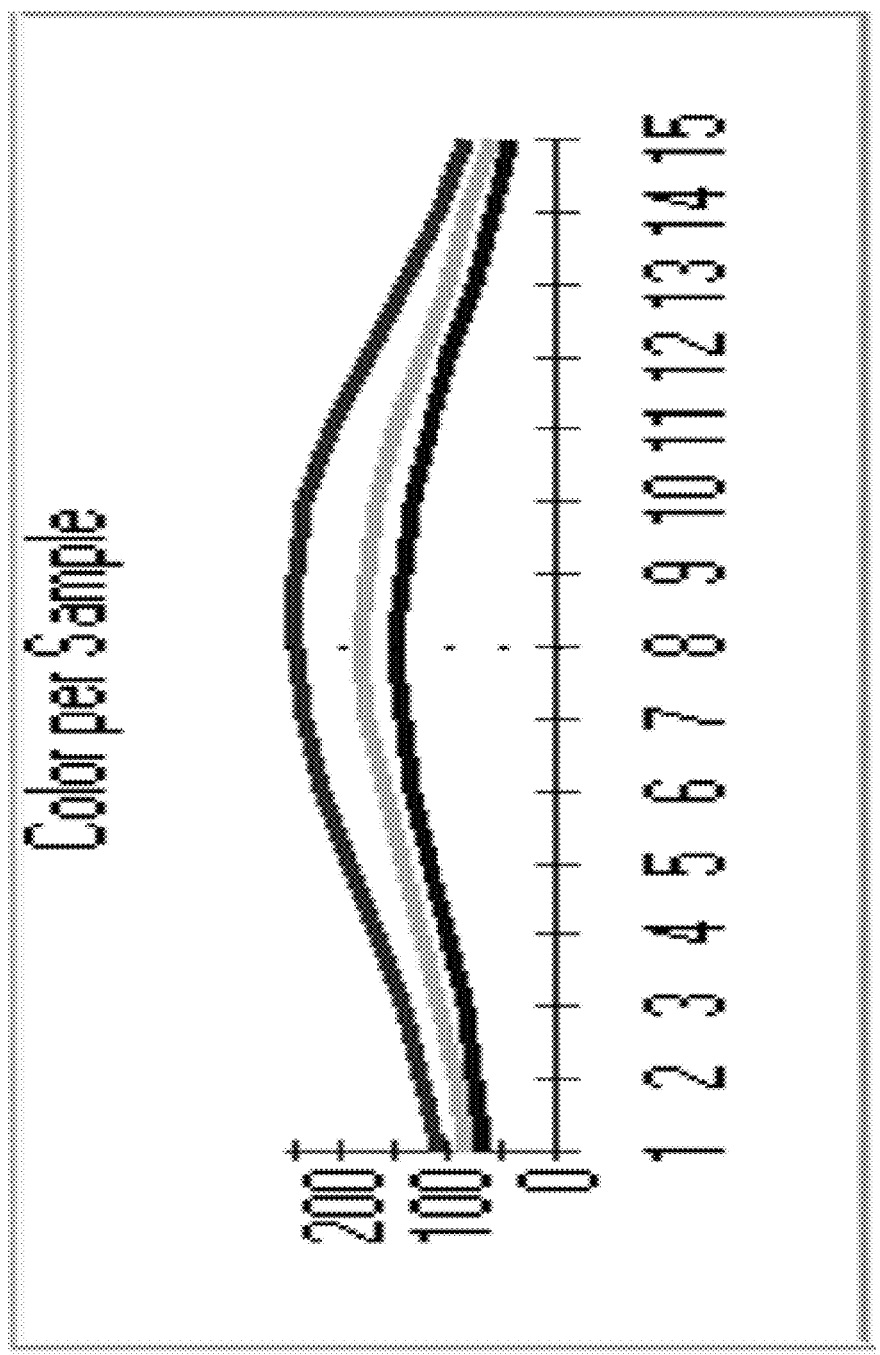
Figure 14G:
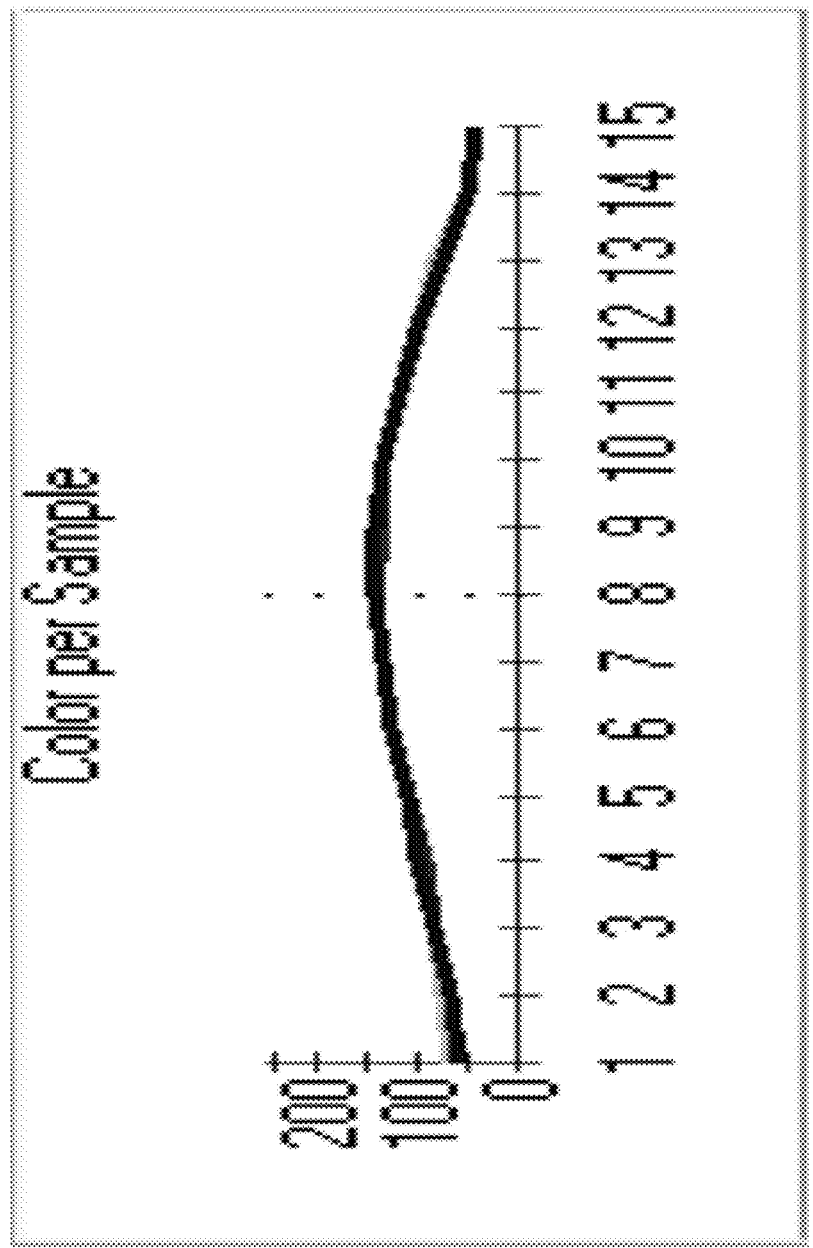
Figure 14H:
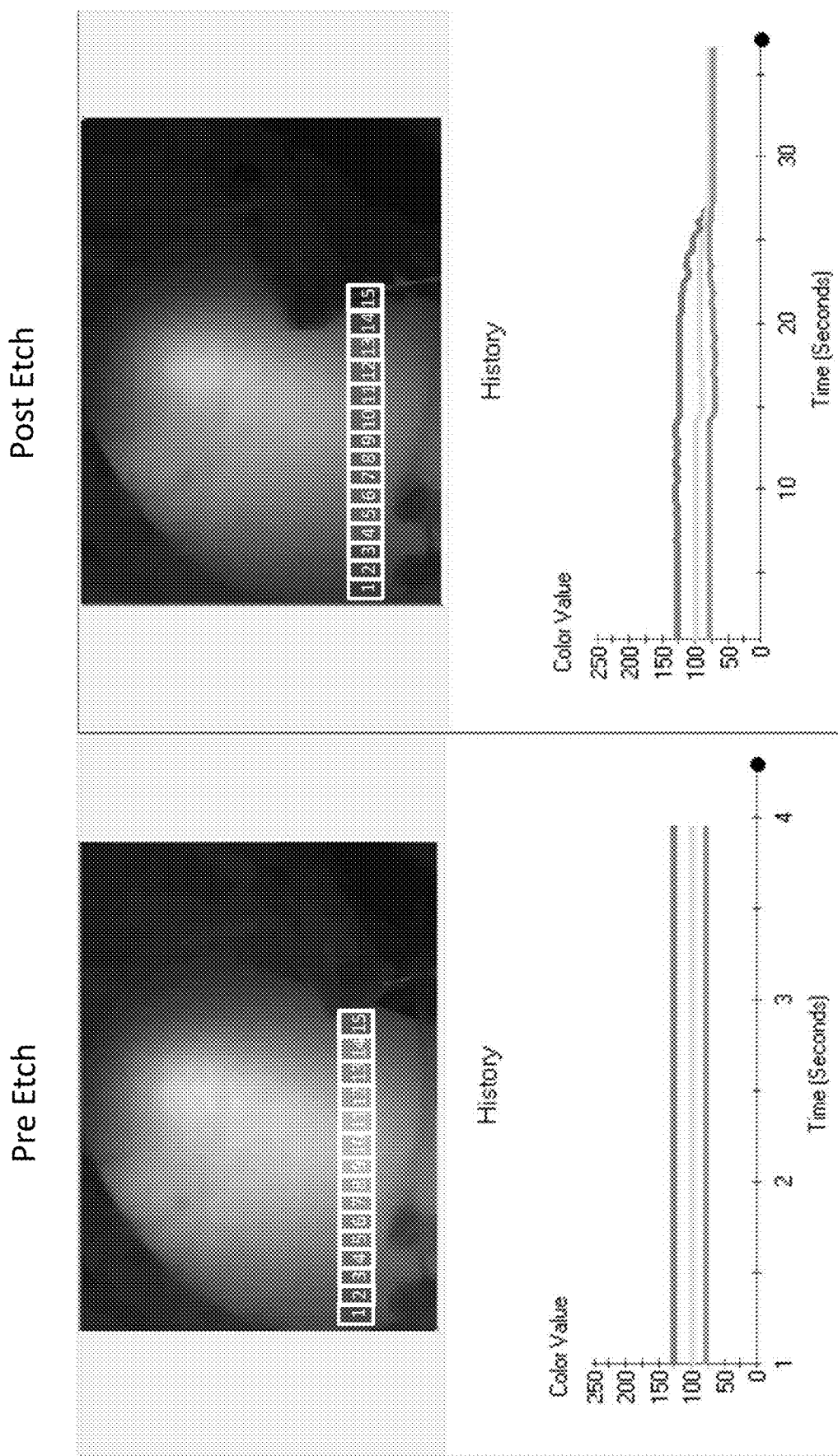
Figure 14I:
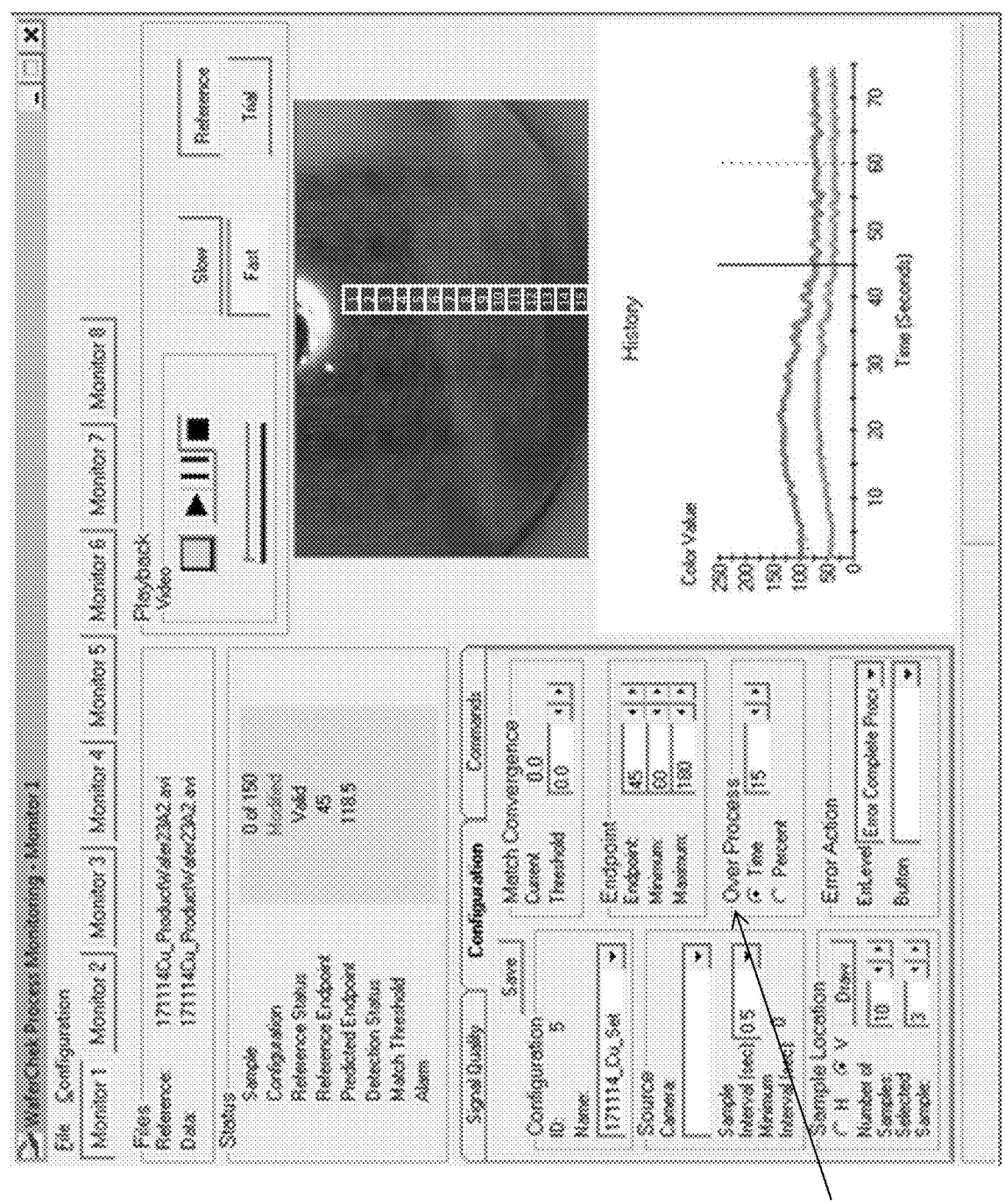
Figure 14J:
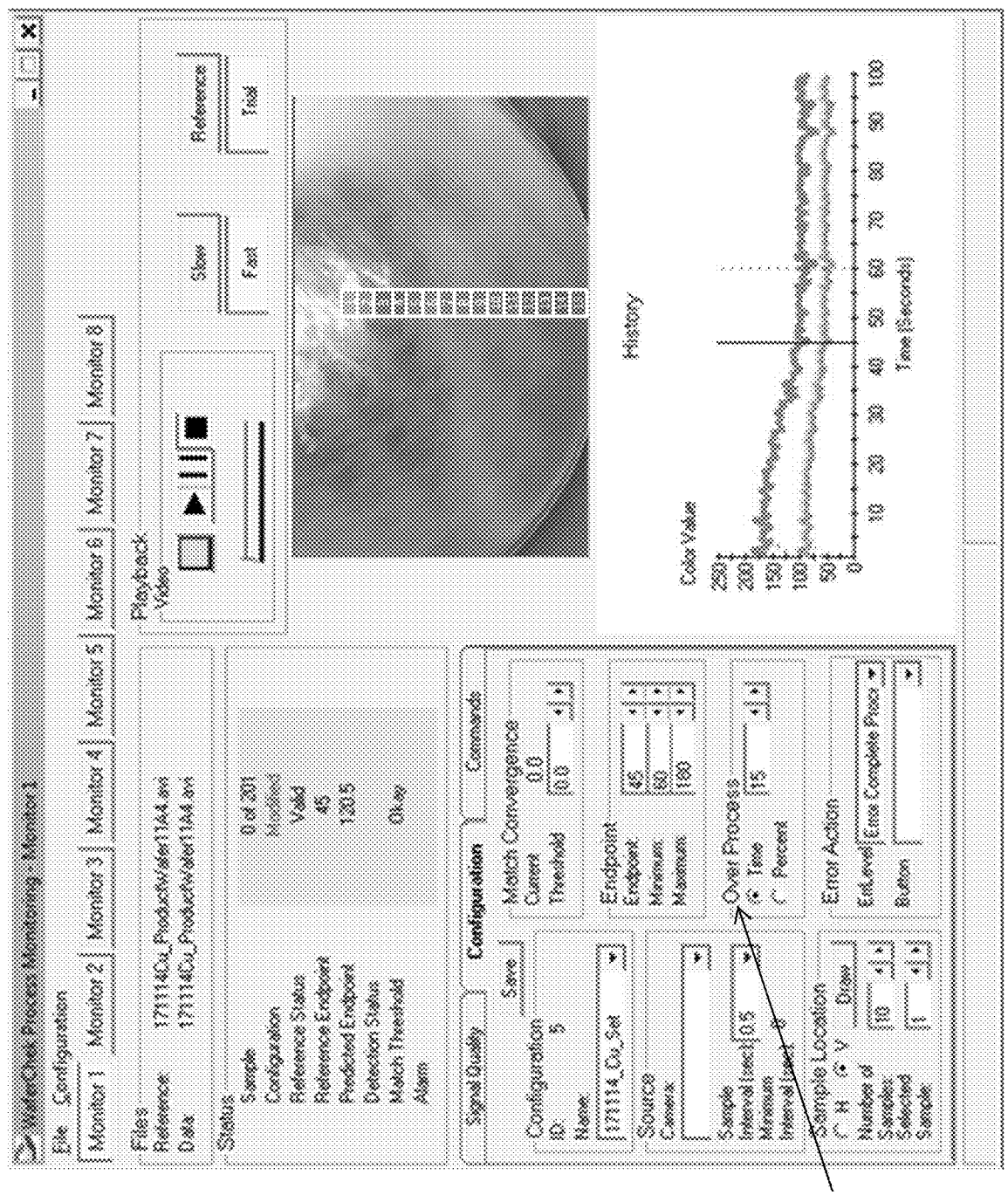
Figure 15A:
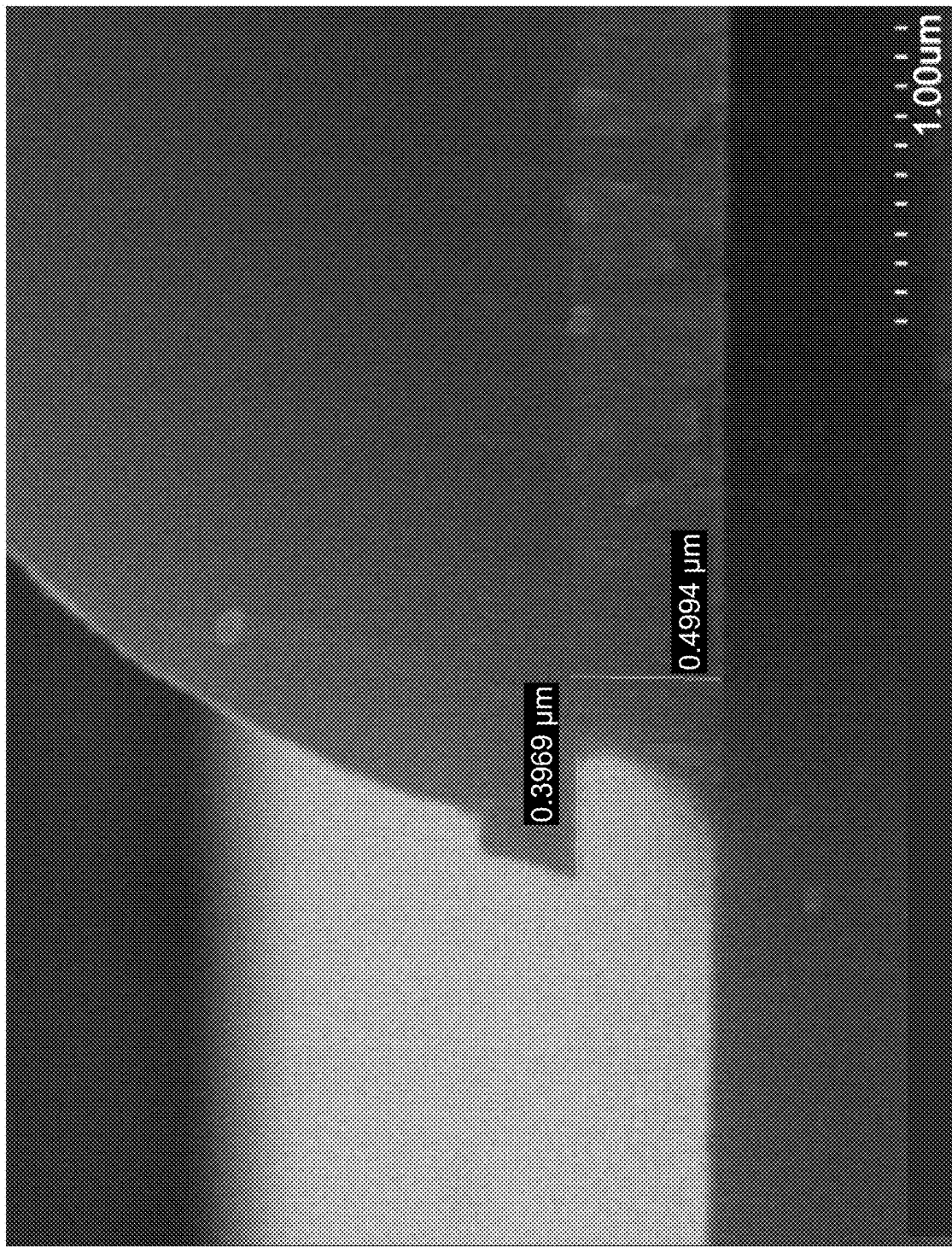
Figure 15B:
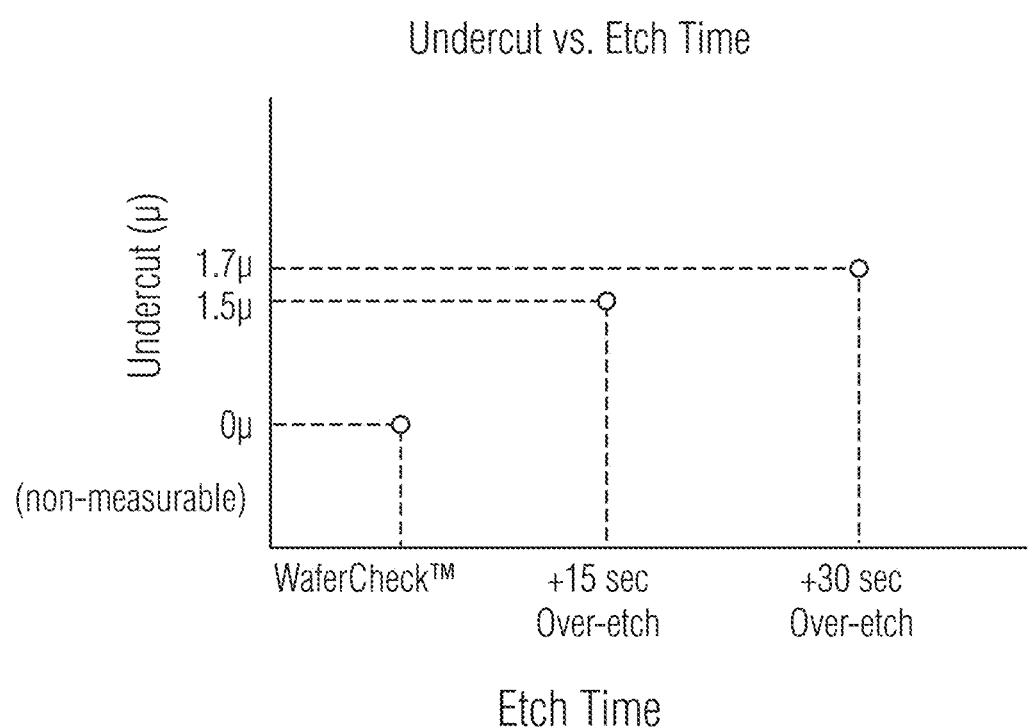
Figure 16:
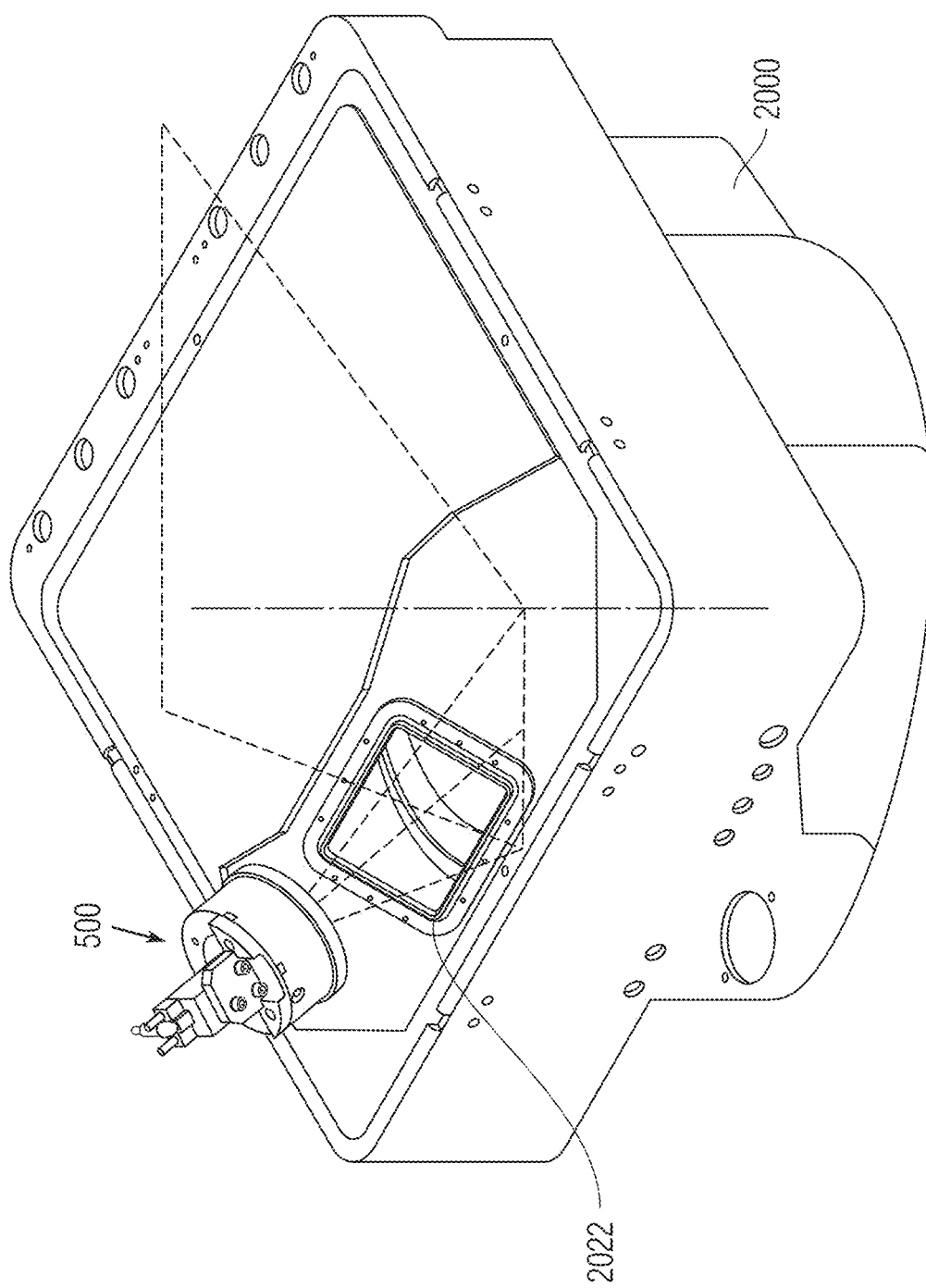
Figure 17:
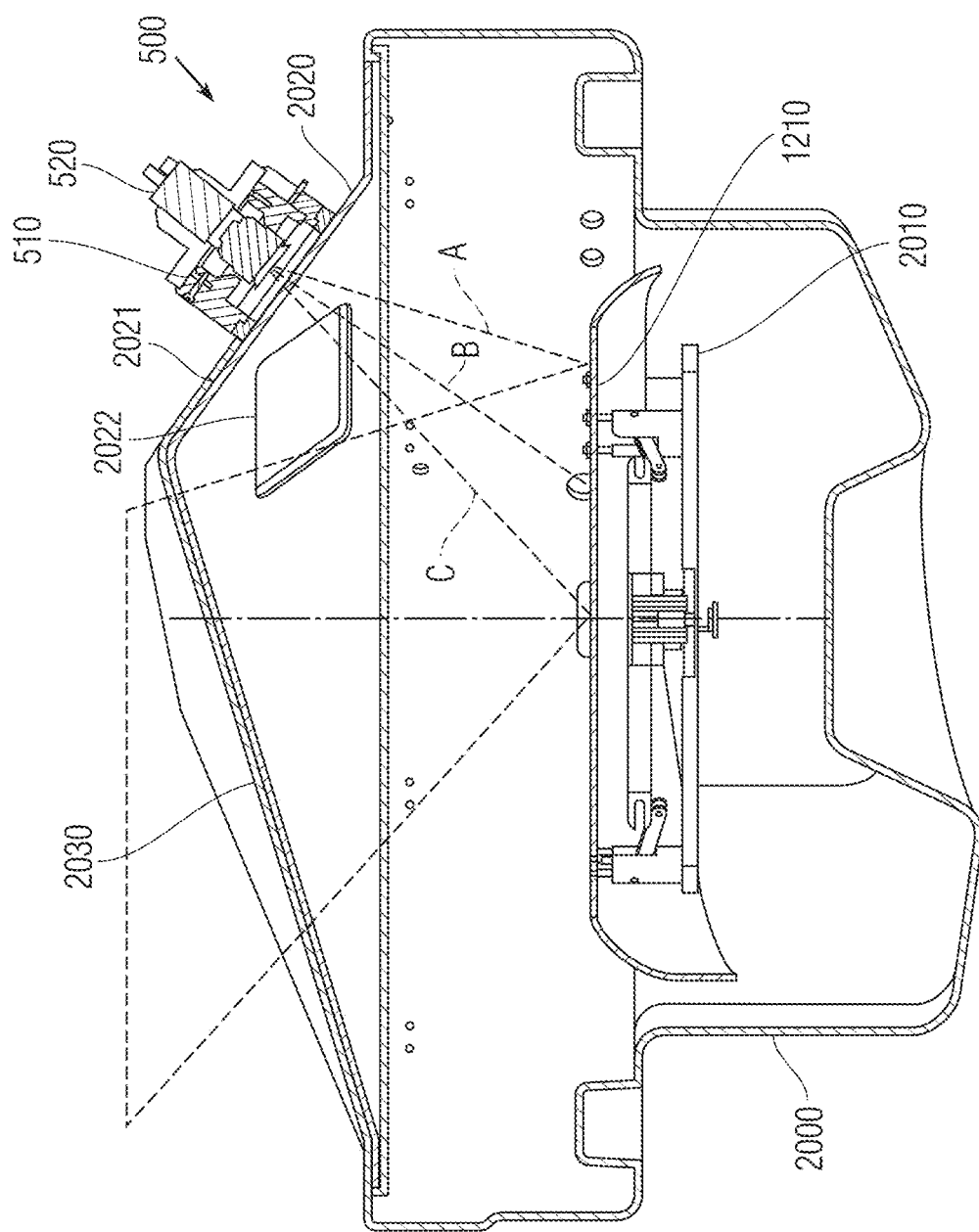
Figure 18:
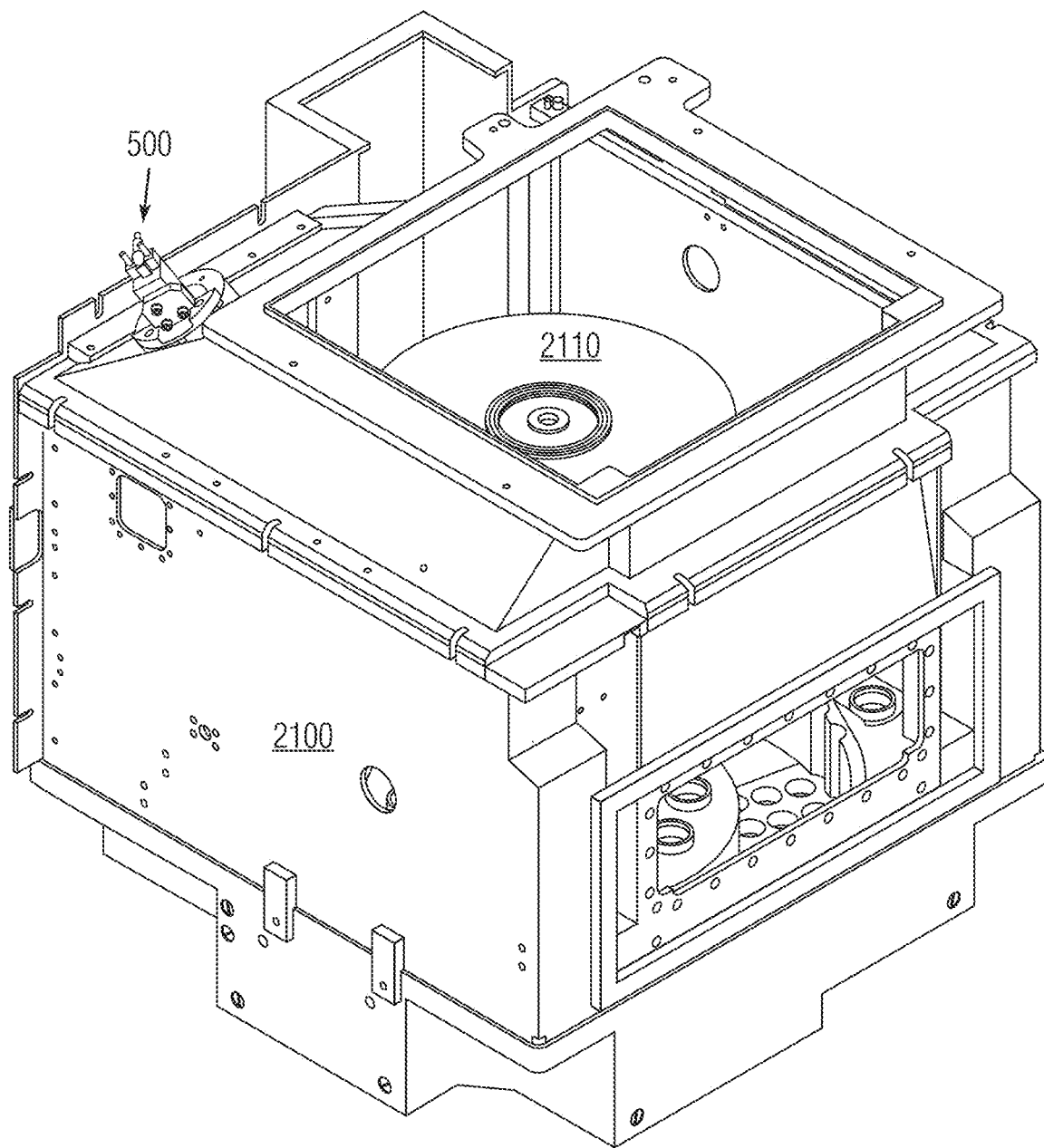
Figure 19:
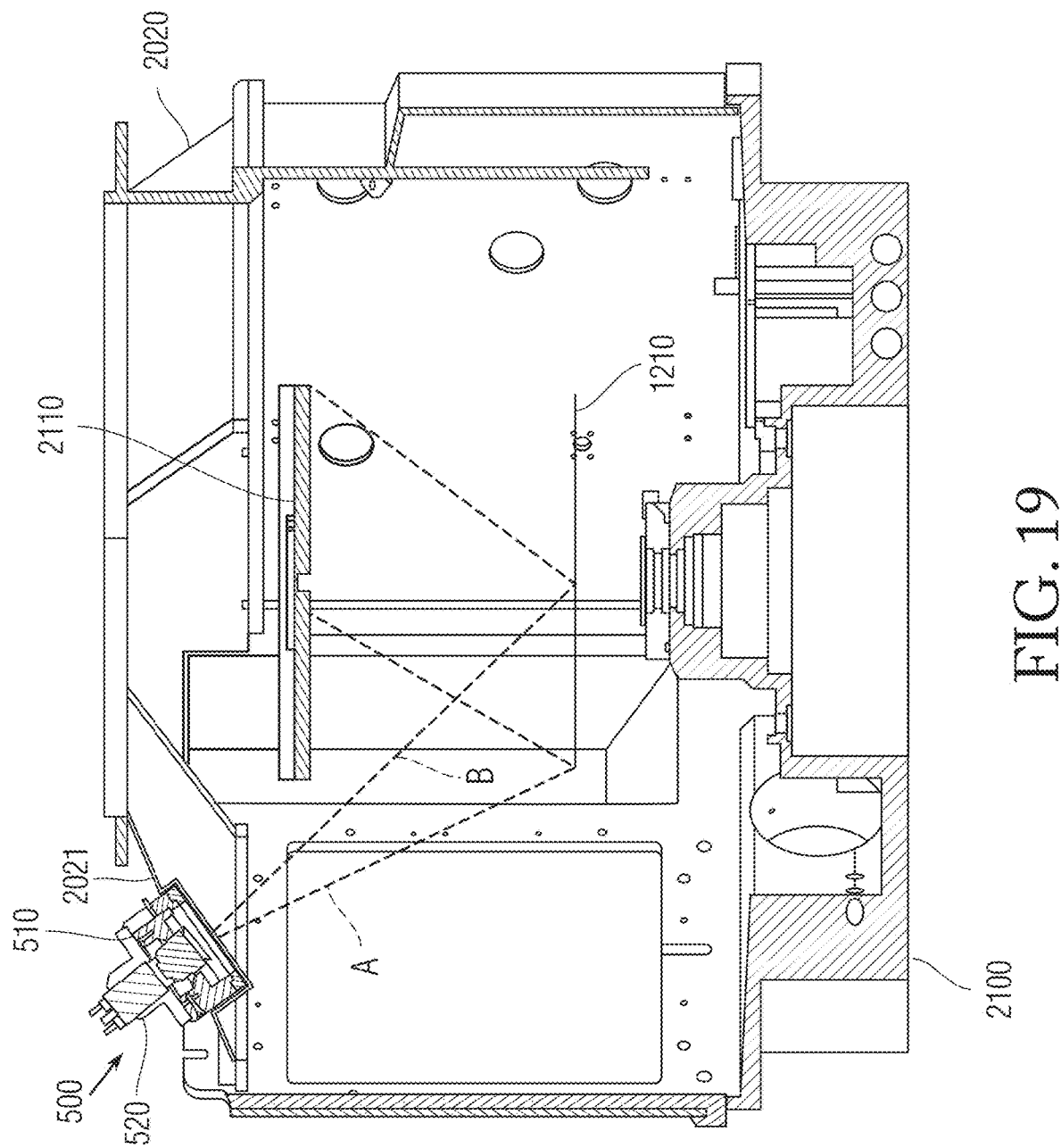
Figure 20:
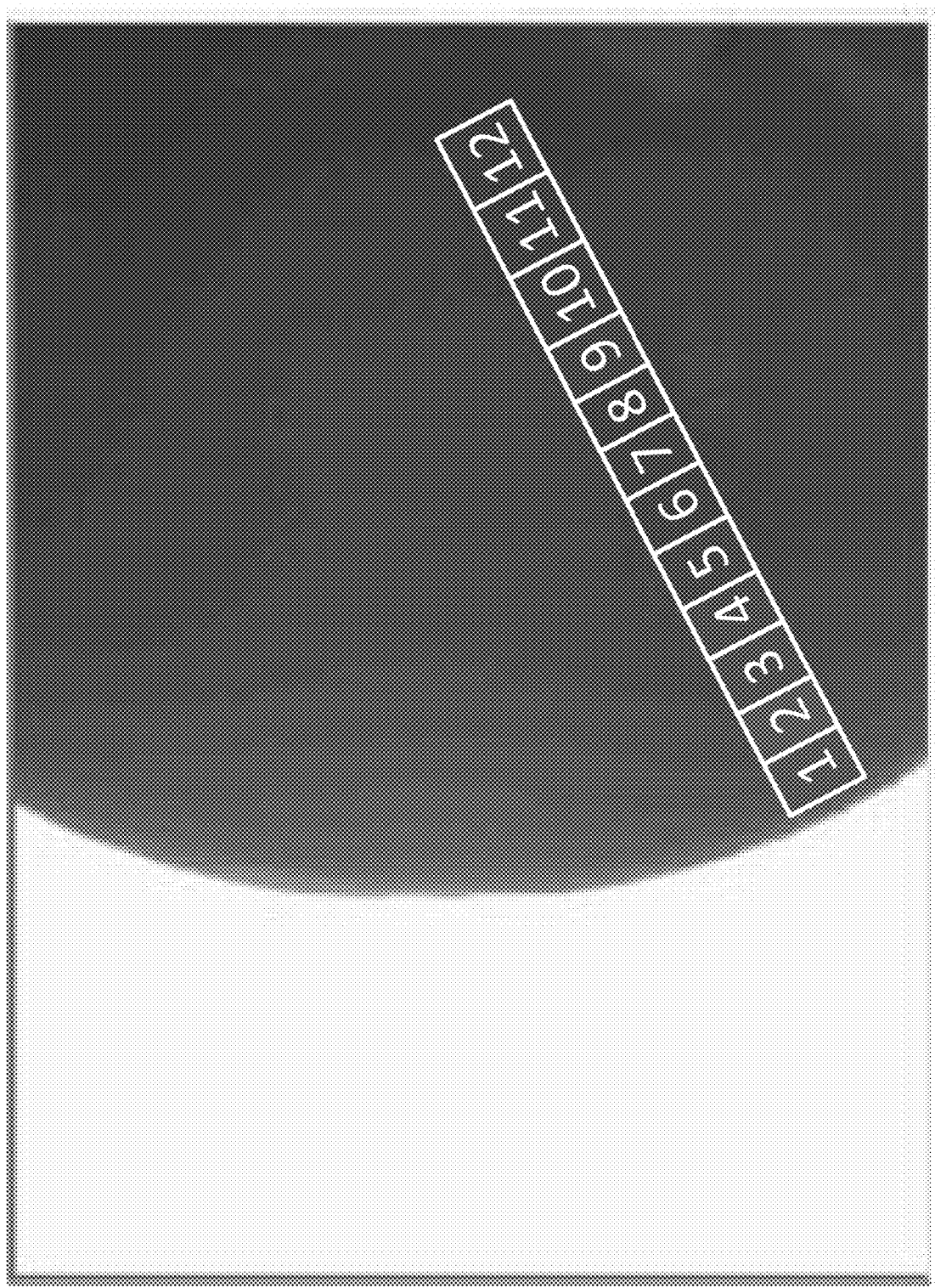
Figure 21:
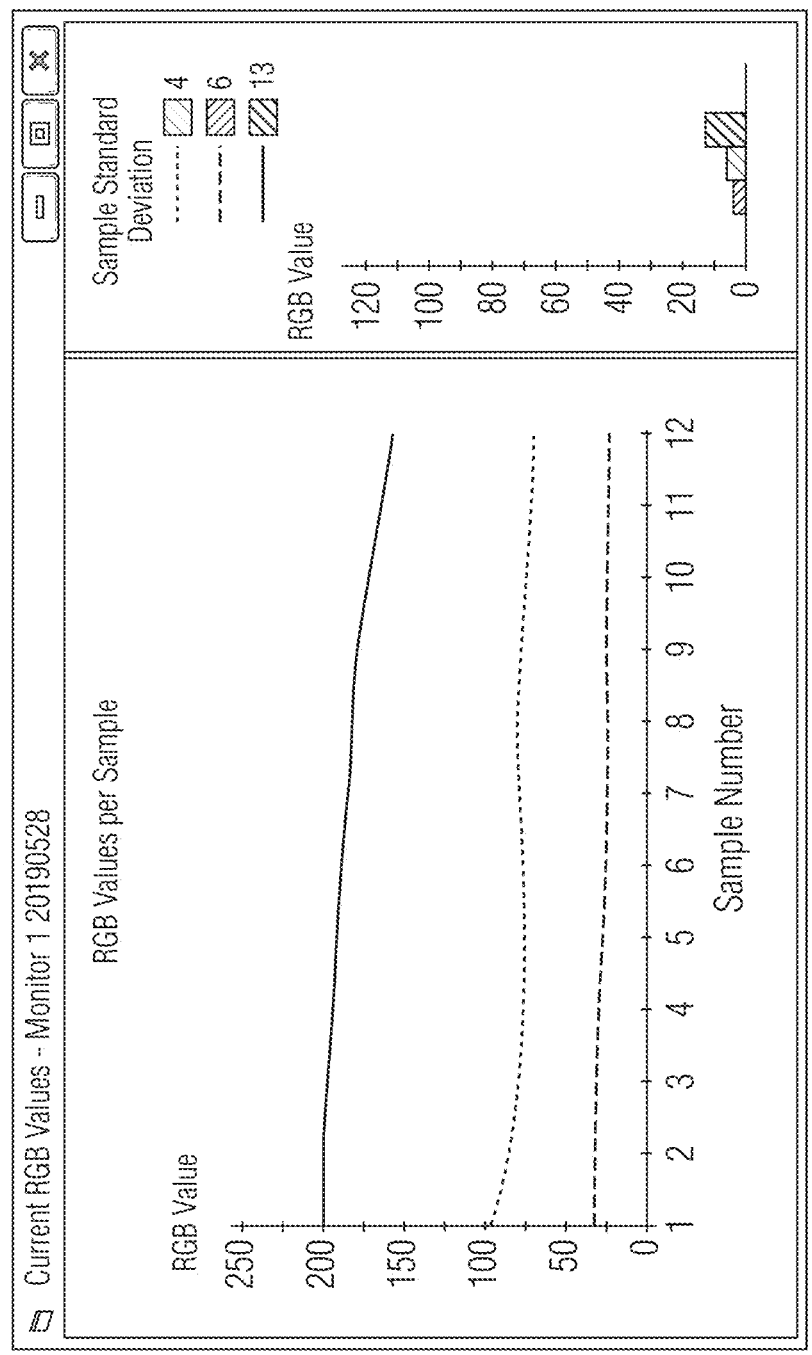
Figure 22:
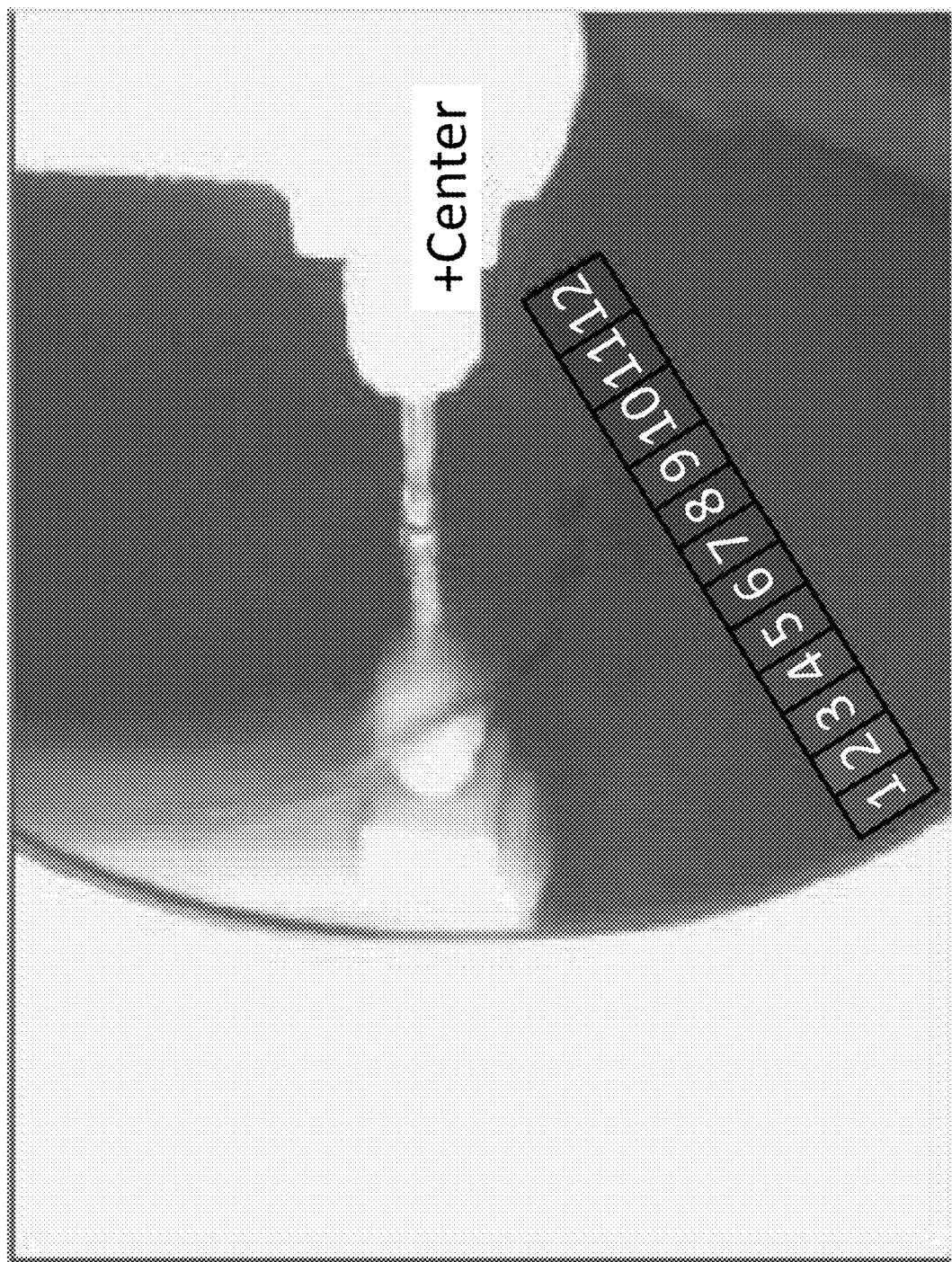

FIG. 3 displays an image of an exemplary substrate that underwent an under bump metallization etch, the image showing a lateral etch beneath the pillar and the lateral etch beneath the seed layer in accordance with one or more embodiments disclosed herein;

FIG. 4 is a perspective view showing a system for performing a wet etching process in accordance with one or more embodiments disclosed herein;

FIG. 5 is a front plan view showing a system for performing a wet etching process in accordance with one embodiment disclosed herein;

FIG. 6 is a block diagram showing an exemplary configuration of a system for performing a wet etching process in accordance with one or more embodiments disclosed herein;

FIG. 7 is a front plan view showing a measurement station in accordance with one embodiment disclosed herein;

FIG. 8 is a perspective view showing a wet etching station in accordance with one or more embodiments disclosed herein;

FIG. 9 is a front plan view showing a cleaning station in accordance with one embodiment disclosed herein;

FIG. 10A is a block diagram showing an exemplary configuration of a system for performing a wet etching process in accordance with one or more embodiments disclosed herein;

FIG. 10B is a block diagram showing an exemplary configuration of a process control system in accordance with one or more embodiments disclosed herein;

FIG. 11 is a screenshot of a graphical user interface in accordance with at least one embodiment disclosed herein;

FIG. 12 is a perspective view showing a system for endpoint detection of an etch in accordance with one or more embodiments disclosed herein;

FIG. 13 is a flow diagram illustrating a routine for endpoint detection and minimization of undercut during an etch of a substrate in accordance with one or more embodiments disclosed herein;

FIG. 14A shows an exemplary graphical user interface of the system for endpoint detection of an etch in accordance with one or more embodiments disclosed herein;

FIG. 14B shows an exemplary image of a substrate showing the sample location in accordance with one or more embodiments disclosed herein;

FIG. 14C displays a graph showing the endpoint (in seconds) for each sample of the sample location on an exemplary substrate in accordance with one or more embodiments disclosed herein;

FIG. 14D displays a graph showing the color detected by the CCD camera at the endpoint for each sample of the sample location on an exemplary substrate in accordance with one or more embodiments disclosed herein, wherein in FIG. 14D, the top line represents red color, the middle color represents the green color, and the bottom color is blue;

FIG. 14E displays a graph for each sample showing the color change detected by the CCD camera at the endpoint for each sample on an exemplary substrate in accordance with one or more embodiments disclosed herein;

FIG. 14F displays a graph showing the color variation detected by the CCD camera for each sample prior to the etch on an exemplary substrate in accordance with one or more embodiments disclosed herein, wherein the top line represents red, the middle line represents green and the bottom line represents blue;

FIG. 14G displays a graph showing the color variation detected by the CCD camera for each sample after the etch on an exemplary substrate in accordance with one or more embodiments disclosed herein;

FIG. 14H displays a pre-etch image of an exemplary substrate and a graph showing color variations at a particular sample ("sample 2") on the exemplary substrate prior to the etch, and displays a post-etch image of the exemplary substrate and a graph showing the color variations at sample 2 on the exemplary substrate during the etch and at the endpoint of the etch in accordance with one or more embodiments disclosed herein, wherein in FIG. 14H, the top line is red, the middle line is green and the bottom line is blue on both the pre-etch and post-etch images;

FIG. 14I shows an exemplary graphical user interface of the system for endpoint detection showing the over process time at a particular sample ("sample 3") on a reference substrate and a graph showing the change in color detected over time at sample 3 during the etch of the reference substrate in accordance with one or more embodiments disclosed herein;

FIG. 14J shows an exemplary graphical user interface of the system for endpoint detection showing the over process time at a particular sample ("sample 1") on an exemplary substrate and a graph showing the change in color detected over time at sample 1 during the etch of the substrate in accordance with one or more embodiments disclosed herein;

FIG. 15A shows an image of a wafer etched using the endpoint detection system and FIG. 15B is a graph showing the difference in the amount of undercut in a given etch using the present endpoint detection system (WaferChek™) versus systems that utilized over-etch methods in accordance with one or more embodiments disclosed herein;

FIG. 15C shows a table of measurements for exemplary etched wafers of varying film thicknesses, bump radius, and over etch. The table also shows the percentage of remaining material that can be maintained for shrinking geometry features through reduction of over etch time in accordance with one or more embodiments disclosed herein;

FIG. 16 is a top perspective view showing a system for endpoint detection of an etch in accordance with one or more embodiments disclosed herein;

FIG. 17 is a cross-sectional view of the system of FIG. 16 for endpoint detection with the light detector position being illustrated along with the image/light path, wherein the system includes a dome lid but does not include a spin cover disk;

FIG. 18 is a top perspective view showing a system for endpoint detection of an etch in accordance with another embodiment disclosed herein;

FIG. 19 is a cross-sectional view of the system of FIG. 18 for endpoint detection with the light detector position being illustrated along with the image/light path, wherein the system includes a dome lid and further includes a spin cover disk disposed above the wafer; and FIG. 20 shows an exemplary image of a substrate showing the sample location in accordance with one or more embodiments disclosed herein;

FIG. 21 is a graph that shows the RGB values from sample 1 (at the edge) to sample 10 (at the center) of one exemplary wafer; and FIG. 22 shows an exemplary image of a substrate showing the sample location in accordance with one or more embodiments disclosed herein, with the sample area being slightly offset from the wafer center to avoid the path of the dispense arm and its reflection.

DETAILED DESCRIPTION OF CERTAIN EMBODIMENTS

The present application provides systems and methods for endpoint detection of an etch and minimization of undercut during an under (solder) bump metal (UBM) etch of a substrate. In one or more embodiments, the present systems and methods utilize a light detector, such as a CMOS, a color charge-coupled device (CCD) detector (camera) or equivalent structure for capturing the light that reflects off multiple samples on a substrate during the etch. Thus, while the brief description of the drawing figures makes reference to images of a CCD camera, it will be appreciated that the same images can be obtained using a CMOS detector (sensor) (camera) or other structure. The light detector is operatively connected to a computing device, which is configured to determine the color of the reflected light at each sample as the substrate is etched, and then determine based on the reflected color, when the etch of the first substrate has been completed. The system can then utilize the color data captured during the etch of the substrate to more effectively and efficiently etch a subsequent substrate by, thereby limiting any undercut displayed in the etched substrate.

It is noted that the teachings of commonly owned U.S. patent application Ser. No. 15/903,799 filed Feb. 23, 2018, U.S. Pat. No. 9,870,928 issued Jan. 16, 2018, and U.S. Pat. No. 9,698,062 issued Jul. 4, 2017 are hereby incorporated by reference in their respective entireties as if set forth herein.

The present systems and methods allow for the elimination of incomplete etch of a substrate, while also limiting or eliminating lateral etch of a substrate that results from overetch. The present system accomplishes these aims, among others, by: a) using multiple samples on a substrate in an endpoint detection method to ensure that the etch is not incomplete; b) increasing the frame capture speed of the light detector (e.g., CMOS or CCD camera) to more accurately determine the endpoint of an etch of a particular substrate; and c) altering, by the system, the etch parameters for subsequent etches of substrates based in part on the light data captured during previous substrate etches. Modification of the etch parameters for subsequent substrates further confirms the appropriate etch parameters for each type of substrate to ensure that the substrate is not incompletely etched, but also not overetched. These and other aspects of the present systems and methods are described with reference to the accompanying figures.

The referenced systems and methods are now described more fully with reference to the accompanying drawings, in which one or more illustrated embodiments and/or arrangements of the systems and methods are shown. The systems and methods are not limited in any way to the illustrated embodiments and/or arrangements as the illustrated embodiments described below are merely exemplary of the present systems and methods, as appreciated by one skilled in the art. Therefore, it is to be understood than any structural and functional details disclosed herein are not to be interpreted as limiting the systems and methods, but rather are provided as a representative embodiment and/or arrangement for teaching one skilled in the art one or more ways to implement the systems and methods. Accordingly, aspects of the present systems and methods can take the form of an entirely hardware embodiment, an entirely software embodiment, or an embodiment combining software and hardware. One of skill in the art can appreciate that a software process can be transformed into an equivalent hardware structure, and a hardware structure can itself be transformed into an equivalent software process. Thus, selection of a hardware implementation versus a software implementation is one of design choice.

FIGS. 4-10 illustrate an exemplary system 100 for performing a wet etching and endpoint detection process that results in minimization of undercut in accordance with at least one embodiment of the present application. The system 100 can thus be thought of as being a wet-etching facility for manufacturing semiconductor devices. It will be understood that the terms "wafer" and "substrate" are used interchangeably herein.

The system 100 is an integrated system can be defined by a number of different devices (equipment pieces) that are located at different stations within a housing 110. As shown in FIG. 4, the housing 110 is generally in the form of an upstanding cabinet or the like that has a plurality of walls 112 that define a hollow interior 120. The hollow interior 120 can be accessible through a number of different access points, including but not limited to a door assembly 130 shown at one end of the housing 110 and one or more side walls 112 can include windows 140 to allow direct access and viewing of the hollow interior 120 and more particularly, the equipment and processing stations included therein. In one embodiment, as illustrated, one side wall 112 can include transparent windows 140 and one or more access points 150. The opposite side walls 112 can include an access point 150 of a different form, such as a set of doors as shown in FIG. 5.

Each access point 150 can be in the form of an opening that provides an entrance into the hollow interior 120 and in addition, a wafer holding and loading device (loadport) 160 can be provided at such location along one side wall 112. The device 160 can be any number of conventional devices that are designed to hold and permit access to wafers contained therein and can be in the form of a FOUP loadport, with FOUP being an acronym for Front Opening Unified Pod or Front Opening Universal Pod. A FOUP is a specialized plastic enclosure with a cassette therein designed to hold silicon wafers securely and safely in a controlled environment, and to allow the wafers to be removed for processing or measurement by tools equipped with appropriate loadports and robotic handling systems. As illustrated in FIG. 4, the device 160 can be in the form of an input/output cassette device.

The wafer holding and loading device (loadport) 160 can be in the form of an input/output wafer cassette device which includes a housing which is configured to receive and hold a cassette holding a plurality of wafers. For example, the housing can include a door 162 at each end thereof, with one door 162 facing outwardly away from the hollow interior 120 so as to allow a technician to load one or more wafers, into the loadport 160. Another door 162 faces and is accessible within the hollow interior 120 so as to permit automated removal (and reloading) of the wafer from within the hollow interior 120 to allow the wafer to be transferred to the various stations contained within the hollow interior 120. The wafer holding and loading device 160 can be of the type that includes a plurality of racks or the like for holding a plurality of wafers in a vertically stacked manner.

The housing (cabinet) 110 can also include one or more computer terminals 170 which operate in the manner described below and allow the technician to both control and monitor the processing of the wafer within the housing 110 as the wafer is subjected to the various processing steps at the different stations.

It will also be appreciated that the system 100 can include a number of different conventional operating systems to provide for power, cooling, heating, fluid flow (plumbing architecture), etc. The system 100 also includes a number of different safety features including an emergency off button and audible and/or visual alarms to alert the technician when an abnormal condition is observed within the system 100.

FIG. 6 is a schematic view showing exemplary stations that are contained within the housing (cabinet) of the system of the present invention. In general, the system 100 includes a first station 200 that contains one or more devices 160 for holding wafers (e.g., FOUP loadports) and providing direct access to the interior 120 of the housing 110 as described above. A second station 210 is in the form of one or more measuring chambers for measuring different properties of the wafer as described below. A third station 220 contains one or more etch chambers for performing a single wafer wet-etching process on the wafer in accordance with the two-step etching process described herein. A fourth station 230 and optionally a fifth station 240 are cleaning chambers in which the processed wafer is cleaned. As a result of the system 100 being an automated system, a wafer transfer device 300 is provided and is configured to move one or more wafers from between the various stations of the system 100. The wafer transfer device 300 can take any number of different forms but generally is in the form of an automated device, such as a robot, that is configured to controllably grasp, move and release one or more wafers. Generally, the wafer transfer device 300 includes a robotic arm that has a grasp (holding) mechanism for grasping and holding a wafer and has a base about which the robotic arm can move in multiple directions (multiple degrees of freedom). It should be understood that one or more of the process stations/chambers can be combined to have multiple process functions. For example, the measuring apparatuses used in the measuring chamber can be incorporated into the wet etch chamber to provide a combined measuring and etch station. By way of further example, the etch chamber and cleaning chamber can be combined into multi-process chambers as would be understood by those skilled in the art.

Thus, the wafer transfer device 300 can thus be thought of as being an automated wafer handler. It will also be appreciated that the wafer transfer device is a computer operated device and therefore, as described below, operates in accordance with the execution of a software application, etc. In addition, it will also be appreciated that the wafer transfer device 300 can be operated in response to user generated commands, such as commands that are generated by the technician at a user interface, such as the computer terminal 170.

While in FIG. 6, the wafer transfer device 300 is shown as being centrally located within the interior of system 100, it is not limited to assuming such a position within the system so long as the wafer transfer device 300 is located at a position that allows the device 300 to access each of the stations of the system and transfer the wafer between all of the necessary stations.

Each of the individual stations mentioned above is described in greater detail below.

First Station 200

As mentioned above, the first station 200 includes one more wafer holding and loading devices (FOUP loadport or input/output cassettes) 160 for holding wafers in a sealed and secure manner. Any number of different conventional wafer holding and loading devices (FOUP loadport) 160 can be used in system 100. Typically, the wafer holding and loading device (FOUP loadport) 160 is of a type that contains a cassette holding the wafers. The door 162 is positioned such that the wafer transfer device (robot) 300 can directly access the wafers from the FOUP. The wafer holding and loading device (FOUP loadport) 160 can also include recognition features, such as RFID tag, barcode reader, etc. to allow it to be identified by readers on tools, etc. It should be understood that loadport 160 is not limited to being of an FOUP type. Various wafer holding and loading mechanisms can be used in addition to FOUPs having built in cassettes such as wafer boxes having removable cassettes as would be understood by those skilled in the art.

While FIG. 6 shows two blocks as constituting the station 200, it will be understood that this is only for illustrative purposes and is not limiting of the present invention since, as shown in FIG. 2, system 100 can include more than one wafer holding and loading device (FOUP loadport) 160. Moreover, it should be understood that each loadport 160 can be configured to receive one or more cassettes.

Second Station 210

As mentioned above, the second station 210 is a measuring station (wafer inspection station) in which a property of the wafer can be measured (e.g., the thickness of the wafer) at one or more locations on the wafer. The second station 210 thus includes a measuring device (metrology device) 600 for measuring one or more properties of a wafer. Any number of different types of measuring devices can be used.

In accordance with one embodiment of the present invention, the measuring device 600 is in the form of an imaging device that is configured to measure one or more properties (e.g., wafer thickness and surface profile) of the wafer. In one or more embodiments, the measuring station (second station 210) can be partially or entirely excluded from the system 100.

FIG. 7 shows one exemplary measuring (imaging) device 600 that includes a platform 610 for receiving and holding a wafer in a fixed orientation (e.g., in a horizontal orientation). The platform 610 can be of an adjustable type to accommodate different sized wafers. For example, the diameters of wafers can vary considerably and thus, the platform 610 is constructed to allow different sized wafers to be placed and supported thereon. In addition, the platform 160 can move in any number of different directions (x, y, z) (i.e., the platform 610 has multiple degrees of freedom of movement) and is rotatable such that the wafer can be rotated during the measuring process.

The metrology (measuring) device 600 can also include a measurement component 620 that measures at least the thickness of the wafer and is also configured to detect (measure) and generate a surface profile for the wafer. The measurement component 620 includes imaging equipment and can be part of an automated device to allow movement of the component 620 with respect to the wafer on the platform 610. For example, the measurement component 620 can be in the form of an arm or the like that can move in any number of different directions (x, y, z) with respect to the wafer (i.e., the component 620 has multiple degrees of freedom of movement). Alternatively, or in addition, the component 620 can be held in a stationary position and platform 610 supporting the wafer can be moved in any number of different directions (x, y, z) with respect to the component 620 and/or rotated.

The measurement component 620 includes one or more sensors 630, such as an optical sensor (e.g., an IR light sensor) and a light source that is directed at the surface of the wafer. The reflected light (after contacting the wafer) is collected by the imaging device and based on the collected information (and after processing thereof in accordance with execution of software), a number of different measurements of the wafer can be taken and recorded. More particularly, light is reflected at the top and bottom of each surface in the film stack (the layers of material that form the wafer) and the distance in reflected light is corrected according to the refractive index of the material in order to calculate depth. For example, the imaging device can measure the following properties (which is not an exhaustive list): wafer thickness; bow, warp, flatness; surface roughness; total thickness variation (TTV); optical inspection pattern recognition; and interconnect pad depth, etc.

In accordance with one or more embodiments, the measuring station 210 is directly incorporated into and contained within the housing (cabinet) 110. As a result, the second station 210 and the imaging device 600 contained thereat is within reach of the wafer transfer device (robot) 300. This positioning allows the automated wafer transfer device 300 to easily move a wafer between the second station 210 and any of the other stations of the system 100. This is in direct contrast to conventional system in which measuring equipment is located at a remote location and requires wafers to be removed from the etch process in order for a measurement to be taken. After such measurement is taken, there is a wait period in which the wafer is held before being introduced back into the etch processing equipment. This leads to complexity and time delays, thereby directly and adversely impacting the number of wafers that can processed in a given time period. Moreover, in a production setting, these inefficiencies lead to batch processing of wafers, wherein multiple wafers are measured prior to being returned to the etch processing equipment. Accordingly, any feedback regarding the etching process is obtainable on a batch to batch basis and not in real time (i.e., on a wafer to wafer basis) thereby preventing the adjustment of process parameters in real time (on a wafer to wafer basis) and resulting in a decrease in quality and an increase in waste. Incorporating the measuring device into system 100 and implementing a process that includes a measuring step for each wafer before and after etching in a single wafer wet etch chamber as further described herein provides a system capable of tailoring the etch process parameters to the specific characteristics of each wafer and feedback concerning previously etched wafers in real time. Accordingly, the system can achieve higher quality, minimize waste and the benefits generally associated with a single wafer wet etch process.

Third Station 220

The third station 220 is an etch station in which the wafer undergoes the single wafer wet etching process as described herein (e.g., via a two-step process or other process). As mentioned before, a single wafer wet etching process is generally performed by dispensing a certain amount of chemical etchant onto a wafer disposed within the station and causing a chemical reaction with a contacted surface of the wafer so that the unnecessary portion of the contacted surface is etched by the chemical.

As shown in FIG. 8, the third station (220) includes a single wafer wet etching apparatus 400 that includes an etch chamber (enclosure) 410 that contains the equipment and chemical etchant used in the wet etching process. The etch chamber 410 can thus be thought of as a chemical containment structure. It will be understood that third station can hold a plurality of etching apparatuses 410, such as is a vertically stacked orientation, to allow wet etching to be performed simultaneously on more than one wafer. The enclosure 410 also collects and contains the chemicals used in the etching process.

The wet etching apparatus 400 located at the third station 220 also includes spin chuck 420 (variable speed controlled by an etch controller 401 which is part of the overall process control system described herein) on which the wafer rests, as well as an etch tool (arm) 430 that includes one or more nozzles (orifice) 435 that dispenses a fluid (e.g., one or more liquids, preferably the chemical etchant). The etch tool 430 can be in the form of an arm that is movable along multiple directions (z and theta directions) and thus, has multiple degrees of freedom; however, the arm length restricts the radius that is swept. The etch tool 430 is a controllable tool in that it is controlled by a computing device such as etch controller 401 and is part of the overall programmable computer system employed in the system 100 as described herein. As a result, the etch tool 430 can be driven to any specific location of the wafer, etc.

The wet etching apparatus 400 also includes a fluid delivery and fluid removal system for both introducing the etch chemicals and removing such chemicals from the chamber. These components are implemented using a conventional fluid plumbing scheme in which conduits are provided for supplying fluid (e.g., one or more liquids, preferably a chemical etchant) to the nozzle 435. In addition, the wet etching apparatus 400 includes conduits and mechanisms for discharging fluid(s) that accumulate within the enclosure 410 during the wet etching process.

The mechanical chuck 420 permits the chuck 420 to hold the wafer. The chuck 420 includes a main shaft (not shown) which can be joined to a driving shaft of a motor so as to allow the wafer held by the spin chuck 420 to make a spin rotation about a Z-axis. A power source switch of the motor is connected to an output side of the etch controller 401, with the result that the rotation speed of the motor is controlled by the controller 401. Also, the spin chuck 420 can be supported by a lift mechanism (not shown) so as to be movable in a direction of the Z-axis.

Traditionally, around the outer periphery and bottom portion of the spin chuck 420 a structure is provided for receiving and collecting the etchant solution, which is centrifugally separated from the wafer and is then discharged to the outside. Part of the mechanism for discharging fluid(s) from the enclosure 410 can be an exhaust gas passageway and drain pipes that are formed in the bottom portions of the collector structure that surrounds the chuck 420. The liquid stored in the collector structure can be discharged to the outside through one or more drain pipes or re-circulated.

In accordance with the present invention, any number of suitable etching solutions can be used so long as they are suitable for a wet etching process and for the intended substrate and application. Thus, different chemistries can be used based on a number of different parameters, including in view of the properties of the wafer. As described herein, when a two-step etch process is undertaken, different etchants can be used as part of the different etch stages.

With respect to the delivery of the etchant solution, the wet etching apparatus 400 also includes means for controlling the flow properties (flow rate) and temperature of the etchant solution. The operating system can include one or more first flow rate control sections, including but not limited to a pump or valve, that extend from a liquid supply source to a nozzle. The operating section of the flow rate control section can be connected to the output side of the etch controller 401 so as to control the flow rate of the etchant solution supplied to the nozzle. In addition, other control mechanisms can be used to control the concentration of the etchant solution. The control of the concentration of the etchant is one means for controlling the overall etch rate and etch process for a given wafer.

In accordance with one aspect of the present invention, the wet etching apparatus 400 includes an endpoint detection device 500. One exemplary endpoint detection device 500 includes a light emitter 510 (e.g., a high intensity white light emitter) and a light detector 520 (e.g., a CMOS or charge-coupled device (CCD) detector). It will be appreciated that the light emitter 510 can have different constructions depending upon the particular applications in which it is used and in one embodiment, the light emitter can be a high intensity white light emitter with a red filter. Additionally, in at least one embodiment, the light emitter 510 can be located separate from the endpoint detection device 500 and the detector 520 (see FIG. 12). The operation of the endpoint detection device 500, and specifically light emitter 510 and light detection 520, is described in greater detail hereinafter; however, the device 500 is responsive to a computing device, such as etch controller 401 or computing device (terminal) 170, and the light emitting device 510 emits light (e.g., white light) onto at least a portion of the surface of the particular wafer in the wet etching station 220. The light detector 520 (e.g., s CMOS or CCD detector) detects the light being reflected by the portion of the particular wafer and the CMOS or CCD detector 520 transmits the detected light information to a process control system as further described herein. As described herein, the endpoint detection device 500 is advantageously employed by the present invention to perform precise UBM etches and/or to expose RDL materials (e.g., interconnect pads) to a precise and uniform depth. It will be appreciated that the device 500 is not limited to being formed of the above pieces of equipment but in generally is an optics-based system in which light characteristics are analyzed in order to determine a property or condition of the substrate.

Fourth and Fifth Stations 230, 240

After the wafer undergoes processing at the etch station 220, the wafer can then be cleaned at one or more wafer cleaning stations. FIG. 6 shows two distinct cleaning stations 230, 240; however, this is merely representative of one embodiment and it will be appreciated that a single cleaning station can be used. In such a construction, the single cleaning station can still employ one or more different cleaning techniques for cleaning the wafer.

During an exemplary scrubbing process, it is desirable to direct streams of water or streams of a cleaning solution at both surfaces of the spinning wafer to wash away particulates. This is typically accomplished by providing spray nozzles 1650 (FIG. 9) positioned above and/or below the wafer. The spray nozzles are preferably connected to a source of pure water or cleaning solution through supply pipes. The flow rate of the water or cleaning solution can be controlled by a pump and valve arrangement (not shown) which is, in turn, controlled by a cleaning controller 1601 (which is part of the overall process control system described herein). Alternatively, a pressurized fluid source can be used to provide fluid flow.

The cleaning station 240 (FIG. 6) can be a physically different station that is located proximate to the cleaning station 230 and is of a type in which the wafer is subjected to a different cleaning process than the one employed in the cleaning station 230. The cleaning station 240 can be thought of as being a final clean station. As mentioned above, the first cleaning step involves a scrubbing process which primarily removes the larger particles and residual etchant. The wafer can be transferred wet from the first cleaning station 230 to the final cleaning station 240.

As shown in FIG. 9, similar to cleaning station 230, the final cleaning apparatus 1700 can be in the form of a chamber 1710 and includes one or more arms 1740 and nozzles 1750 to dispense a high velocity spray onto the wafer and/or use a megasonic cleaning apparatus 1780 for the removal of small particles from the wafer surface. In addition, station 240 can include a drying apparatus 1790 to dry the wafer at the end of the final cleaning process.

Process Control System

FIG. 10A is a high-level diagram illustrating an exemplary configuration of a process control system 700 for use with the system 100 for performing a wet etching process. The present invention utilizes at least in some embodiments, a multi-step wet etch process as described herein. In one arrangement, the process control system consists of one or more computing devices including a process controller 705. It should be understood that process controller 705 can be practically any computing device and/or data processing apparatus capable of embodying the systems and/or methods described herein.

Process controller 705 can be configured to communicate with the various computer-controlled components of the system 100, including first station 200, second station 210, third station 220, fourth station 230, fifth station 240, and the computer controlled devices or controllers associated therewith including but not limited to wafer transfer device 300, FOUP loadports 160, imaging device 600, etch controller 401 and cleaning controller 501 transmitting electronic information to and receiving electronic information from the various components.

It should be noted that while FIG. 10A depicts the process control system 700 with respect to a process controller 705, it should be understood that any number of process controllers can interact with the process control system 700 and the constituent computer-controlled components of system 100 in the manner described herein. It should be further understood that while the various computing devices and machines referenced herein, including but not limited to computer terminal 170, process controller 705, first station 200, second station 210, third station 220, fourth station 230, fifth station 240, and the computer controlled devices or controllers associated therewith including but not limited to wafer transfer device 300, FOUP loadports 160, imaging device 600, etch controller 401 and cleaning controller 1601 are referred to herein as individual/single devices and/or machines, in certain implementations the referenced devices and machines, and their associated and/or accompanying operations, features, and/or functionalities can be arranged or otherwise employed across any number of devices and/or machines, such as over a direct connection or network connection, as is known to those of skill in the art.

FIG. 10B is a block diagram illustrating an exemplary configuration of process controller 705 of the system 100 for performing a wet etching process. Process controller includes various hardware and software components that serve to enable operation of the system, including a processor 710, interface 715, memory 720, display 740, audio output 760, storage 790 and a communication interface 750. Processor 710 serves to execute software instructions that can be loaded into memory 720. Processor 710 can be a number of processors, a multi-processor core, or some other type of processor, depending on the particular implementation.

Preferably, memory 720 and/or storage 790 are accessible by processor 710, thereby enabling processor to receive and execute instructions stored on memory and/or on storage. Memory can be, for example, a random access memory (RAM) or any other suitable volatile or non-volatile computer readable storage medium. In addition, memory can be fixed or removable. Storage 790 can take various forms, depending on the particular implementation. For example, storage can contain one or more components or devices such as a hard drive, a flash memory, a rewritable optical disk, a rewritable magnetic tape, or some combination of the above. Storage also can be fixed or removable.

One or more software modules 730 are encoded in storage 790 and/or in memory 720. The software modules can comprise one or more software programs or applications having computer program code or a set of instructions executed in processor 710. Such computer program code or instructions for carrying out operations for aspects of the systems and methods disclosed herein and can be written in any combination of one or more programming languages. The program code can execute entirely on process controller 705, as a stand-alone software package, partly on process controller, or entirely on another computing/device or partly on another remote computing/device. In the latter scenario, the remote computing device can be connected to process controller through any type of direct electronic connection or network, including a local area network (LAN) or a wide area network (WAN), or the connection can be made to an external computer (for example, through the Internet using an Internet Service Provider).

Preferably, included among the software modules 730 is a measuring module 770, a wafer profile module 772, an etch recipe module 774, an etching process module 776, a database module 778, a user interface module 780, an endpoint detection module 782, and an arm scan profile module 784 that are executed by processor 710. During execution of the software modules 730, the processor configures the process controller 705 to perform various operations relating to the system 100 for performing a wet etching process, as will be described in greater detail below.

It can also be said that the program code of software modules 730 and one or more computer readable storage devices (such as memory 720 and/or storage 790) form a computer program product that can be manufactured and/or distributed in accordance with the present invention, as is known to those of ordinary skill in the art.

It should be understood that in some illustrative embodiments, one or more of software modules 730 can be downloaded over a network to storage 790 from another device or system via communication interface 750 for use within the system 100. In addition, it should be noted that other information and/or data relevant to the operation of the present systems and methods (such as database 785) can also be stored on storage, as will be discussed in greater detail below.

Also, preferably stored on storage 790 is database 785. As will be described in greater detail below, database contains and/or maintains various data items and elements that are utilized throughout the various operations of the system 100. The information stored in database can include but is not limited to, parameter adjustment algorithms, recipes, chemical mixture details, set-points, settings, alarms, actual values for process variables, and historical data collected and analyzed by the process controller (e.g., endpoint detection data, batch records, substrate thickness measurement information, RDL material depth measurement information) as will be described in greater detail herein. It should be noted that although database is depicted as being configured locally to process controller 705, in certain implementations database and/or various of the data elements stored therein can be located remotely (such as on a remote computing device or server—not shown) and connected to process controller through a network or in a manner known to those of ordinary skill in the art.

The interface 715 is also operatively connected to the processor 710. The interface can be one or more input device(s) such as switch(es), button(s), key(s), a touchscreen, microphone, etc. as would be understood in the art of electronic computing devices. Interface serves to facilitate the capture of commands from the user such as on-off commands or settings related to operation of the system 100.

The display 740 is also operatively connected to processor 710. Display includes a screen or any other such presentation device which enables the user to view information relating to operation of the system 100 including control settings, command prompts and data collected by various components of the system 100 and provided to process controller. By way of example, display can be a digital display such as a dot matrix display or other 2-dimensional display.

By way of further example, interface and display can be integrated into a touch screen display. Accordingly, the screen is used to show a graphical user interface, which can display various data and provide "forms" that include fields that allow for the entry of information by the user. Touching the touch screen at locations corresponding to the display of a graphical user interface allows the person to interact with the device to enter data, change settings, control functions, etc. So, when the touch screen is touched, interface communicates this change to processor, and settings can be changed or user entered information can be captured and stored in the memory.

The audio output 760 is also operatively connected to the processor 710. Audio output can be any type of speaker system that is configured to play electronic audio files or generate audio tones as would be understood by those of ordinary skill in the art. Audio output can be integrated to the process controller 705 or external to the process controller 705.

Communication interface 750 is also operatively connected to the processor 710 and can be any interface that enables communication between the process controller 705 and external devices, machines and/or elements including [robot, imaging device, etch controller, clean controller, chemistry controller]. Preferably, communication interface includes, but is not limited to, Ethernet, IEEE 1394, parallel, PS/2, Serial, USB, VGA, DVI, SCSI, HDMI, a Network Interface Card (NIC), an integrated network interface, a radio frequency transmitter/receiver (e.g., Bluetooth, cellular, NFC), a satellite communication transmitter/receiver, an infrared port, and/or any other such interfaces for connecting process controller 705 to other computing devices and/or communication networks such as private networks and the Internet. Such connections can include a wired connection (e.g. using the RS232 standard) or a wireless connection (e.g. using the 802.11 standard) though it should be understood that communication interface can be practically any interface that enables communication to/from the process controller 705.

At various points during the operation of the system 100 for performing a wet etching process, process controller 705 can communicate with one or more computing devices, for instance, computing devices used to operate the various process stations and constituent devices. Such computing devices can transmit and/or receive data to/from process controller 705 and between one another, thereby preferably initiating maintaining, and/or enhancing the operation of the system 100.

It will be appreciated that in accordance with one or more embodiments of the present systems and methods, one or more radial locations of the wafer is etched according to the calculated etch recipe. Each radial location is in the form of a continuous ring that surrounds a center point of the wafer. It will also be understood that when the radial location is etched, an at least substantially uniform etch is performed along the entire ring shape of the radial location. In other words, the etch depth is the same along the entire ring (i.e., a uniform etch is performed at each of the radial locations and it will further be understood that the etch depth can be different from one radial location to another).

An etch recipe consists of a variety of single wafer wet etch processing parameters that control the radial location on the surface of the wafer where material will be removed and how much material will be removed at such locations. Referring back to FIG. 8, a variety of parameters can be defined and/or adjusted in the etch recipe to control the radial location on the surface of the substrate where etching is concentrated and the amount of material removed at that location, including but not limited to, the radial position of the etch tool 430 (also referred to as the arm) and nozzle 435 dispensing the chemical etchant onto the substrate, the path of the etch tool, which is referred to as the arm scan, the arm scan speed, acceleration, deceleration and nozzle height. It is understood that dispensing an etchant onto a substrate at a particular radial location generally localizes the etching process to that particular radius of the substrate and, as such, the position and movement of the arm and nozzle over the wafer (e.g., "arm scan profile") can control the location of etching.

In one or more embodiments, the process controller can generate a customized etch recipe for the wafer based on the particular etch profile. In order to generate a custom etch recipe, the processor executing one or more software modules 730, including preferably etch recipe module 774, can configure process controller 705 to define one or more of the aforementioned parameters that control etching location, etch rate, dwell time and the like to generate an etch recipe to selectively etch the overburden across the radial locations on the surface of the particular substrate in order to achieve the desired etch depth at each radial location and intermediate locations (see FIG. 10B). In particular, based on the etch profile, which identifies the radial locations and corresponding amount of material to be etched at those radial locations, the processor can generate an arm scanning profile that defines how the arm should move across each of the radial locations and thereby controls the amount of etchant dispensed at those radial locations (and intermediate locations).

As noted above, the parameters that can be adjusted to control the etch uniformity (i.e., the uniformity of the etch and thus the thickness of the resulting wafer) include but are not limited to, the arm movement, the spin speed of the wafer and the dwell time of the arm depositing chemical etchant on the radial locations of the wafer. For example, in a wafer that is, say, edge heavy, the etch profile can provide that the dwell time is increased near the edge of the wafer, and/or spin speed can be decreased to achieve a greater etch depth at the edge.

It should be understood that the parameters can be defined as a function of arm location or other variables and are therefore can be varied throughout the course of the etching process. For example, in a substrate with a radial thickness that is, say, heavy around a particular radial location, the etch recipe can provide that the dwell time is increased at that location by decreasing the speed at which the arm travels across that location to achieve a greater etch depth.

Additionally, the customized etch recipe can include an etch time. Etch duration is the amount of time that the etch process is being performed on the particular substrate and can be varied to control the amount of material that is removed during the etching process. The longer a given etch recipe is executed on a substrate the more substrate is removed and as such, the overall thickness is reduced.

Accordingly, the custom etch recipe can be generated by generating an arm scanning profile. In particular, the configured processor can, using the thickness measurements and corresponding radial locations, for example, set points along a path that the arm will be programmed to pass. In addition, based on the etch depth for each of the radial locations, the configured processor can also define the speed of the arm as it moves across each point and in between the points so as to precisely control the amount of material etched at each of the radial locations. It can also be appreciated that the etch recipe including the arm scan profile (arm scanning profile) can also define other parameters to adjust etch rate for each point/radial location such as spin speed, concentration, acceleration/deceleration and the like as discussed above.

It can also be appreciated that the configured processor can generate a customized etch recipe including an arm scan profile that is specifically tailored to the wafer, as measured, and in view of a target final wafer profile.

It can also be readily appreciated that one or more of the steps described in relation to the step of generating an etch recipe, modifying wafer profiles and arm scan profiles and the like are not limited to wet etching processes. In particular, generating an arm scan profile, as described above, can be implemented in practically any scenario where it is desirable to create a customized path for an arm to travel in a processing environment. For example, an arm scan profile can be generated substantially in the same manner as described above can be applied to wafer cleaning applications in which the arm scan profile controls the dispensing of cleaning solution onto a wafer.

Referring again to FIG. 10B, in one or more embodiments, the software modules 730 can also include an arm scan profile module 784 for generating custom arm scan profiles, as described above and as further described herein.

Custom arm scan profiles allow the user to graphically create and modify the path that a dispense arm will travel over a substrate, including at what velocity the arm will be moving at a given point in the profile. Profiles are dynamically created by the configured processor based on user-interaction with a line chart. The line can be shaped into the desired arm motion profile by click and dragging the points that define the line until the desired dispense path is created. Each point in the profile represents the arm's velocity at a given location along the path.

The custom arm scan profiles can be created/modified by the process controller 705 based on inputs from the user using the user interface and received by the processor 710, which is configured by executing one or more software modules 730, including, preferably the user interface module 780 and the wafer profile module 772 and the arm scan profile module 784.

More specifically, the configured processor can display a graphical user interface referred to herein as the arm scanning profile wizard through which the user can interact with the system. The "Arm Scanning Profile Wizard" is used to generate a new arm scanning profile that is based on a predefined template. After generation, the default profile can be altered to fit the dispense application's specific requirements. In addition, the user can also input wafer data/parameters. For instance, a "Wafer Information" page can be used to enter, among other things, the wafer's diameter. The diameter units can be selected as either "mm" or "in".

In regard to the arm scanning profile, the profile can be based on an arm scan template. The configured processor can prompt the user to select a template and the user can customize the profile after it has been generated from the chosen template. FIG. 11 depicts an exemplary GUI for the scan path template selection. For example, the template choices 1402 can include "Center Heavy", "Center Light", and "Linear" (e.g., uniform) that correspond to a characteristic variation in thickness across the surface of the wafer.

Additional details regarding the operations of the arm scanning profile wizard are disclosed in commonly owned U.S. Pat. No. 9,870,928, which is incorporated by reference in its entirety. In at least one embodiment, the arm scanning profile wizard can be integrated with a graphical user interface for the endpoint detection device.

Light Detector Position and Lighting Features within the Chamber

As discussed herein, the location of the light detector 520 and the lighting within the chamber (housing) are important considerations that must be taken into account for optimizing the endpoint detection method of the present invention and the results obtained thereby. In a classic (first) arrangement, the endpoint detection device 500 is centrally located above the wafer and the light emitter 510 and the light detector 520 are co-located and thus are part of the same device 500. This results in the light from the light emitter 510 being emitted directly downward to the underlying wafer and the reflected light from the wafer is detected by the light detector 520. Unfortunately, since the wafer's surface is much like a mirror when light is directed thereon, many undesired artifacts are produced in the image captured by the light detector 520. For example, the light detector 520 captures an image of itself since the reflection of the light detector 520 appears in the image. Other undesired reflections are in the form of the light and chamber dome and as described herein, the dispense arm reflects light as the dispense arm scans across the wafer. The present invention addresses and overcomes these deficiencies as described herein and in particular, as described with reference to FIGS. 16-19. In particular, the present invention provides a uniform lighting environment for the endpoint detection method.

In one exemplary embodiment, the endpoint detection device 500 with co-located light emitter 510 and light detector 520 can be in the form of a light emitter in the form of rows of LEDs arranged in one or more arcuate segments about a center of the endpoint detection device 500 at which the light detector 520 (e.g., CMOS or CCD camera) is located. For example, there can be two arcuate segments of LEDs that are arranged in rows within each arcuate segment and it has been discovered that this arrangement/structure reduces ambient light interference. There can also be a Halar diffusive lens. The LEDs and camera are thus concentric with the LEDs disposed in a surrounding fashion.

FIG. 16 shows an etch chamber 2000 that is similar to the other etch chambers described herein including the etch chamber 410 shown in FIG. 8, with the dome lid being partially shown. A wafer chuck 2010 is shown in FIG. 17. In this embodiment, the endpoint detection device 500 is not centrally located above a center of the wafer as in the classic arrangement discussed above. Instead, the endpoint detection device 500 is offset from the center of the etch chamber 2000 and thus, offset from the center of the wafer. Instead as shown in FIGS. 16 and 17, the endpoint detection device 500 is located along an angled side wall 2021 of the dome lid 2020 so that an axis passing through the endpoint detection device 500 is not perpendicular to the wafer surface (in the classic arrangement, the axis of the endpoint detection device 500 was perpendicular to the wafer surface). The dome lid 2020 also includes an operator window 2022 that allows the operator to view the wafer 1210 that is supported on the chuck 2010.

In other words and according to at least one implementation, a longitudinal axis passing centrally through the endpoint detection device 500 intersects the horizontal plane of the rotatable chuck at an angle other than 90 degrees as shown in the figures. The angle can be between about 30 degrees and about 60 degrees. For example, the angle can be between 45 and 60 degrees.

The endpoint detection device 500 of FIGS. 16 and 17 is also preferably constructed so that the light emitter 510 and the light detector 520 are co-located in that these two parts 510, 520 are both located within the device 500 as opposed to being formed as separate devices located at separate positions (locations) within the interior of the etch chamber 2000.

In accordance with this embodiment, the underside of at least a portion of the dome lid 2020 includes a light blocking panel 2030. Any number of different materials can be used for this purpose and the light blocking panel 2030 is located so as to minimize the light reflections within the interior of the chamber 2000 and thus, provide a more uniform lighting therein. The light blocking panel 2030 can be in the form of a white colored light blocking panel for internal background color as well as external light blocking. For example, a white PVC material can be used. The blocking panel can alternatively be formed of a natural colored plastic which can be a nude or beige color. The color of the underside of the dome lid should be one which achieves the objectives discussed herein which is that it should be light blocking and reduce or eliminate the reflections and artifacts that were recorded in the image.

FIG. 17 also shows the image/light path in the form of a series of lines A, B and C from the endpoint detection device 500 to the wafer 1210 and then lines extending back outwardly from the wafer 1210 which constitute light reflections off the wafer 1210. The reflected light can contact the underside of the dome lid 2020, side walls of the chamber 2000, other equipment located within the chamber 2000, etc. It will be appreciated that line A intersects one edge of the wafer; line B intersects the center of the wafer and line C intersects the other edge of the wafer. While line B does not show a reflected path, it will be appreciated that the light ray that does contact the center of the wafer does reflect off of the wafer towards the underside of the dome lid.

As shown, there are multiple light paths from the endpoint detection device 500 to the wafer 1210 in that the light emitter (lamp) 510 illuminates a sample area as described herein (e.g., the sample area can at least constitute from the peripheral edge of the wafer to the center). Applicant has found that the position of the endpoint detection device 500 in this location and the other features described herein, such as the light blocking panel 2030 provided a great improvement in lighting uniformity across the wafer 1210. In particular, reflections of the camera, light and chamber dome lid are eliminated.

FIGS. 18 and 19 show an etch chamber 2100 that is similar to the other etch chambers described herein including the etch chamber 2000 shown in FIGS. 16 and 17 and therefore, like elements are numbered alike. As in the chamber 2000 of FIGS. 16 and 17, the endpoint detection device 500 in system 2100 is not centrally located above a center of the wafer 1210 but instead, the endpoint detection device 500 is offset from the center of the etch chamber 2100 and thus, offset from the center of the wafer 1210. Instead as shown in FIG. 18, the endpoint detection device 500 is located along an angled side wall 2021 of the dome lid 2020 so that an axis passing through the endpoint detection device 500 is not perpendicular to the wafer surface (e.g., the angle between the axis and the horizontal plane of the wafer surface can be formed at an angle between 30 degrees and 60 degrees (e.g., 45 degrees to 60 degrees).

The main difference between system 2000 (FIG. 17) and system 2100 (FIGS. 18 and 19) is that the system 2100 includes a spin cover disk 2110 that is disposed directly above the wafer 1210. Operation of the spin cover disk 2110 is well known to those skilled in the art; however, for the purpose of the present invention, the spin cover disk 2110 becomes important since it acts as an element onto which reflected light from the wafer 1210 is cast.

Similar to FIG. 17, FIG. 19 also shows the image/light path in the form of a series of lines A, B from the endpoint detection device 500 to the wafer 1210 and then lines extending back outwardly from the wafer 1210 which constitute light reflections off the wafer 1210. The reflected light can contact the underside of the spin cover disk 2110 as well as, in certain cases, the side walls of the chamber 2000, other equipment located within the chamber 2000, etc. As shown, there are multiple light paths from the endpoint detection device 500 to the wafer 1210 in that the light emitter (lamp) 510 illuminates a sample area as described herein (e.g., the sample area can at least constitute from the peripheral edge of the wafer to the center). As with the system 2000, the position of the endpoint detection device 500 in this location and the other features described herein provide much improved lighting uniformity across the wafer and reflections of the light detector 520, light and spin cover disk 2110 have for the most part been eliminated.

By moving the endpoint detection device 500 to the offset location shown in FIGS. 16-18, cleaner signals are generated for processing by the endpoint detection device 500 and the other systems described herein to yield improved endpoint detection results.

For example, FIG. 20 shows an image of a sample (wafer sample) taken with one of the systems 2000, 2100 that exhibits the improved lighting uniformity as a result of the lighting and dome changes discussed herein. Compare FIG. 20 with FIG. 14B and one will appreciate the improved lighting in FIG. 20 as evidenced by the increased visibility of the wafer and elimination of reflections. FIG. 21 is a graph shows the RGB (red/green/blue) values (of the reflected light) from sample 1 (at the edge of the wafer) to sample 10 (at the center) of the wafer. The top line represents blue color, the middle line represents green color and the bottom line represents red color.

In accordance with one implementation of the present invention and as embodied in systems 2000, 2100, the chamber housing is constructed with a controlled background surface seen as a reflection in the wafer and can be in the form of a white lid underside (such as panel 2330) or in the case of the system 2100, the spin disk 2110 underside can be white colored (or a nude or beige color that does not reflect light). In addition, ad discussed herein, the light detector (e.g., camera) location is selected such that the reflected path is controlled to avoid obstacles and the arm's sweep. The light detector (CMOS or CCD camera) and light source can be co-located as shown in systems 2000, 2100. In the implementation of FIG. 17, the dome lid 2020 can be transparent with panel 2030 comprising a white colored light blocking panel for internal background color as well as external light blocking (e.g., can be a white plastic material).

The overall system setup including the light detector 520 position and co-located light source 510 is designed to control the light reflections off of the wafer so that the controlled light reflections reflect onto the lid 2020 which as described herein can be in the form of a two-piece lid for light blocking and generating a light colored background within the interior of the wet etching chamber 2000, 2100. As shown in FIGS. 17 and 19 (light reflections), the endpoint detection device 500 is specifically position so that all of the reflected light rays do not intersect the device 500. More particularly, the reflected light rays that reflect off the wafer in FIGS. 17 and 19 do not intersect the device 500 as shown but instead, the light rays reflect and intersect (contact) a controlled surface, which in this case is the underside of lid or the underside of the spin disk 2110.

Dispense Arm

Traditionally, the dispense arm located within the etch chamber 2000 has a white color and unfortunately, this white color results in the dispense arm reflecting light as the arm scans across the wafer 1210. In one or more implementations of the present invention, the dispense arm is formed so as to have a black color (e.g., black matte color) which results in a substantial reduction in reflected light as the black colored dispense arm scans across the wafer.

View Wafer Radius

In one or more implementations, the sample area of the wafer is slightly offset from the wafer center to avoid the path of the dispense arm and its reflection as shown in FIG. 22. This offers an improvement over previous runs in which the sample area of the wafer was closer to or aligned with the wafer center.

The features described herein with reference to FIGS. 16-19 result in a larger percentage of the wafer 1210 being usable due to the elimination of the reflective areas.

Endpoint Detection Method

As discussed above, the present application provides systems and methods for endpoint detection for the etch of a substrate, thereby allowing precise control over the etching process. In particular, the present systems and methods provide for endpoint detection for the etch of a substrate and minimization of incomplete etch and overetch (e.g., undercut during an under (solder) bump metal (UBM) etch) of a substrate. The use of single wafer wet etch tools provides better etch uniformity that previous etch tools, as the single wafer wet etch tools permit over etch (and undercut) to be further reduced. For example, for a 50% over etch on the 10 um bump with 1500 A field metal with a single wafer wet etch tool, the undercut would be reduced to 2250 A, resulting in approximately a 9% loss. However, better etch control and a more sharply defined end of process are required to further minimize undercut, particularly for substrates of a smaller size.

As such in one or more embodiments, the present systems and methods utilize an endpoint detection device comprising a color charge-coupled device (CCD) detector or CMOS sensor (camera) for capturing the light that reflects off multiple sample locations on a first substrate (reference substrate) during the etch. The endpoint detection allows for better etch control and thus minimizes undercut. The endpoint detection device and CMOS or CCD camera are operatively connected to a process controller 705 (see FIG. 10B), which is configured to determine the color of the reflected light at each sample of a sample location on the wafer during the etch, and then determine based on the reflected color, when the etch of the substrate has been completed. The system can then utilize the color data retrieved by the CMOS or CCD camera from the etch of the substrate to more effectively and efficiently etch subsequent substrates by modifying etch parameters and/or the etch recipe (including arm scan profile).

An exemplary system 1200 for endpoint detection and minimization of undercut is shown at FIG. 12. In one or more embodiments, the system 1200 of FIG. 12 is a part of the integrated wafer etching system 100, and in particular, can be integrated into the etch station exemplified in FIG. 8. The system 1200 includes the endpoint detection device, which features a light detector 520 (e.g., CMOS or CCD camera) and a light emitter or light source 510. As shown in FIG. 12, in this embodiment, the light source 510 is located separately from light detector 520. However, as exemplified in FIG. 8, in at least one embodiment, the light source 510 and the light detector 520 can be located on the same apparatus. The light source 510 and the light detector 520 are operatively connected to the process controller 705 (FIG. 10B). Accordingly, the processor 710 of the process controller 705, executing one or more software modules 730, including endpoint detection module 782 is configured to operate and position the light source 510 and light detector 520 during the etch process. In FIG. 12, the camera field of view is identified by the area outlined within lines CF. The arm sweep area of the dispense arm is outlined by area SA.

The light detector 520 (e.g., CMOS or CCD camera) is configured to supply a stream of images during the etching process at a predefined pace to processor 710, which executes endpoint detection module 182. In one or more embodiments, the endpoint detection module 182 uses a reference wafer to build color change curves (graphs) over the time of the etch based on the intensities of three wavelengths of visible light (red, blue, green) at a sample area (preferably across a plurality of sample locations at different radial locations) on the wafer (since the etched wafer has a different color profile compared to the virgin, pre-etched wafer. The color characteristics of the etched reference wafer are thus subsequently used as a reference to determine if the subsequently etched wafer has reached the end (endpoint) of the etch process. In other words, subsequent to the initial wafer being properly etched, the color of the etched wafer is analyzed at multiple sample locations to establish the reference color information that is then used to assess whether subsequent wafers have been etched to a proper endpoint by analyzing and comparing the color of the subsequent etched wafer to the color of the reference wafer. Likewise, curves are generated on subsequently etched wafers as they are etched and the curves are compared to the reference curves. The processor 710 executing the endpoint detection module 182 then determines when the wafer being processed has reach the desired point ("endpoint") on the reference file curve, as explained in further detail below.

The system 1200 further includes an arm sweep (arm scan) 1205, the substrate or wafer 1210 to be etched, and a sample location 1215 on the wafer. Arm scan speed and acceleration are used to control relative dwell time of the dispensed etchant in a radial manner. A longer dwell time equates to a faster etch rate at that point on the wafer for the process. The sample location is a user-defined area on the wafer, as shown in the images of the wafer provided by CMOS or CCD camera 520. The images or "frames" (i.e., each frame is one video image) of the wafer can be provided to the user via a graphical user interface (GUI) shown on the display 740 of the process controller 705 (FIG. 10B), as explained in further detail below. The sample location comprises multiple "samples" within the sample location. These multiple "samples" can be defined by squares on the images of the wafer. The use of multiple samples that are analyzed simultaneously is an advancement over prior systems.

Turning now to FIG. 13, a flow diagram illustrates a routine 1300 for detecting the endpoint for an etch of a wafer (e.g., wet etching of the wafer) in accordance with at least one embodiment disclosed herein. The routine 1300 is described below in reference to a UBM etch; however, it should be understood that the endpoint detection routine 1300 can be used for etches of other types of substrates (e.g., RDL substrates). It should also be appreciated that more or fewer operations can be performed than shown in the figures and described herein. These operations can also be performed in a different order than those described herein.

The process begins at step 1305, where processor 710 executing one or more of software modules 730, including, preferably endpoint detection module 782, configures process controller 705 to select samples for a reference wafer. As mentioned above, a sample location is a user-defined area on the wafer, as shown in the images of the wafer provided by CMOS or CCD camera 520, and the sample location comprises multiple samples ("1+n" samples) within the sample location. The samples in the sample location of the particular substrate can be multiple points on the surface of the wafer and can be defined by the process controller by default or by the user. As shown in FIGS. 14A-14B, these multiple samples can be defined by squares on the images of the wafer. More specifically, via the graphical user interface (GUI) shown on display 740, a user can select the sample location on the wafer to be analyzed as well as the number of samples within the sample locations. An exemplary GUI for monitoring endpoint detection associated with the endpoint detection software module 182 is shown at FIG. 14A. As shown in FIG. 14A, using the GUI, the user can select the sample location and the number of samples within the location (shown at 1405). The sample location and the selected samples are also shown in an image of the substrate (top right). An exemplary image of a substrate showing the sample location and 15 samples is shown at FIG. 14B.

In one or more embodiments, the total sample location is generally rectangular as exemplified in FIGS. 14A and 14B. To determine the individual samples, the total sample area can be subdivided evenly to create boxes that represent each sample. The total sample location can be subdivided horizontally (FIG. 14B), vertically (see FIG. 14I), or diagonally depending on the orientation of the total sample location on the image of the wafer.

At step 1310, the processor 710 executing one or more of software modules 730, including, preferably endpoint detection module 782, configures process controller 705 to cause light emitter 510 to emit light onto at least a portion of the surface of the reference substrate (including the entire sample location) and cause the light detector 520 to detect the color of the light being reflected by the portion of the particular substrate. Preferably, the light detector 520 is a CMOS or CCD detector (camera), although other alternative light detectors can be used. Step 1310 is performed as the reference substrate is etched. Light information is generated based on the light reflected by the substrate and detected (captured) by the detector 520. The detector 520 is configured to transmit the detected reflected light information to the process controller 705 via images as further described herein.

The light emitter 510 emits visible light (e.g., high intensity LED, colored high intensity light, or otherwise) onto the substrate, which enhances the light signature reflected by the substrate. The light signature includes the intensity of one or more particular wavelengths of light that are detected and monitored by the process controller. For example, in detecting the endpoint of the UBM etch in a wafer, the light signature can include three wavelengths of light (blue, red and green). To ensure the most accurate detection of the light signature by the detector 520, the emitted light is generally consistent, and the detector 520 is generally stationary. Additionally, other aspects of the system can sometimes cause disturbances in the images captured by the detector 520, such as shadows causes by the equipment (e.g., arm) and reflections from splashes caused by the etchant. Accordingly, other optional features can be used to limit the disturbances in the images, such as multiple light sources (e.g., to eliminate shadows), and one or more light diffusers (e.g., to eliminate bright spots). Further, in at least one embodiment, the emitter 510 and/or the detector 520 can include one or more light filters such as a red light filter (IR filter) to adjust the characteristics of the light emitted and/or detected. In one or more embodiments, the detected reflected light can be averaged to reduce variations due to noise and distortion from the fluid layer on the substrate. However, such filters are not required.

At step 1315, the processor 710 executing one or more of software modules 730, including, preferably endpoint detection module 782, configures process controller 705 to analyze the light information for the reference wafer. In one or more embodiments, a user can monitor the analysis of the light information via the GUI shown at display 740. As mentioned above, the samples in the sample location of the particular substrate can be multiple points on the surface of the wafer and can be defined by the process controller by default or by the user. The plurality of points (samples) can each correspond to one or more pixels of the CMOS or CCD detector 520. For determining the completion of the etch, each of the samples have their own endpoint. In other words, the process does not end until all 15 samples agree that the etch process is complete (i.e., the endpoint for each sample is reached), which helps to eliminate incomplete etches of the wafer. For example, referring again to FIGS. 14A and 14B, in this example the substrate sample location features 15 samples, and each of the 15 samples has its own endpoint for the etch (e.g., UBM etch). In this example, the samples are distributed linearly at 1 cm (10 mm) intervals from center of the wafer out to 150 mm. Thus, instead of a single sample determining the end of the process, each of the fifteen samples are evaluated simultaneously in real time to determine the endpoint of the etch.

While many of the figures illustrate samples in the form of points of different radii that are along the same line, it will be appreciated that the system of the present invention is configured such that the operator can pick points of different radii that are not inline (or contiguous) to avoid obstacles, shadows, reflections. For example, the user can select 1 square or arc segment from each of the 15 (or other number) concentric segmented rings. Alternatively, this could be drawn as a curved line on the GUI, then changed into segments by the software.

More specifically, as the etch (e.g., UBM etch) of the reference substrate is occurring, the detector camera 520 is collecting light data for each sample via images or frames captured by the detector 520. In each frame or image, the process controller 705 is configured to analyze the light data for each sample to determine color changes in the reflected light at each sample. The process controller is configured to recognize that a particular color change is indicative of the endpoint for the etch. In accordance with the present method, this particular color change must be recognized by the process controller for all samples to indicate that the etch of the substrate is complete. When the process controller 705 determines the endpoint for all samples (i.e., determines that the etch is complete), process controller 705 is configured to cause the etch controller to close the nozzle such that the etchant is no longer dispensed on the wafer.

The ability of the process controller 705 to accurately determine the endpoint for each sample is dependent upon the frame grab rate of the system. For instance, a 30 second process with a frame grab of once per second cannot be repeatable to better than 1 second (1/30) or to 3.33%. However, increasing the frame grab rate to 5 Hertz lowers this repeatability to 0.67%. Accordingly, if the communication rate is 1 Hertz we calculate repeatability on this step of 3.33% of process time.

By increasing the communication rate to 10 Hz we lower this to (0.1/30) or 0.33% repeatability. These changes decrease repeatability from 6.67% to 1% of process time for the example. Accordingly, the increased frame grab rate allows for the system to end the etching process as quickly as possible after the system has determined that the endpoint has been reached at all samples (i.e., that the etch is complete). Just as important, the increased frame grab rate allows the system to end the etching process at a more consistent etch time.

As exemplified in FIGS. 14A and 14B, the process controller 705 is configured to analyze each sample in the sample location simultaneously for the particular color change that is indicative of the endpoint for the etch. In this example, each of the 15 samples must indicate the specified color change before the etch is considered to be complete. The process controller 705 is configured to analyze the light data for each sample in each frame captured by the detector 520 to determine when the specific color change occurs at each sample. The analysis of step 1315 occurs for the entire duration of the etch process for the reference wafer. Once each of the samples indicates the specified color change (i.e., that the etch is complete), the processor to executing one or more of software modules 730, including, preferably etching process module 776, can be automatically configured to stop the etch process (i.e., stop the nozzle from dispensing the etchant).

In the analysis of step 1315, the process controller 705 is also configured to record the endpoints for each sample in a time-based fashion. In other words, the process controller 705 is configured to record the specific time (in seconds) after the start of the etching process at which the specified color change at each sample occurs (i.e., the endpoint for each sample). The endpoint for each sample of the substrate can then be displayed in graph form in the GUI, as exemplified in FIG. 14C. As shown in FIG. 14C, the endpoints for each of the 15 samples of the exemplary substrate are between approximately 25 seconds and approximately 40 seconds. The colors detected at each sample over the duration of the etch can also be recorded and displayed in the form of a graph in the GUI, as exemplified in FIG. 14D.

Additionally, in one or more embodiments, the light data (color change data) over the duration of the etch can be recorded in the form of graphs for each individual sample. Examples of color change data graphs for each sample for an exemplary substrate are shown in FIG. 14E. Similar to the singular line graph shown at FIG. 14C, the line graphs for each of the samples of the substrate in FIG. 14E indicate that the color change (i.e., the endpoint) for each sample occurred in the range of approximately 25 seconds to approximately 40 seconds.

The process controller 705 can also be configured to create other types of graphs based on the light data (color change data) from the images captured by the detector 520. For example, as exemplified in FIGS. 14F and 14G, the process controller 705, in the analysis step 1315, can be configured to create a line graph showing the colors (and the amount of each color) detected at all samples pre-etch (FIG. 14F) and post etch (FIG. 14G). Similarly, the processor 710 can be configured to create individual line graphs showing the colors (e.g., RGB) detected pre- and post-etch for each individual sample, as exemplified in FIG. 14H. Specifically, FIG. 14H shows the detected colors and their respective values pre- and post-etch at sample "2" of an exemplary substrate.

At step 1320, the processor 710 executing one or more of software modules 730, including, endpoint detection module 782, configures process controller 705 to generate etch parameters for a subsequent (new) wafer to be etched based on the analyzed light information for the reference wafer. Additionally, in at least one embodiment, any historical data saved in the database 785 for previously etched substrates can also be used by the process controller 705 to generate etch parameters. In one or more embodiments, the etch parameters includes parameters that are specific for each sample of the substrate. The etch parameters for each sample can include a minimum endpoint, a maximum endpoint, a predicted endpoint, and a reference endpoint.

In one or more embodiments, the minimum endpoint can be the shortest endpoint observed among the samples in the reference substrate. Similarly, in one or more embodiments, the maximum endpoint can be the longest endpoint observed amount the samples in the reference substrate. As shown in the example GUI screen of FIG. 14A, the minimum endpoint of the exemplary substrate is 15 seconds and the maximum endpoint for the substrate is 45 seconds. The predicted endpoint is the estimated endpoint for the new wafer to be etched based on the data available at the time. The predicted endpoint can be determined by the processor based on an algorithm associated with endpoint detection module 782. In determining the predicted endpoint, the algorithm can incorporate data related to the reference wafer, in-progress etch data of the new wafer being etched (e.g., physical properties of the new wafer), and any historical data related to previously etched wafers. Each sample for the new wafer has its own predicted endpoint. Finally, the reference endpoint for each sample is the actual endpoint of the reference wafer at the corresponding sample location.

In one or more embodiments as a part of step 1320 the process controller 705, based on the collected light data from the reference wafer, can also be configured to adjust the etch recipe, including the arm scan profile, for the new substrate to be etched. This adjustments are made so that the endpoint of the etch is achieved within the expected, target time period (determined from etching the reference wafer). As discussed herein, the reference wafer is used as a guide for other subsequent wafers that have the same wafer characteristics and are to be etched to the same depth and same etch pattern as the reference wafer.

At step 1325, the processor 710 executing one or more of software modules 730, including, endpoint detection module 782, configures process controller 705 to select samples for the new wafer. In one or more embodiments, the processor 710 can configure the process controller to automatically select the number and location of the samples in the wafer to be etched such that they correspond with the samples of the reference wafer. In at least one embodiment, step 1325 can be performed before or simultaneously with step 1320.

In one or more embodiments as part of step 1325, the process controller is configured to change the number and/or location of the samples based on user input in the GUI. For example, in at least one embodiment based on user input, the process controller can be configured to reduce the number of samples that are monitored for endpoint detection via the detector 520 by disabling certain samples. This feature can be employed in instances in which the samples to be disabled did not provided accurate data (e.g., due to obstruction or interference of the detector 520) for the corresponding reference wafer or other previously etched wafers. For instance, in a scenario in which 3 of 15 samples for a reference wafer did not indicate that the endpoint of the etch had been reached until several seconds after the etch was actually completed, those 3 samples can be disabled for the endpoint detection for the new wafer to be etched. As such, the process controller 705 analyzes light data for the 12 enabled samples. Accordingly, when the 12 enabled samples all indicate that the endpoint has been reached, that signifies that the etch is completed and the process controller 705 is then configured to halt the dispensing of the etchant. Thus, the disabling of these 3 samples in this scenario would provide a more accurate determination of when the endpoint of the etch was reached.

In one or more embodiments, the process controller 705 can be configured to alert the user via the GUI of an error in the endpoint detection via an alarm. In particular, in instances in which the predicted endpoints for the enabled samples are earlier than the minimum endpoint, the minimum endpoint is disregarded and the etch continues. However, in instances in which the predicted endpoints for the enabled samples are later than the maximum endpoint, the etch is stopped, the wafer is rinsed and dry, and the process controller can be configured to generate an alarm to alert the user that the predicted endpoints may be incorrect.

At step 1330, the processor 710 executing one or more of software modules 730, including, endpoint detection module 782, configures process controller 705 to cause the light source (emitter) 510 to emit light on the new wafer being etched and to cause the detector (camera) 520 to detect light that reflects off of the new wafer. Step 1330 is performed for the new wafer in the same way as step 1310 was performed for the reference wafer, as discussed above.

It should be noted that, in one or more embodiments, the process controller 705 can be configured to extend the process time (i.e., "over etch") for a selected amount of time (e.g., seconds) past the predicted endpoint for all samples based on user input into the GUI. The extension of process time is referred to as the "over process time." Setting an over process time can help to prevent an incomplete etch from occurring as the etch will continue for the selected amount of time past the predicted endpoint of the etch. In other words, this feature allows the system to over etch the wafer past the point at which the endpoint is detected for all samples in order to ensure that there is not an incomplete etch. It should be noted that, in one or more implementations, the extended process time allows for the majority of the wafer to be etched completely, but for portions of the wafer that have tight geometries (i.e., areas in which it is difficult for the etchant to access), additional process time may be needed to completely etch those tight geometric areas. For example, as shown in the screenshots of an exemplary GUI in FIGS. 14I and 14J, the over process time is set for 15 seconds.

At step 1335, the processor 710 executing one or more of software modules 730, including, endpoint detection module 782, configures process controller 705 to analyze the light information captured by the detector 520 for the new wafer being etched. Step 1335 is performed in substantially the same fashion for the new wafer being etch as step 1315 was performed for the reference wafer. In particular, as the etch of the reference substrate is occurring, the detector camera 520 is collecting light data for each sample via images or frames captured by the detector 520. In each frame or image, the process controller is configured to capture light data from the detector 520 and analyze the light data for each enabled sample simultaneously to determine color changes in the reflected light at each sample. The process controller is further configured to recognize that a particular color change is indicative of the endpoint for the etch. As with the reference wafer, the particular color change must be recognized by the process controller for all enabled samples to indicate that the etch of the new wafer is complete.

During step 1335, the user can monitor the analysis of the light information via the GUI on the display 740 of the process controller 705. Referring again to FIG. 14A, the user can monitor the endpoint for each sample on the wafer being etched. For example, the process controller 705 is configured to analyze the light data and generate a graph showing the color change of the reflected light at a particular sample over the course of the etch. As shown in FIG. 14A, the graph can also show the predicted endpoint, the reference endpoint, the minimum endpoint, and the maximum endpoint. Accordingly, the user can visually compare the actual endpoint for the particular sample, with the predicted, reference, minimum, and maximum endpoints for that particular sample. The degree of similarity of the trial data relative to the reference data is expressed numerically as a "match convergence." A match convergence of zero is a perfect match between the trial data and the reference data; however, if the trial data becomes more dissimilar from the reference data, the match convergence number rises. The match convergence can be used to indicate to the user that the current wafer is not similar to the reference wafer.

At step 1340, following the etch of the new wafer, the processor 710 executing one or more of software modules 730, including, endpoint detection module 782, configures process controller 705 to compare the light data (e.g., endpoint for each sample) for the etched new wafer with the light data of the reference wafer.

Based on the comparison in step 1340, at step 1345 the processor 710 executing one or more of software modules 730, including, endpoint detection module 782, configures process controller 705 to modify etch parameters for subsequent wafers to be etched. For example, based on the comparison of light data from the newly etched wafer and the reference wafer, the process controller 705 can be configured to modify parameters for future etches, such as arm scan profile (e.g., speed, acceleration, rpm). In at least one embodiment, other factors are also considered in modify the etch parameters including the physical properties of a subsequent wafer to be etched (e.g., size, shape of the subsequent wafer).

In at least one embodiment at step 1340, the process controller 705 can be configured to create an etch database of known etch processes and the corresponding etch depth at each point on the radius. This database can be generated through the use of the endpoint system and/or via external measurement. Using an etch recipe and the etch parameters as discussed above, this feature can track the time required to reach endpoint at each of the samples for a particular wafer. From the known etch rate at each point and known completion time (endpoint) for each sample, the process controller 705 can be configured to back calculate the film thickness at each point on the wafer. The film thickness can then be used to create the best etch recipe to match the depth profile of the wafer. This recipe can then be used for the next wafer. In an alternate embodiment, the desired etch depth is use as a set point for each sample location. The process controller is then configured to use the created etch database to create a recipe for etching the target profile.

As shown in the graph of FIG. 15B, the present systems and methods ("WaferChek™"), and in particular the endpoint detection method discussed above, helps to minimize the undercut (overetching) in an etched UBM wafer, while also preventing incomplete etch of the wafer. Further, FIG. 15C shows a table of exemplary wafers of varying thicknesses, in which the amount of undercut after etching can be maintained for smaller geometry features by limiting film thickness and eliminating over-etch.

Accordingly, as discussed above, the present systems and methods help to eliminate incomplete etches of a substrate, as well as limiting or eliminating overetching of the wafer. The present system accomplishes these aims, among others, by: a) using multiple samples in the endpoint detection method to ensure that the etch is not incomplete; b) increasing the frame capture speed of the light detector (CMOS or CCD camera) to more accurately determine the endpoint of an etch of a particular substrate; and c) altering, by the system, the etch parameters and/or recipe for subsequent etches of substrates based in part on the light data captured during previous substrate etches. The present systems and methods thus allow a user to: 1) enter a target etch depth profile, which the system will match with a target etch; 2) calculate a film depth based on endpoint detection at each sample; 3) generate etch rate curves through etching blanket film wafers; 4) create recipes to etch desired depth profiles; and 5) tighten up repeatability times based on sampling rate increase and communications speed increase.

Although much of the foregoing description has been directed to systems and methods for endpoint detection and minimization of undercut, the system and methods disclosed herein can be similarly deployed and/or implemented in scenarios, situations, and settings far beyond the referenced scenarios. It should be further understood that any such implementation and/or deployment is within the scope of the system and methods described herein.

It is to be further understood that like numerals in the drawings represent like elements through the several figures, and that not all components and/or steps described and illustrated with reference to the figures are required for all embodiments or arrangements. Further, the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "including," "comprising," or "having," "containing," "involving," and variations thereof herein, when used in this specification, specify the presence of stated features, integers, steps, operations, elements, and/or components, but do not preclude the presence or addition of one or more other features, integers, steps, operations, elements, components, and/or groups thereof.

It should be noted that use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The subject matter described above is provided by way of illustration only and should not be construed as limiting. Various modifications and changes can be made to the subject matter described herein without following the example embodiments and applications illustrated and described, and without departing from the true spirit and scope of the present invention, which is set forth in the following claims.

What is claimed:

1. A system for endpoint detection of a wet etching process of substrates comprising:
    a wet etching chamber having a rotatable chuck for receiving and supporting a wafer, the wet etching chamber including an endpoint detection device that is configured to detect an end point of the wet etching process, the endpoint detection device including a high intensity light emitter and an adjacent light detector that face the rotatable chuck so that light emitted from the light emitter can illuminate the wafer, wherein a longitudinal axis passing through the endpoint detection device intersects a top plane of the rotatable chuck at an angle other than 90 degrees for reflecting light off of the wafer to a region of the wet etching chamber that is devoid of the endpoint detection device.

2. The system of claim 1, wherein the wet etching chamber further includes a dome lid, the endpoint detection device being mounted to a side wall of the dome lid.

3. The system of claim 2, wherein at least a portion of an underside of the dome lid includes a light blocking panel that is positioned so as to minimize light reflections within an interior of the chamber and provide a more uniform lighting therein.

4. The system of claim 3, wherein the light blocking panel is disposed above the wafer chuck and is white colored.

5. The system of claim 2, wherein the light detection device is positioned so that light reflections off of the wafer are reflected onto the underside of the dome lid.

6. The system of claim 1, wherein the high intensity light emitter and the light detector are contained within a single housing.

7. The system of claim 1, wherein at least a substantial portion of the endpoint detection device is located laterally outside of the wafer chuck.

8. The system of claim 1, wherein the light emitter comprises a high intensity LED and the light detector comprises one of a CMOS detector and a CCD detector for detecting light reflection off of the wafer.

9. The system of claim 1, wherein the angle is between about 30 degrees and 60 degrees.

10. The system of claim 1, further including a dispense arm for dispensing an etchant, the dispense arm having a black color for reducing an amount of reflected light as the black colored dispense arm scans across the wafer.

11. A system for endpoint detection of a wet etching process of substrates comprising:
    a wet etching chamber having a rotatable chuck for receiving and supporting a wafer, the wet etching chamber including an endpoint detection device that is configured to detect an end point of the wet etching process, the endpoint detection device including a high intensity light emitter and a light detector that face the rotatable chuck so that light emitted from the light emitter can illuminate the wafer, wherein a longitudinal axis passing through the endpoint detection device intersects a top plane of the rotatable chuck at an angle other than 90 degrees;
    wherein the endpoint detection device is positioned relative to the rotatable chuck such that light that is emitted from the high intensity light emitter and reflects off the wafer does not intersect the endpoint detection device.

12. The system of claim 11, wherein the endpoint detection device is positioned such that the light reflected off the wafer is directed onto a surface of the chamber.

13. The system of claim 12, wherein the surface comprises one of an underside of a dome lid and an underside of a spin cover disk.

14. A computer implemented control system for endpoint detection of a wet etching process of substrates by a wet etching station including a wet etching device, a light source and a light detector, the control system including one or more processors communicatively coupled to the wet etching device, the light source and the light detector and configured to interact with a computer-readable storage medium and execute one or more software modules stored on the storage medium, comprising:
    an endpoint detection module configured to:
        select a plurality of sample locations on a surface of a first substrate;

cause the light source to emit a light onto at least the plurality of sample locations on the surface of the first substrate during etching of the first substrate;

cause the light detector to detect light information associated with the plurality of sample locations on the surface of the first substrate during etching of the first substrate, wherein the light detector is positioned relative to the rotatable chuck such that light reflecting off of the substrate does not intersect the light detector;

analyze the light information associated with the plurality of sample locations of the first substrate to determine an end point of the etching of the first substrate;

generate etch parameters for a second substrate based on the analyzed light information for the first substrate;

select a plurality of sample locations on a surface of the second substrate;

cause the light source to emit a light onto at least the plurality of sample locations on the surface of the second substrate during etching of the second substrate;

cause the light detector to detect light information associated with the plurality of sample locations on the surface of the second substrate during etching of the second substrate;

analyze the light information associated with the plurality of sample locations of the second substrate and the generated etch parameters for the second substrate to determine an end point of the etching of the second substrate;

compare the light information associated with the second substrate with the light information associated with the first substrate; and modify the generated etch parameters based on the compared light information.

15. The system of claim 14, wherein the plurality of sample locations on the surface of the first substrate are in the form of locations at different radii that are along a same line.

16. The system of claim 15, wherein the plurality of sample locations are off-centered in that the line does not pass through a center of the first substrate.

17. The system of claim 15, wherein the wet etching device includes a rotatable chuck for receiving the first substrate, wherein a longitudinal axis passing through the endpoint detection device intersects the rotatable chuck at an angle other than 90 degrees.

18. The system of claim 15, wherein the step of analyzing light information associated with the plurality of sample locations of the first substrate comprises determining color changes at each sample location and the endpoint detection module is configured to recognize that a particular color change for a given sample location is indicative of the endpoint for the etch at the given sample location.

19. The system of claim 15, wherein the endpoint detection module is configured to stop the etch when a predetermined target color change is recognized for all sample locations, thereby indicating that the etch of the first substrate is complete.

20. The system of claim 15, wherein the first substrate comprises a reference wafer and the analyzed light information comprises color change reference curves (graphs) over a time of the etch based on intensities of three wavelengths of visible light at each sample location on the first substrate.

21. The system of claim 20, wherein the three wavelengths of visible light comprise red light, blue light and green light.

22. The system of claim 21, wherein the analyzed light information of the second substrate comprises color change curves (graphs) over a time of the etch based on intensities of three wavelengths of visible light at each sample location on the second substrate, and the step of comparing the light information associated second substrate with the light information associated with the first substrate comprises comparing the color change curves of the second substrate to the color change reference curves of the first substrate.

23. The system of claim 14, wherein the light information associated with the plurality of sample locations of the first substrate is analyzed simultaneously to determine the endpoint of the etch by determining whether each of the plurality of sample locations has achieved an endpoint of the etch for said sample location.

24. The system of claim 14, wherein the light source and the light detector are adjacent to one another.

25. The system of claim 14, further including a dome lid covering a chamber of the wet etching device, an underside of the dome lid including a light blocking panel that is positioned so as to minimize light reflections within an interior of the chamber and provide a more uniform lighting therein.

* * * * *